(12) United States Patent
Taniguchi et al.

(10) Patent No.: US 7,595,231 B2
(45) Date of Patent: Sep. 29, 2009

(54) SEMICONDUCTOR DEVICE AND ITS MANUFACTURE

(75) Inventors: Toshio Taniguchi, Kawasaki (JP); Taiji Ema, Kawasaki (JP); Toru Anezaki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 158 days.

(21) Appl. No.: 11/598,808

(22) Filed: Nov. 14, 2006

(65) Prior Publication Data

US 2007/0057328 A1 Mar. 15, 2007

Related U.S. Application Data

(62) Division of application No. 10/707,525, filed on Dec. 19, 2003, now Pat. No. 7,157,731, which is a division of application No. 09/571,555, filed on May 16, 2000, now Pat. No. 6,690,050.

(30) Foreign Application Priority Data

May 18, 1999 (JP) .................................. 11-136658
Apr. 11, 2000 (JP) ............................... 2000-109796

(51) Int. Cl.
  *H01L 21/8238* (2006.01)
  *H01L 21/336* (2006.01)
(52) U.S. Cl. ........................ 438/197; 438/199; 438/202; 438/257

(58) Field of Classification Search ................. 438/197, 438/202, 203, 204, 238, 239, 386, 399, 649, 438/651, 652, 655, 664, 592, 396, 259, 589, 438/270, 275
See application file for complete search history.

(56) References Cited

U.S. PATENT DOCUMENTS

| | | | |
|---|---|---|---|
| 5,731,219 A * | 3/1998 | Ikeda et al. | 438/209 |
| 6,037,606 A | 3/2000 | Ema | 257/37 |
| 6,069,038 A * | 5/2000 | Hashimoto et al. | 438/241 |
| 6,091,113 A | 7/2000 | Tanaka | 257/355 |
| 6,150,689 A | 11/2000 | Narui et al. | 257/306 |
| 6,160,288 A | 12/2000 | Yamada | 257/330 |
| 6,174,773 B1 | 1/2001 | Fujishima | 438/270 |
| 6,225,658 B1 | 5/2001 | Watanabe | 257/296 |
| 6,326,254 B1 | 12/2001 | Ema et al. | 438/217 |
| 6,429,066 B1 * | 8/2002 | Brown et al. | 438/239 |
| 2005/0227440 A1 | 10/2005 | Ema et al. | 438/275 |
| 2005/0230781 A1 | 10/2005 | Ema et al. | 257/510 |
| 2006/0094229 A1 | 5/2006 | Ema et al. | 438/624 |

FOREIGN PATENT DOCUMENTS

| | | |
|---|---|---|
| JP | 10-144886 | 5/1998 |
| JP | 11-026711 | 1/1999 |

* cited by examiner

*Primary Examiner*—Chuong A. Luu
(74) *Attorney, Agent, or Firm*—Kratz, Quintos & Hanson, LLP.

(57) ABSTRACT

In a logic area, impurities are doped into the gate electrode and the source/drain diffusion regions of a MIS transistor. Thereafter in a memory cell area, word lines are patterned, source/drain regions are formed, and contact holes are formed. Side wall spacers of the MIS transistor in the logic area are made of silicon oxide. A semiconductor device of logic-memory can be manufactured by a reduced number of manufacture processes while the transistor characteristics are stabilized and the fine patterns in the memory cell are ensured.

24 Claims, 53 Drawing Sheets

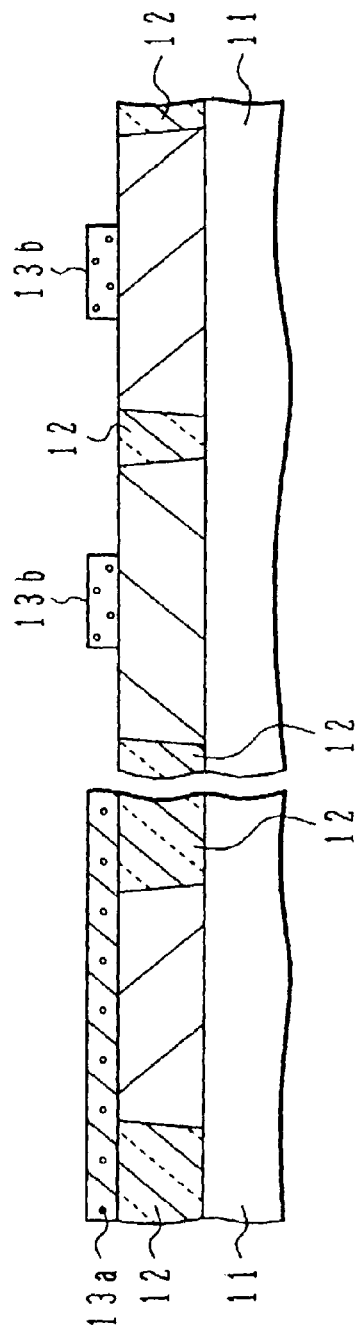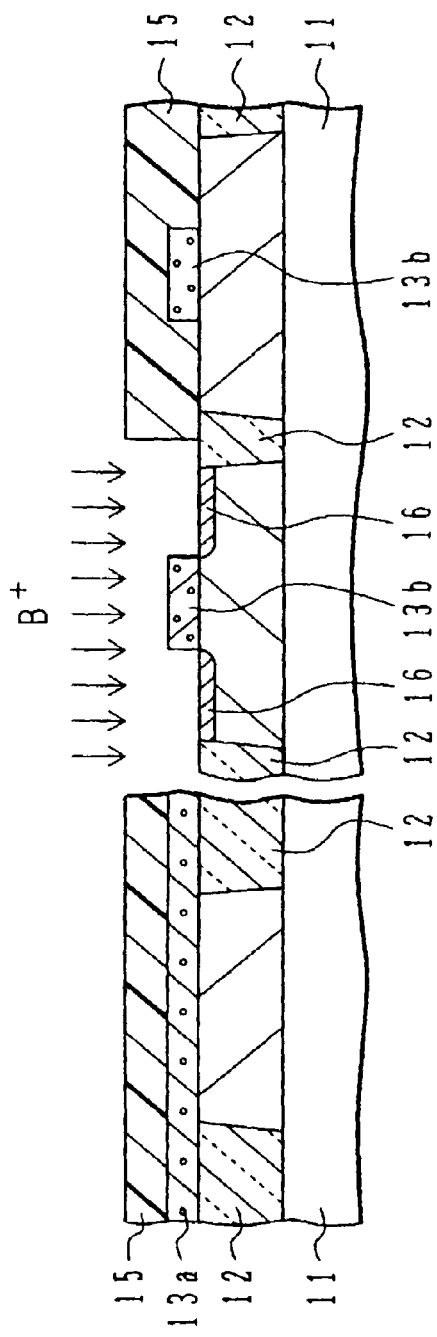

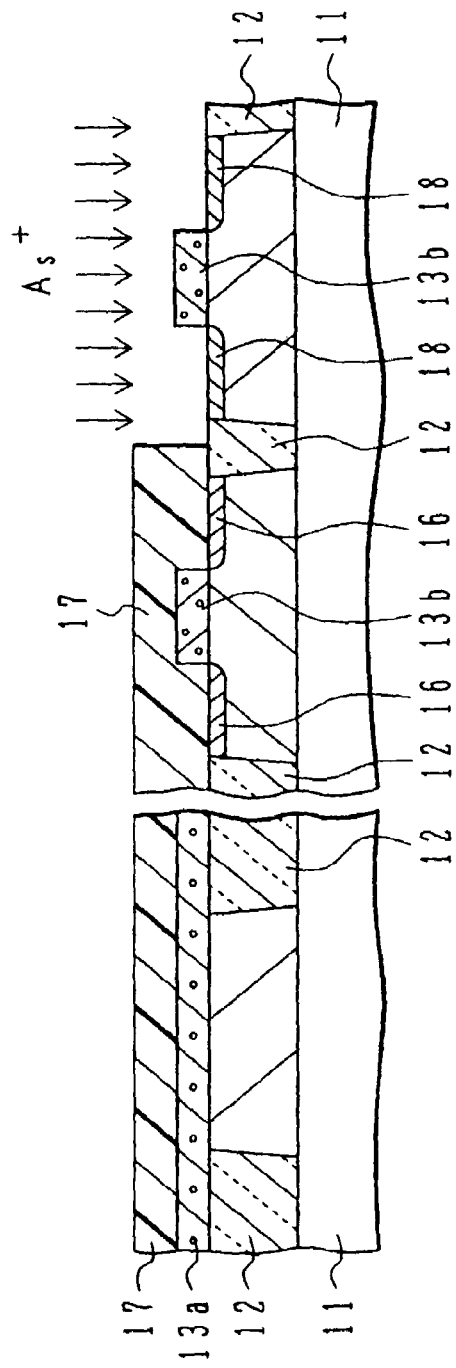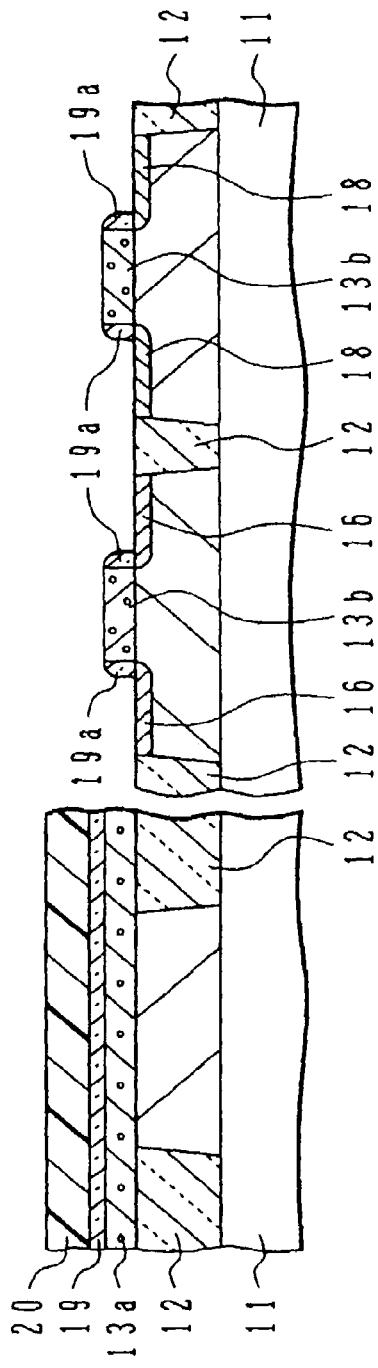

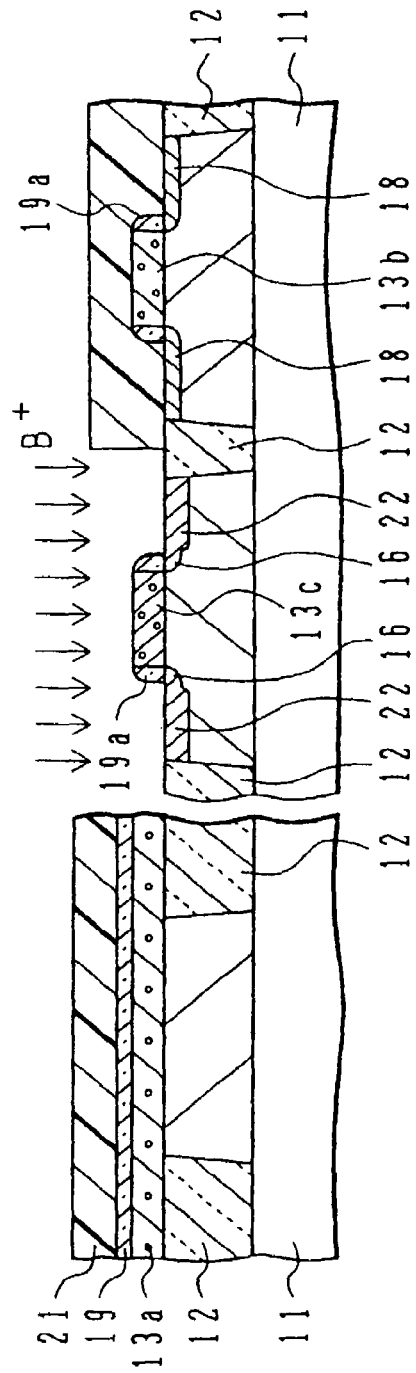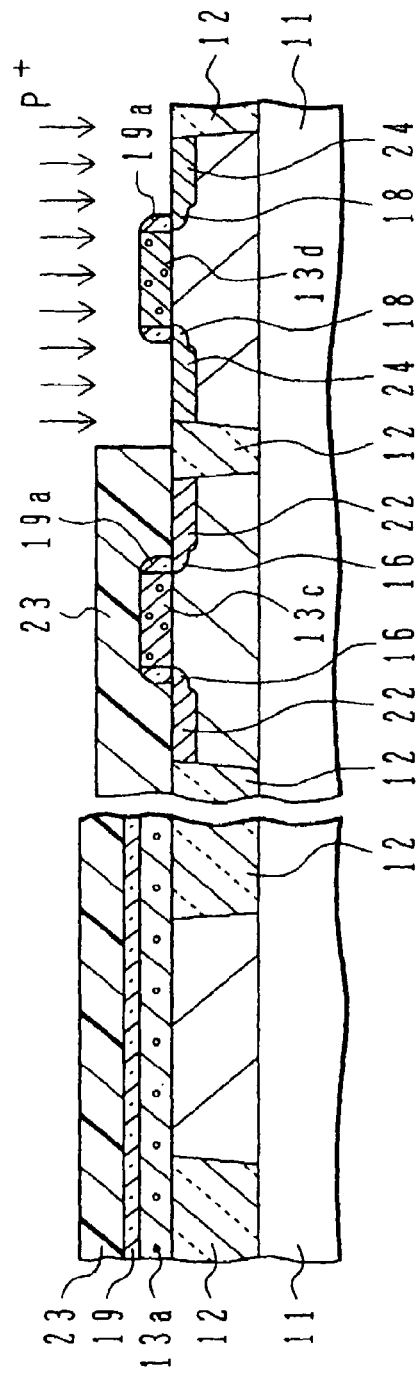

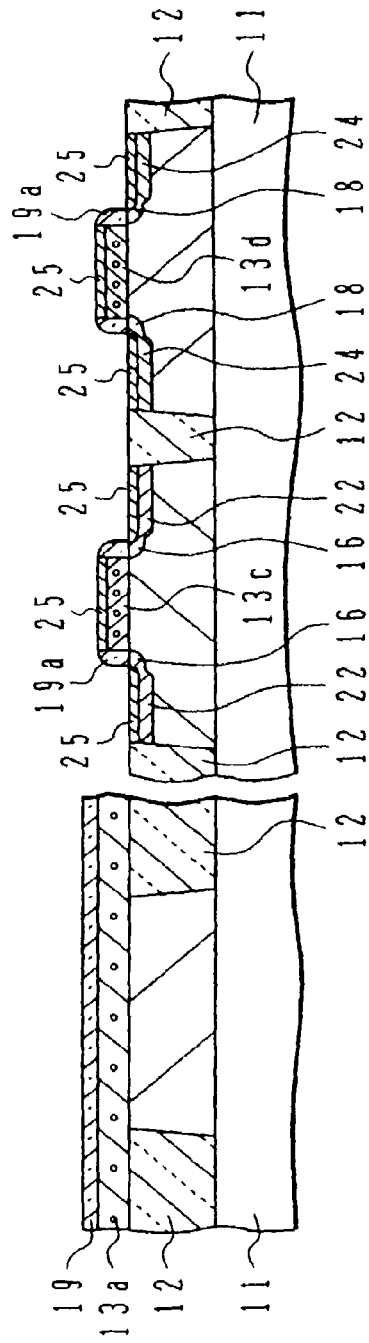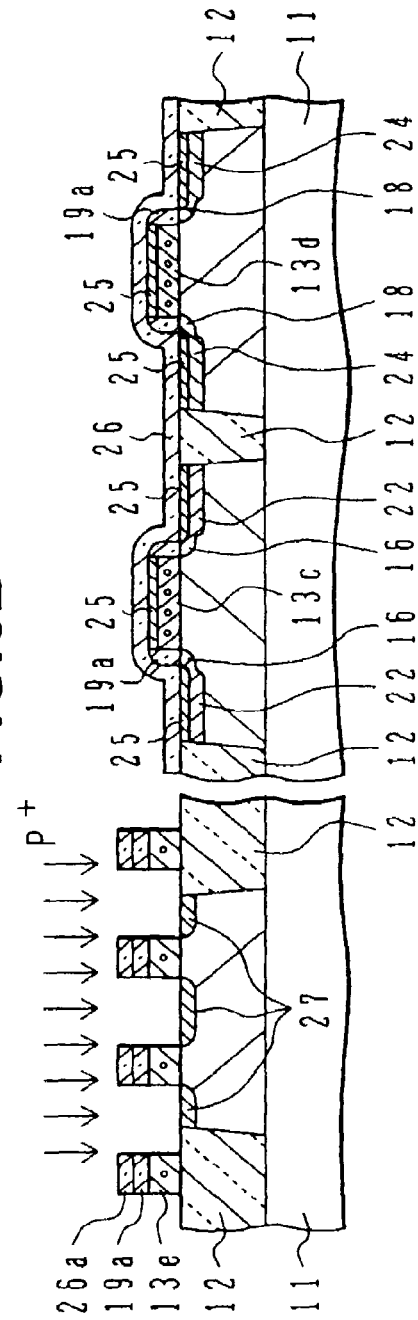

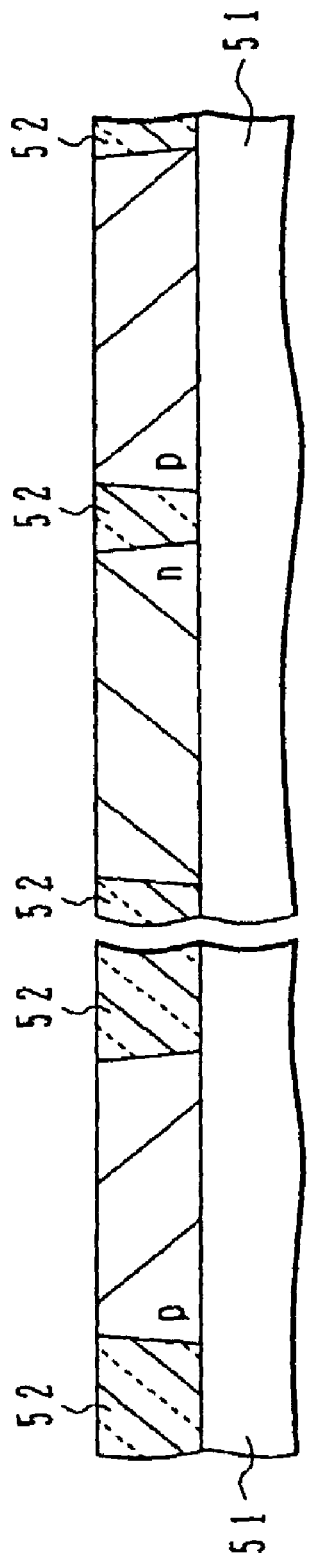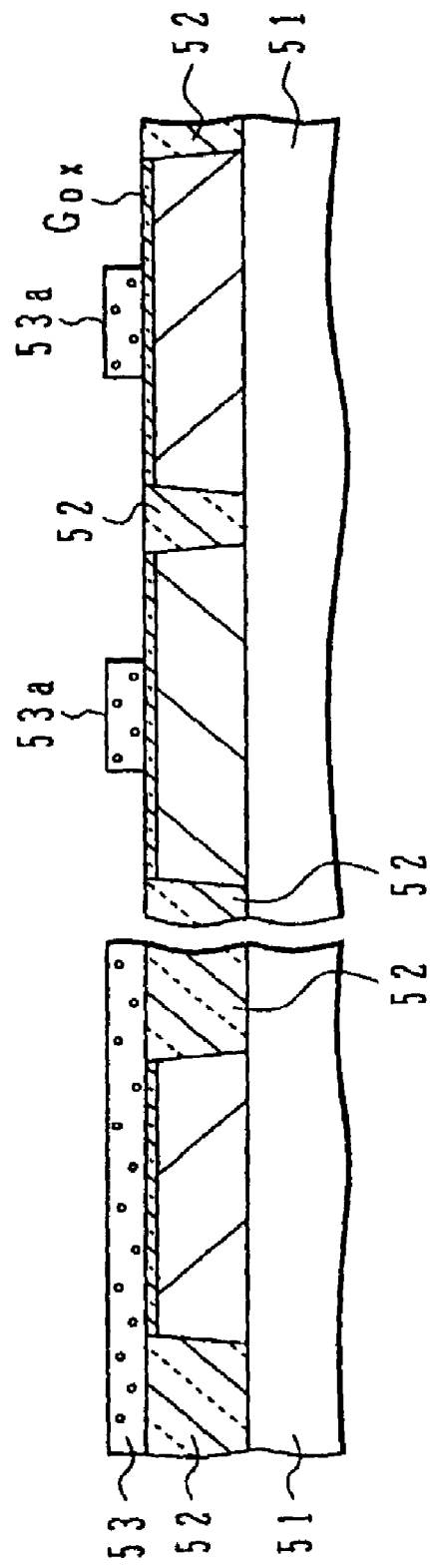

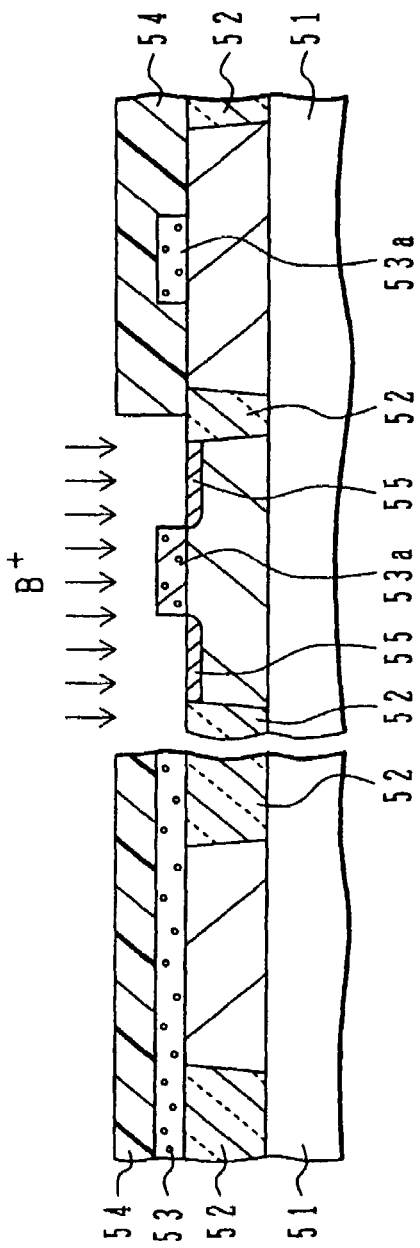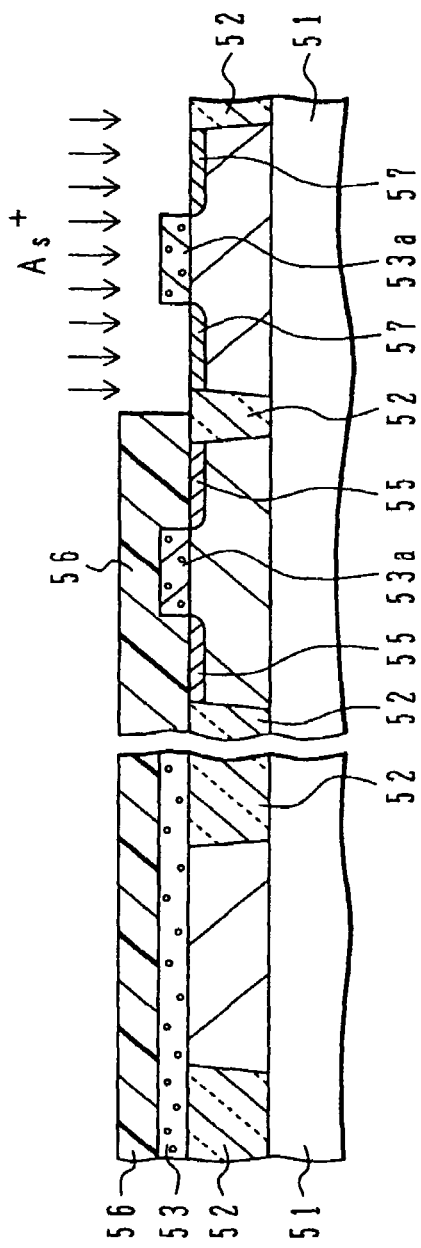

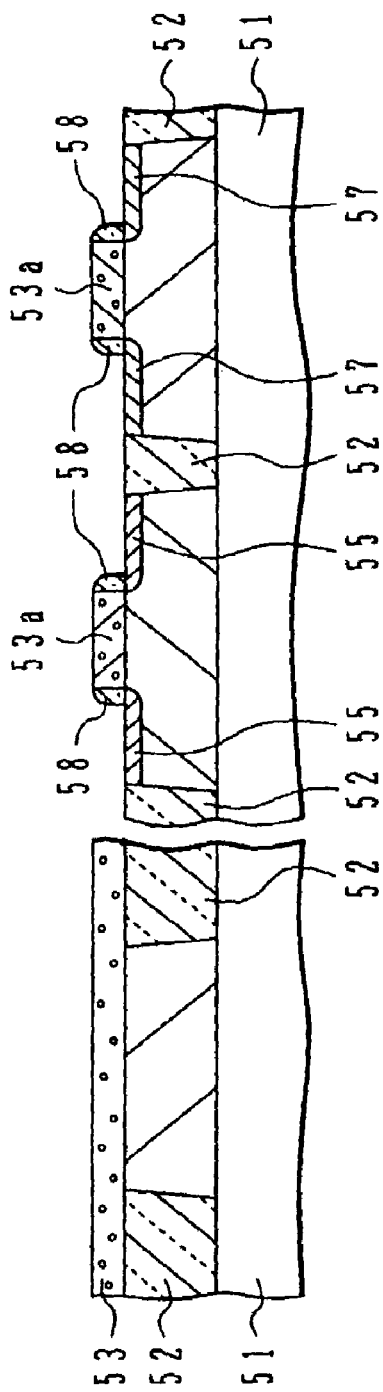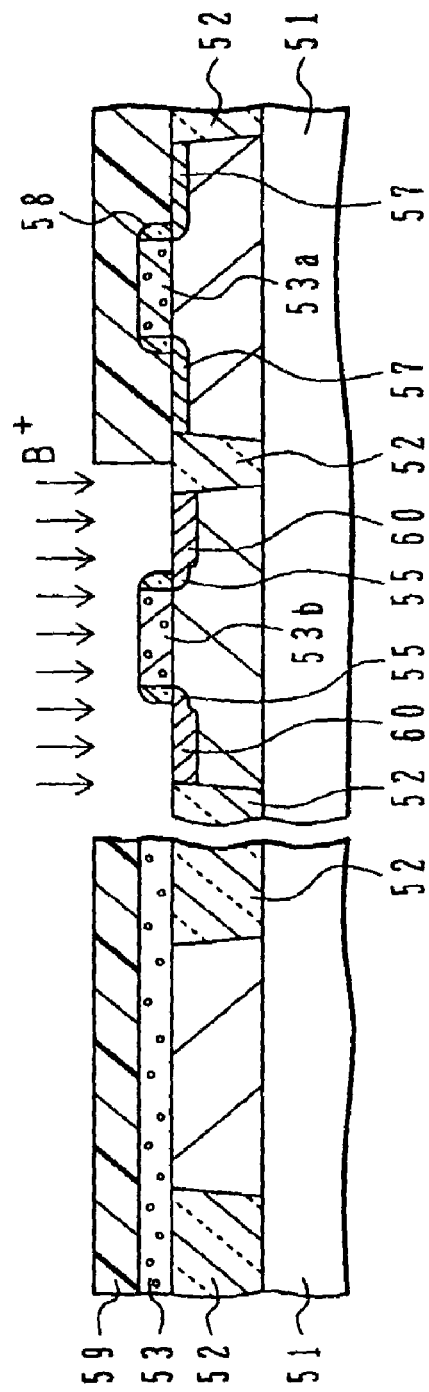

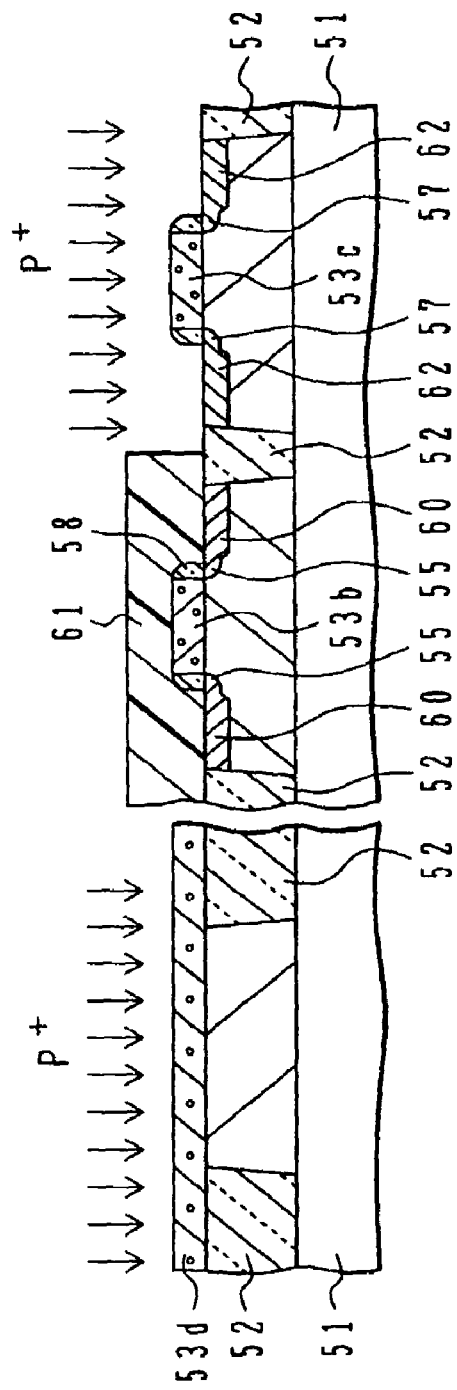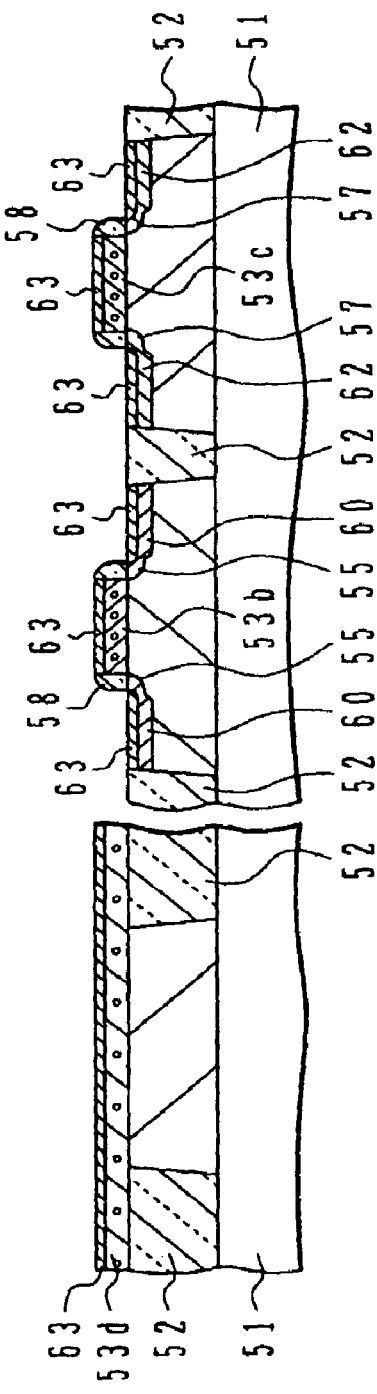

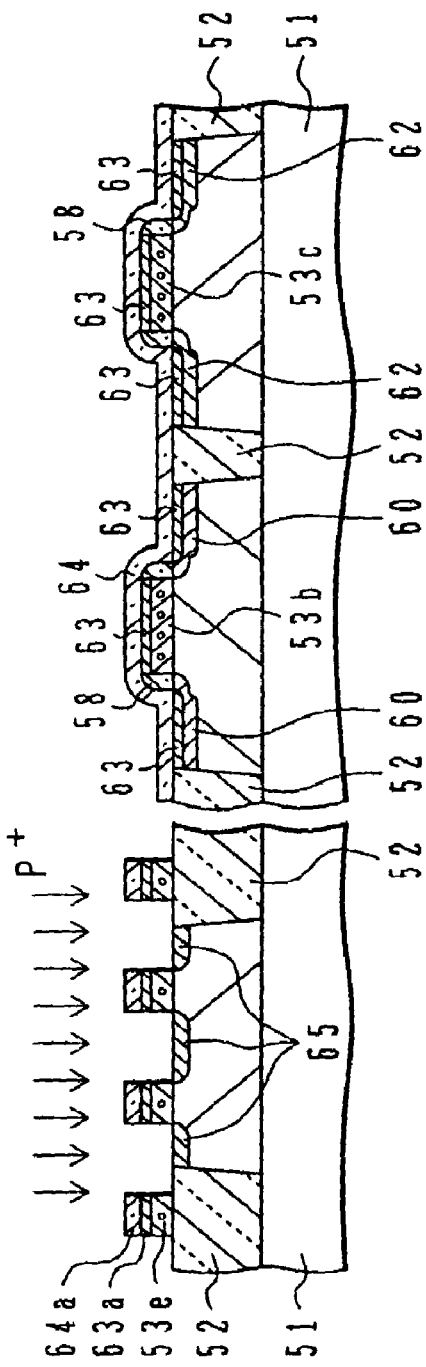
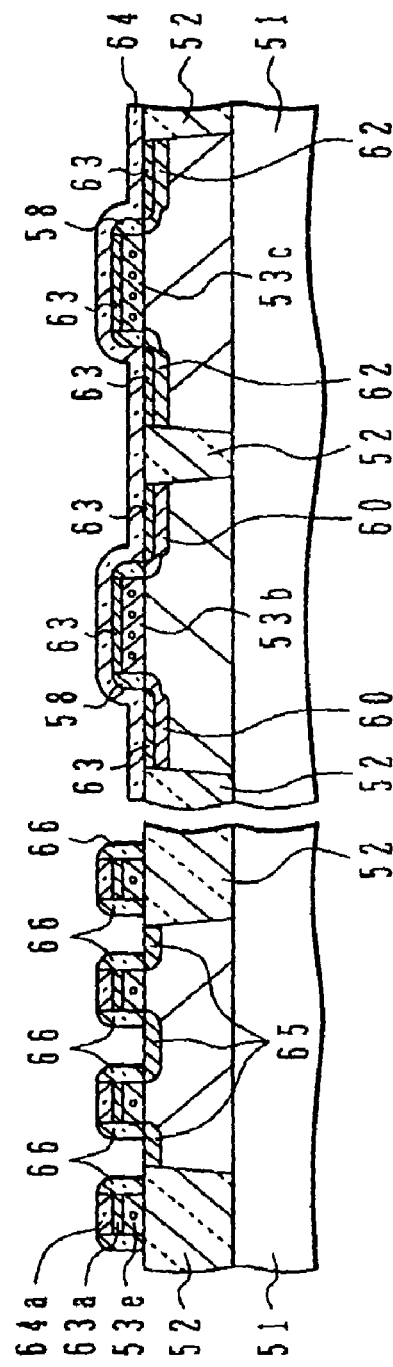

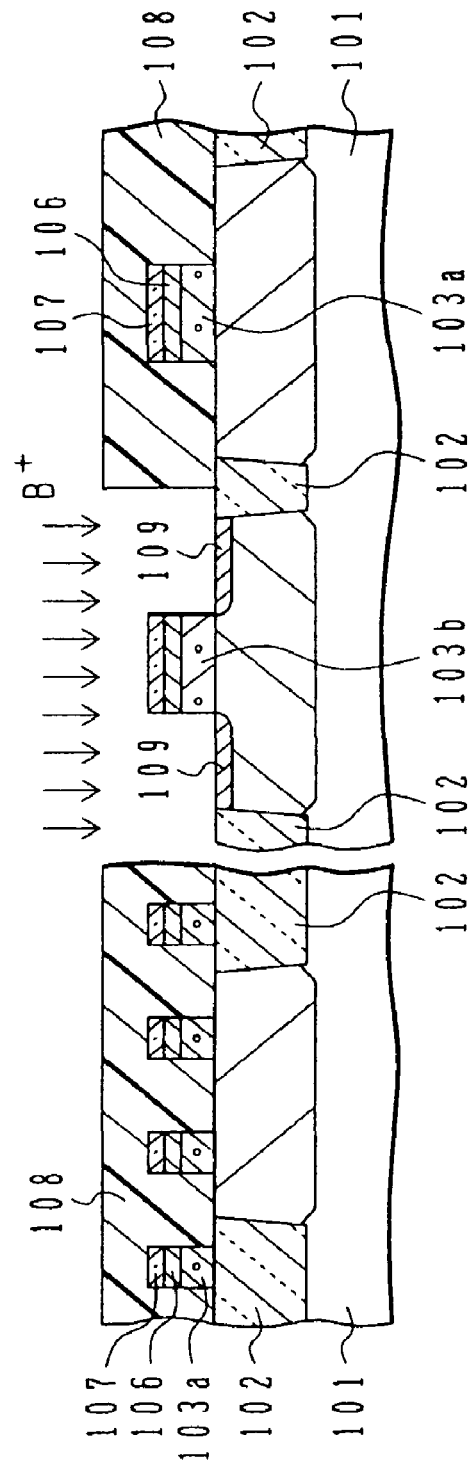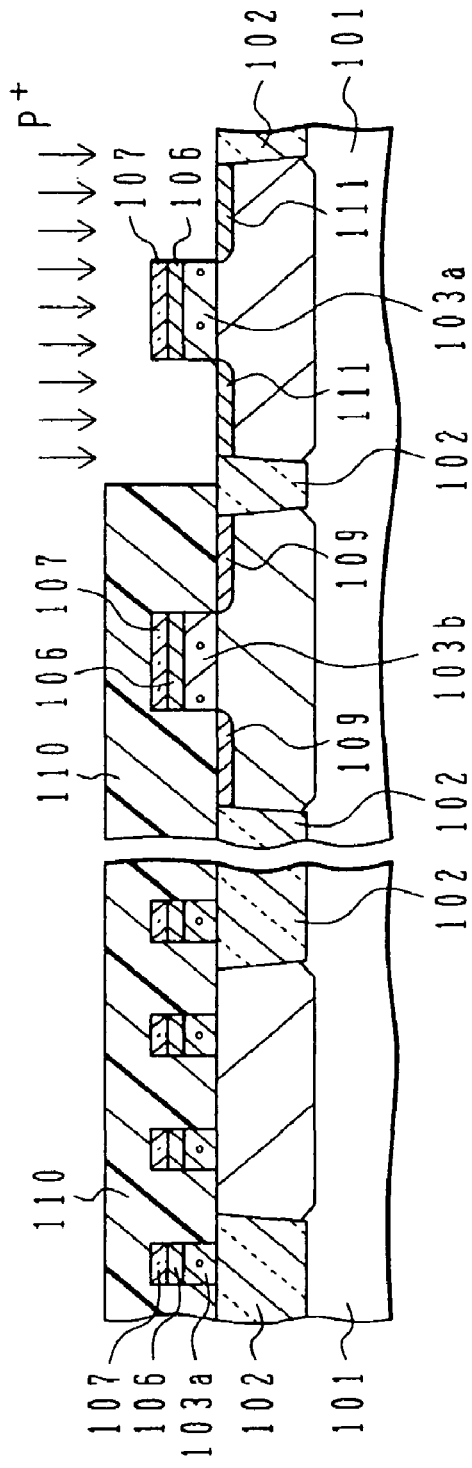

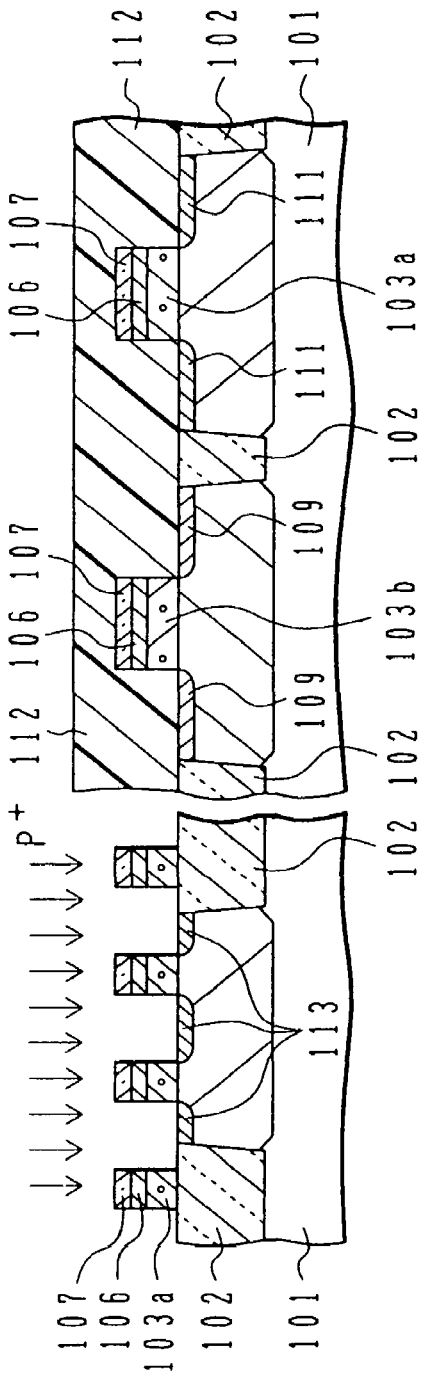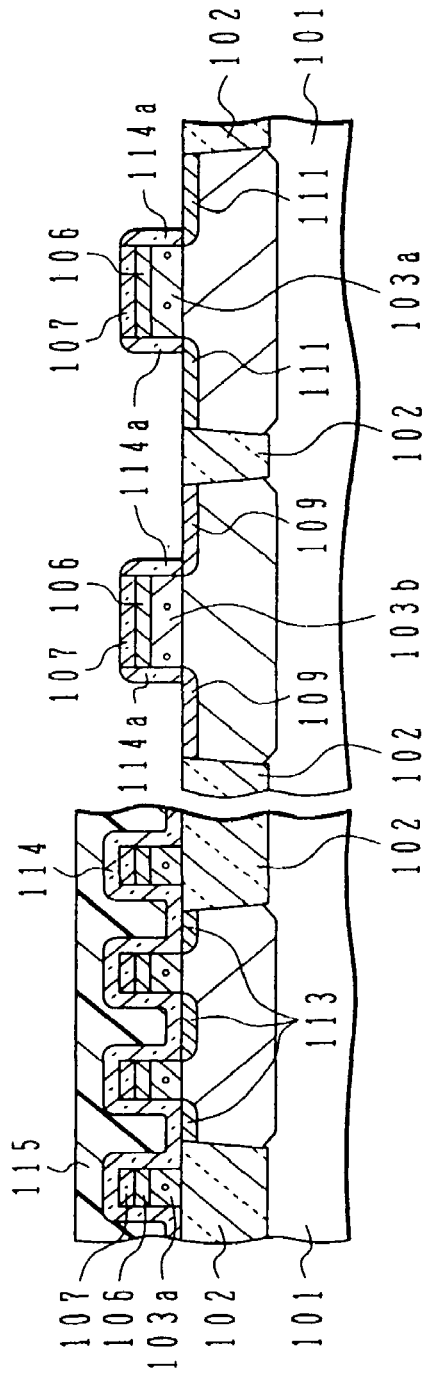

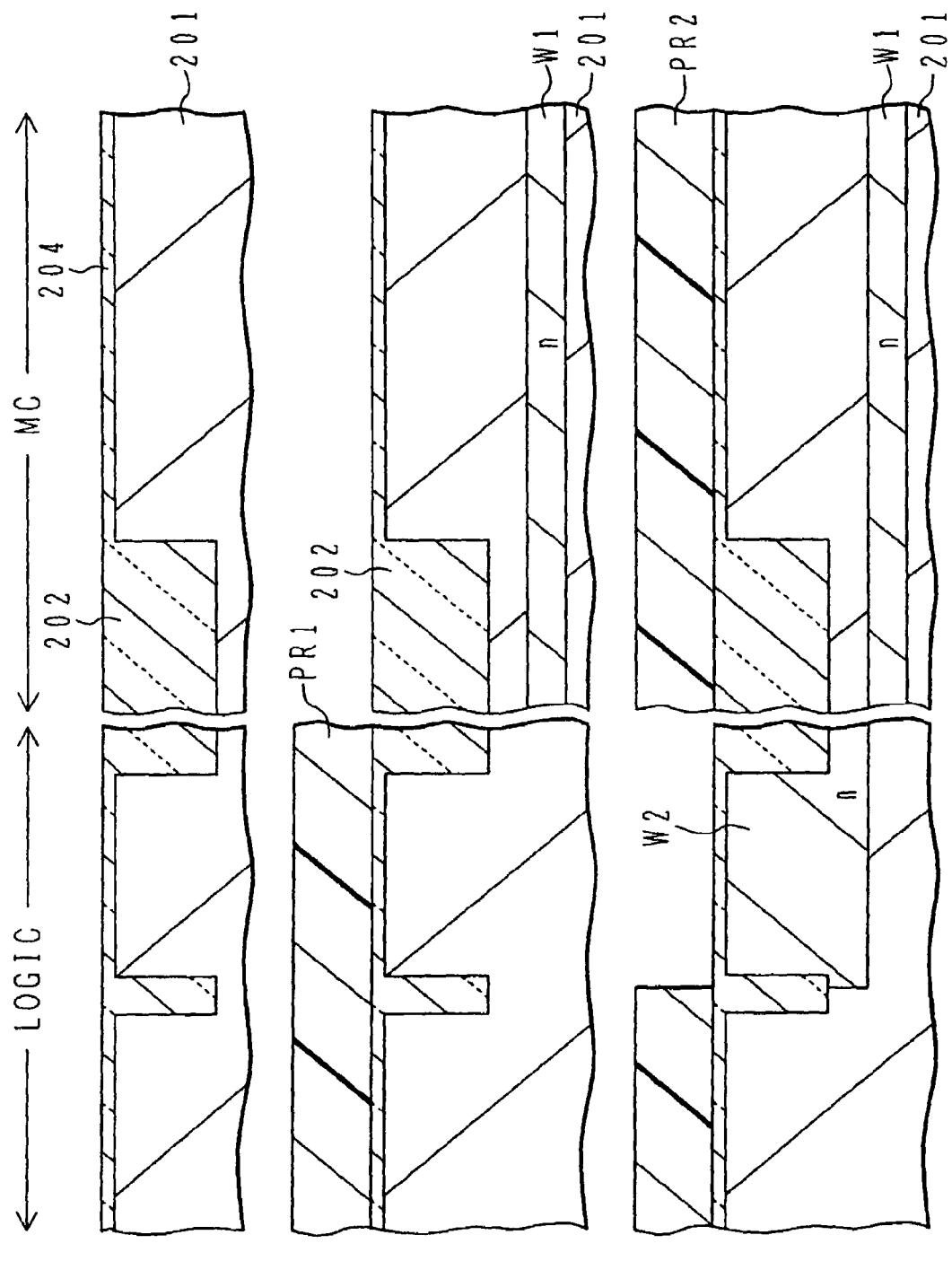

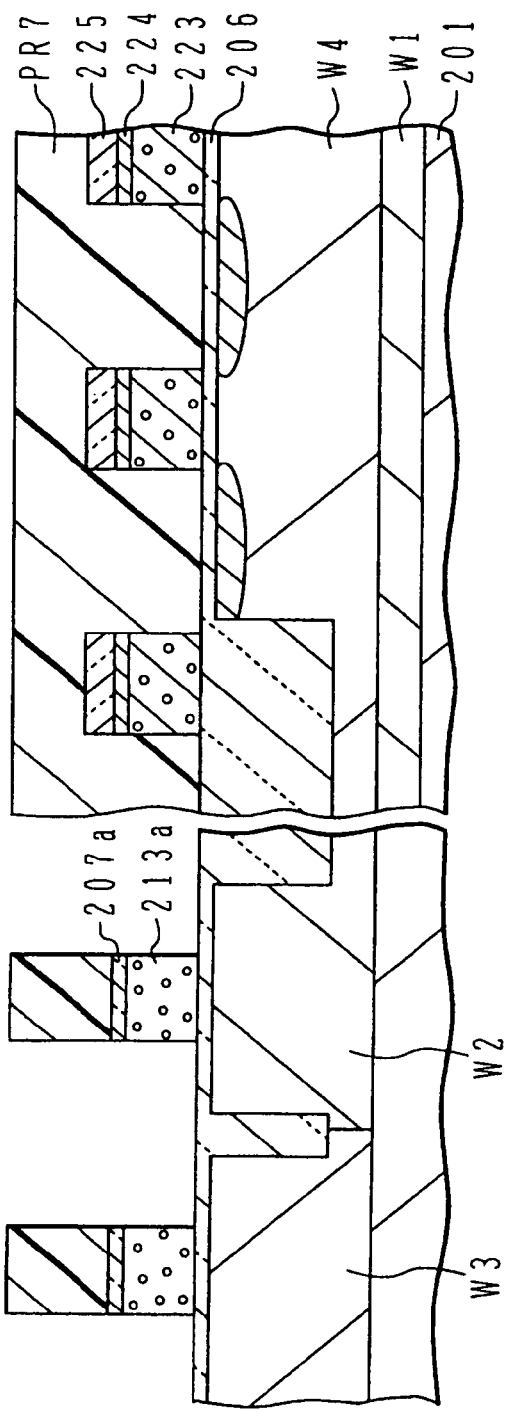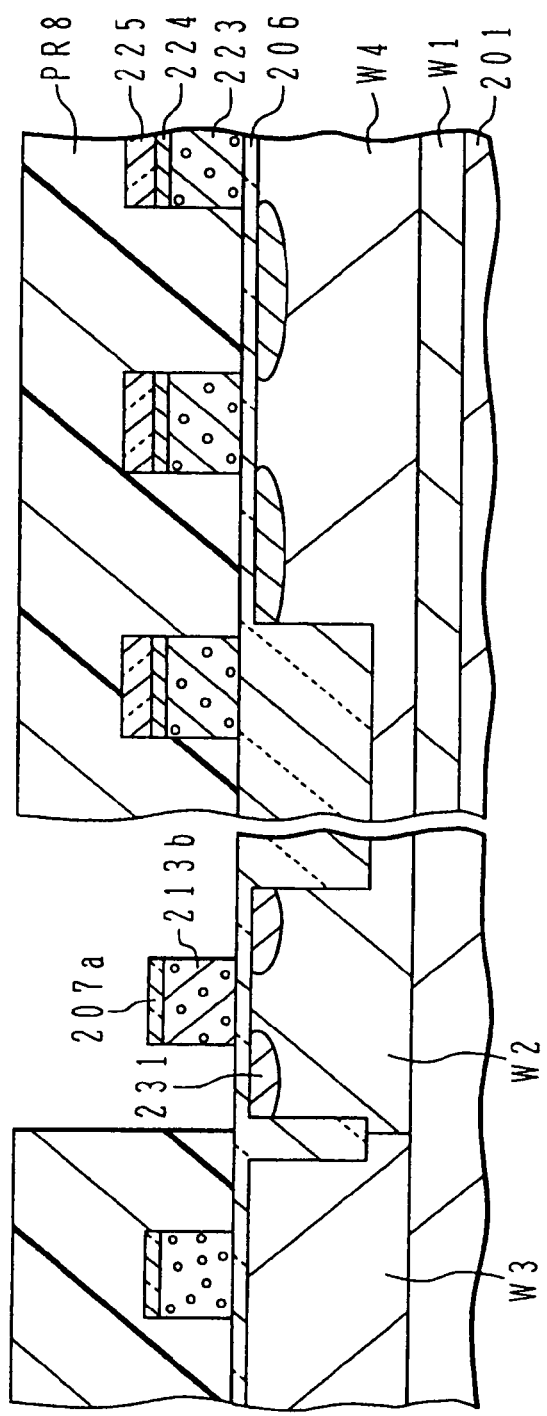
FIG.42A
FIG.42B

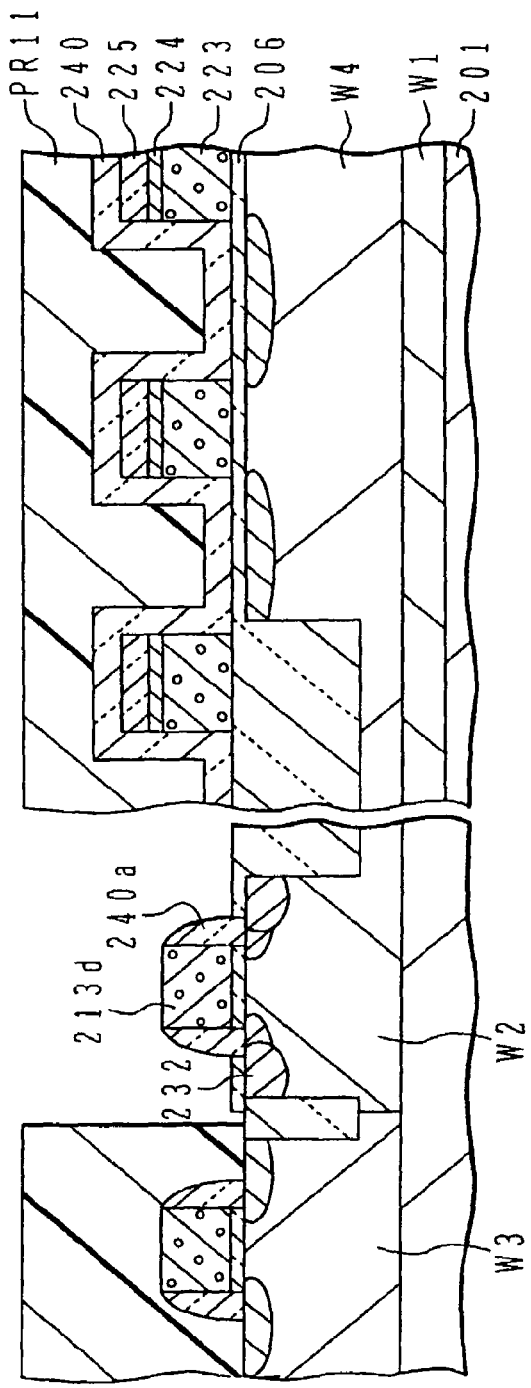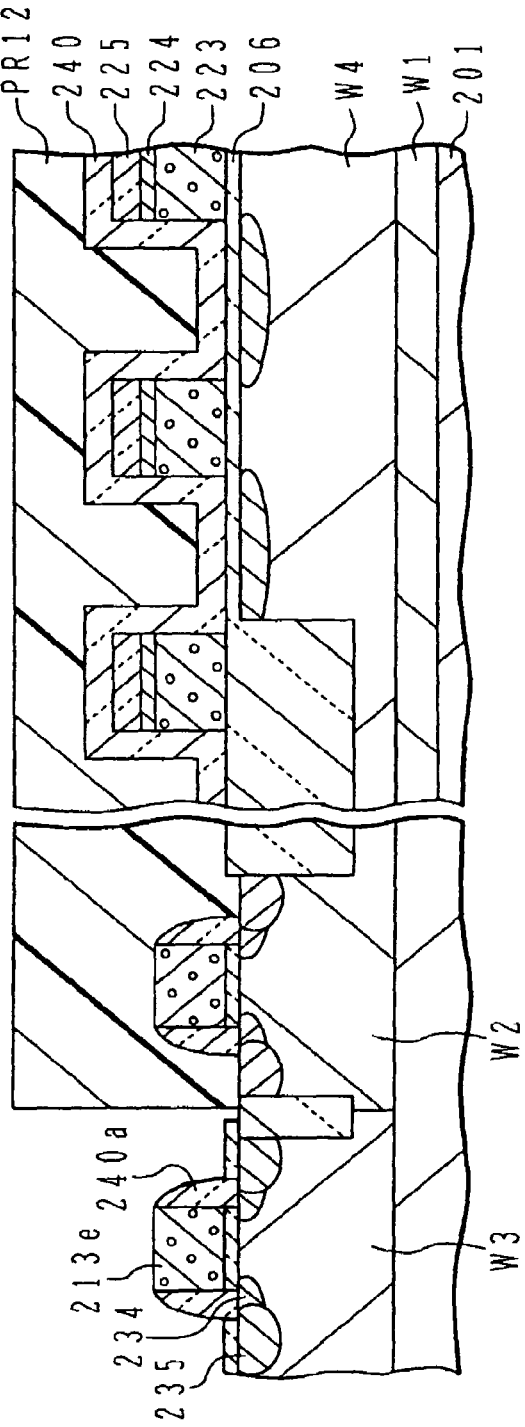
FIG.44A
FIG.44B

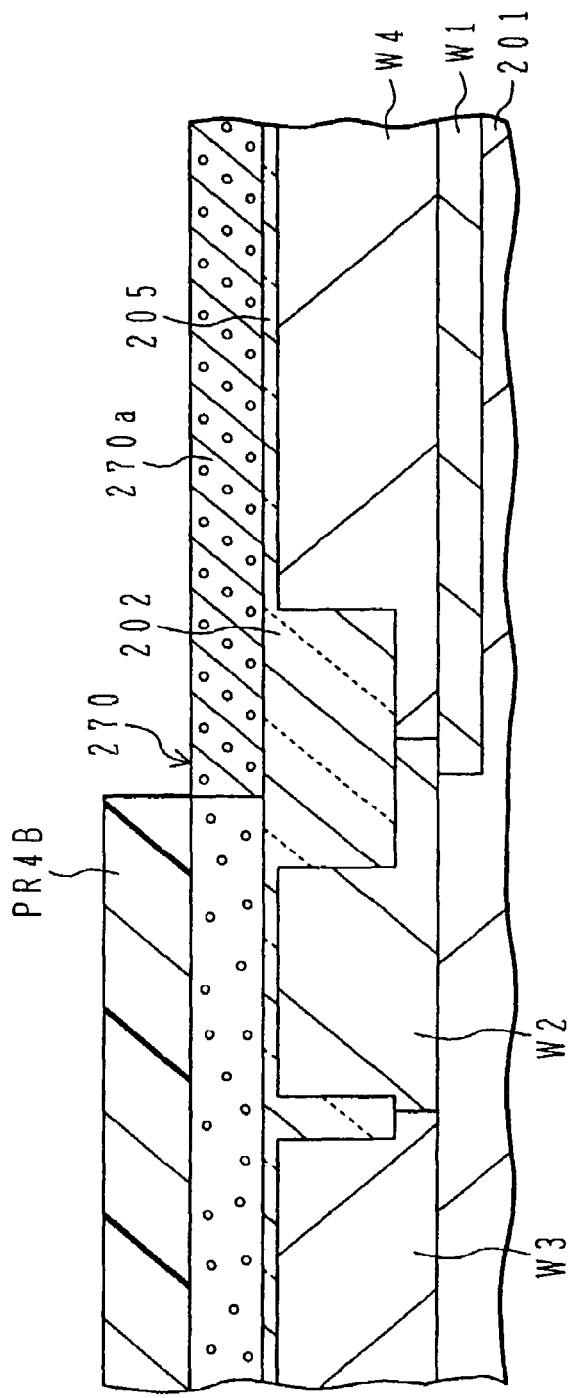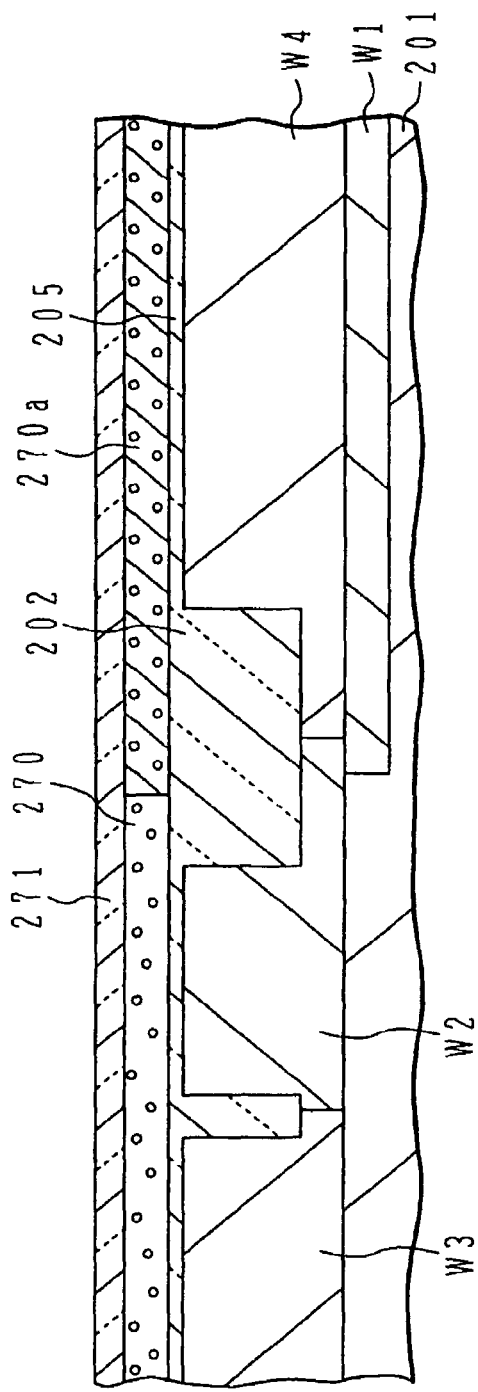
FIG.50A
FIG.50B

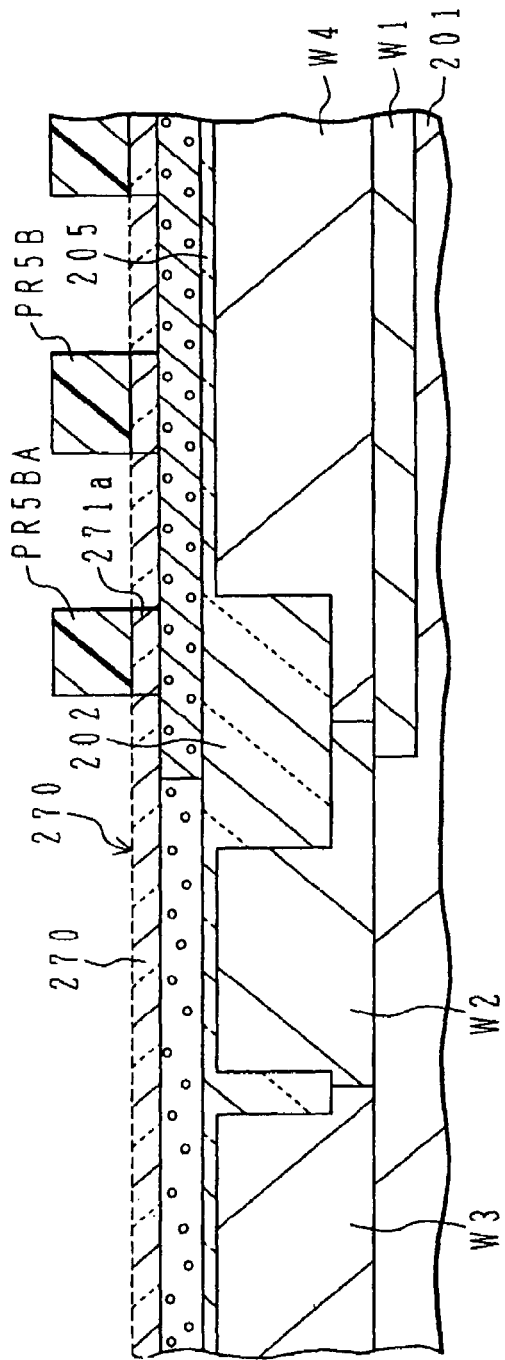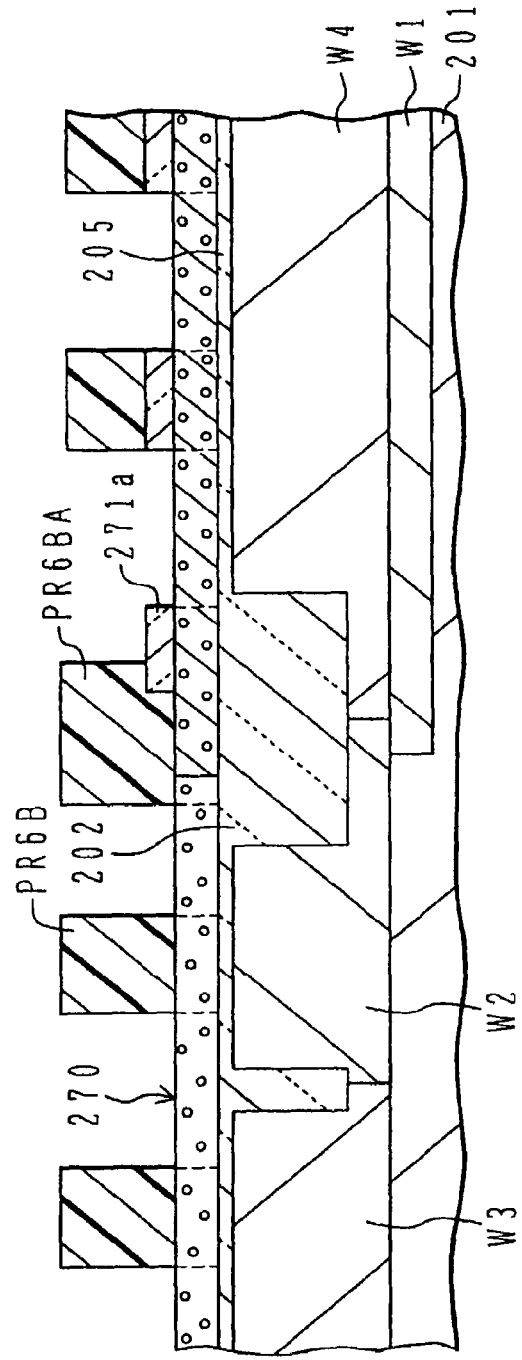

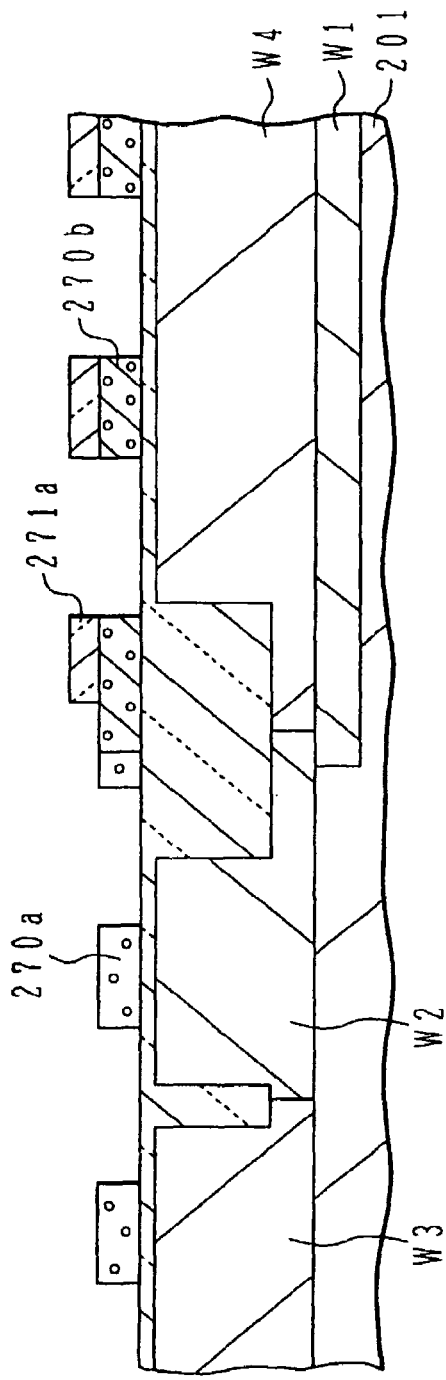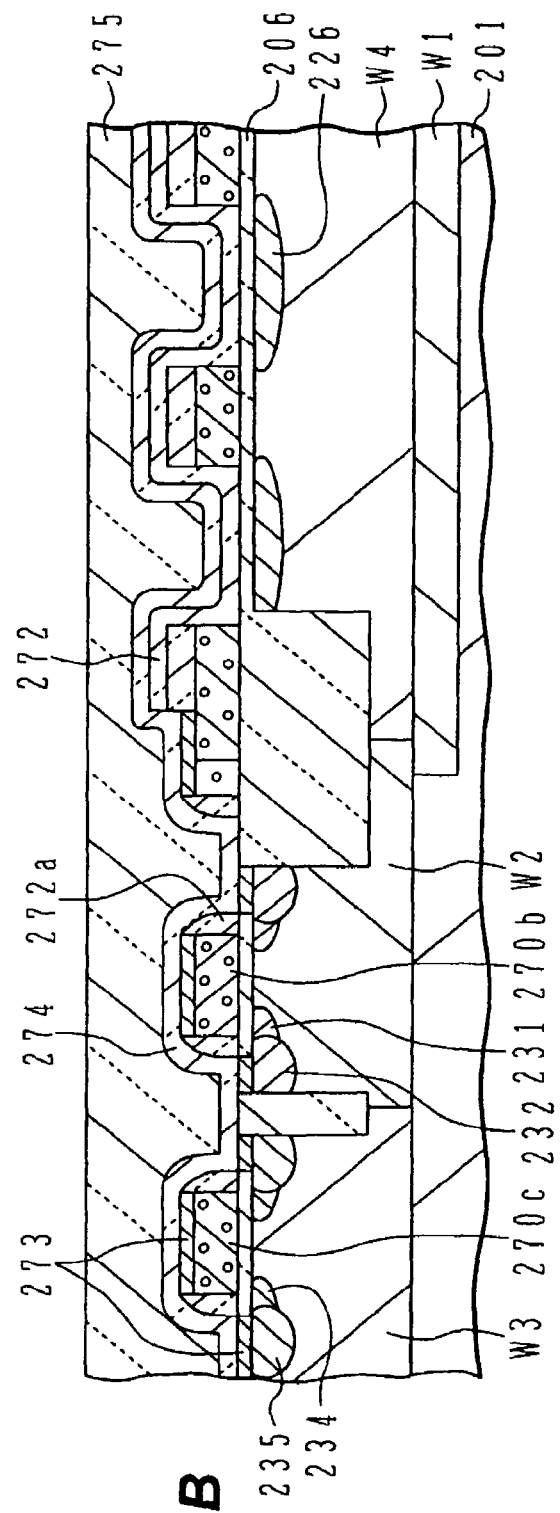
FIG.52A
FIG.52B

US 7,595,231 B2

SEMICONDUCTOR DEVICE AND ITS MANUFACTURE

CROSS REFERENCE TO RELATED APPLICATIONS

This application is a divisional application of U.S. Patent Application Ser. No. 10/707,525 filed Dec. 19, 2003 now U.S. Pat. No. 7,157,731, which application is a divisional application of Ser. No. 09/571,555 now filed May. 16, 2000 U.S. Pat. No. 6,690,050 issued Feb. 10, 2004, which patent claims priority of Japanese Patent Application No. 11-136658 filed May. 18, 1999 and Japanese Application No. 2000-109796 filed Apr. 11, 2000, the entire contents of which are incorporated herein by reference.

BACKGROUND OF THE INVENTION

1. Field of the Invention

The present invention relates to a semiconductor device and its manufacture method, and more particularly to the structure of a semiconductor device having both dynamic random access memories (DRAM) and logic circuits on the same substrate.

2. Description of the Related Art

FIGS. 29(A) to 38 are diagrams illustrating a conventional method of manufacturing a semiconductor device with DRAM and logic circuits.

In each figure, the right side shows a CMOS transistor area in a logic area, and the left side shows a DRAM memory area.

First, as shown in FIG. 29(A), element isolation regions 102 are formed on a silicon substrate 101 by well-known element isolation techniques such as shallow trench isolation (STI) techniques to separate active regions.

If necessary, n-wells are formed in a p-channel transistor area and p-wells are formed in an n-channel transistor area and a memory cell area. A channel stop layer for preventing leak current between element forming regions and a channel dope layer for controlling Vth are also formed. Three masks (resist patterns) in total are required to form a p-well and an n-well in the logic area and a p-well in the memory cell area by using different ion implantation. If a triple well is to be formed, four masks in total are required.

Next, as shown in FIG. 29(B), a gate oxide film Gox is formed on the active region through thermal oxidation, and an amorphous silicon layer 103 is formed on the gate oxide film Gox. A resist pattern 104 exposing the n-channel transistor area and memory cell area is formed on the amorphous silicon layer 103. Arsenic or phosphorous ions are implanted to change the n-channel transistor area and memory cell area of the amorphous silicon layer 103 to an n-type amorphous silicon layer 103a. In the following drawings, the gate oxide film Gox is omitted.

As shown in FIG. 30(A), after the resist pattern 104 is removed, a resist pattern 105 exposing the p-channel transistor area is newly deposited. Boron or boron fluoride ions are implanted to change the amorphous silicon layer 103 on the p-channel region to a p-type amorphous silicon layer 103b.

By implanting n-type impurities into the silicon layer to be used as the gate in the n-channel transistor area and p-type impurities into the silicon layer to be used as the gate in the p-channel transistor area, as described above, resistance against the short channel effects can be made high because surface channel type transistors can be formed by utilizing a work function difference. This structure requires two masks (resist patterns).

As shown in FIG. 30(B), after the resist pattern 105 is removed, a tungsten silicide (WSi) layer 106 and a silicon nitride film 107 are sequentially deposited by chemical vapor deposition (CVD), and patterned into a gate electrode shape by well-known photolithography techniques. The gate electrode in the memory cell area also functions as a word line.

As shown in FIG. 31(A), a resist pattern 108 exposing the p-channel transistor area is formed. Boron ions are implanted into the substrate to form a lightly doped drain (LDD) regions (p⁻ type impurity diffusion layer) 109 of a p-channel transistor.

As shown in FIG. 31(B), after the resist pattern 108 is removed, a resist pattern 110 is formed to expose the n-channel transistor area in the logic area. Phosphorous ions are implanted into the substrate to form a low concentration regions (LDD regions, n-type impurity diffusion regions) 111 of an n-channel transistor.

As shown in FIG. 32(A), after the resist pattern 110 is removed, a resist pattern 112 is formed to expose the memory cell area. Phosphorous ions are implanted into the substrate to form an n-type impurity diffusion regions (source/drain regions) 113 of a transistor in the memory cell area.

Next, as shown in FIG. 32(B), after the resist pattern 112 is removed and a silicon nitride film 114 is formed, the memory cell area is covered with a resist pattern 115 to anisotropically and selectively etch the nitride film in the CMOS area. The nitride film on the flat surface is removed to form side wall spacers 114a on the side walls of the gate electrodes of n- and p-channel transistors in the CMOS area.

In this case, the source/drain regions in the memory cell area are being covered with the silicon nitride film.

Next, similar to the processes shown in FIGS. 31(A) and 31(B), by using different resist patterns, boron ions are implanted into the p-channel transistor area to a high concentration and arsenic ions are implanted into the n-channel transistor area to a high concentration to form source/drain regions (p⁺-type impurity diffusion regions 116 and n⁺-type impurity diffusion regions 117), as shown in FIG. 33. Thereafter, the resist pattern used as the mask is removed.

Next, a cobalt (Co) film is formed on the surface of the semiconductor substrate by sputtering, and heat treatment is performed to react Co with the exposed silicon surface. Then, unreacted cobalt film is removed. With these processes, a cobalt silicide layer 118 is formed on the source/drain regions 116 and 117 in the CMOS area. A process of forming the suicide layer through reaction between exposed silicon and cobalt and removing the unreacted metal layer to from the silicide layer only on the silicon area is called a salicide (self-aligned silicide) process.

As shown in FIG. 34, after a BPSG layer 119 is formed by CVD, the surface of this layer is planarized by a chemical mechanical polishing (CMP) method or the like. Next, contact holes 120 are formed through the BPSG layer 119 in the areas corresponding to the source/drain regions 113 by well-known photolithography techniques. In this case, BPSG is etched under the conditions that the nitride film is hard to be etched, and the exposed nitride film is anisotropically etched to expose the surfaces of the source/drain regions 113 in the memory cell area.

The contact holes 120 can be formed in self-alignment with the side wall spacers 114b because these spacers of nitride are formed on the side walls of the gate electrode to be used also as the word line. A process of forming a contact hole by utilizing an insulating film on the side walls of a wiring layer is generally called a SAC (self-aligned contact) method.

As shown in FIG. 35, a silicon film is formed on the BPSG layer 119, filling the contact holes 120. Thereafter, the surface of the semiconductor substrate is planarized to remove the silicon film in the area other than the contact holes and leave the silicon layer only in the contact holes 120, so that silicon plugs 121 can be formed. Next, another BPSG layer 122 is formed and by using a resist pattern, a contact hole is formed through the BPSG layer 122 in the area corresponding to the silicon plug 121 to be connected to a bit line. A bit line 123 of tungsten or the like is formed and connected to the silicon plug 121 via the contact hole.

As shown in FIG. 36, a BPSG layer 124 is formed and the surface thereof is planarized. Contact holes for a storage electrode are formed through the BPSG layer 124 in areas corresponding to the silicon plugs 121 on both sides of the plug 121 connected to the bit line. Then, a storage electrode 125, a capacitor dielectric film 130 and an opposing electrode 126 are formed.

As shown in FIG. 37, after a BPSG layer 127 is formed over the capacitor, contact holes for the source/drain regions 116 and 117 in the CMOS area are formed through the BPSG layer 127. Al wiring layers 128 are formed on the BPSG layer 127, the Al wiring layers 128 being connected via the contact holes to the source/drain regions 116 and 117 in the CMOS area.

Thereafter, a passivation film is formed, bonding openings are formed and other necessary processes are executed by well-known methods to complete a CMOS logic-memory device.

The above-described conventional processes are, however, associated with the following problems.

First, the SAC process becomes necessary in the cell area in order to reduce a memory cell area, and in order to form high performance transistors, the CMOS structure in the logic area is required to be of the surface channel type for both n- and p-channel transistors and in addition the resistance of the electrode is required to be made low.

The number of processes therefore increases. Ten photolithography processes are used from the doping process of the gate electrode shown in FIG. 29(B) to the contact hole forming process for the source/drain regions in the memory cell area shown in FIG. 34. If photolithography processes for forming the wells are added, thirteen photolithography processes are used.

Second, it is technically difficult to form contact holes for the gate electrodes in the memory cell area and logic area at the same time when contact holes for the source/drain regions are formed in the logic area by using the highest level Al layer.

This problem is illustrated in FIG. 38. The left side portion shows a contact region between the gate electrode and Al wiring layer in the memory cell area, the center portion shows a contact region between the gate electrode in the logic area and the Al wiring layer, and the right portion shows a contact region between the source/drain regions in the n-channel transistor area in the logic area and the Al wiring layer. The Al wiring layer in the memory cell area contacts, for example, the low level word line constituting a strap word line for the Al wiring layer.

As seen from FIG. 38, in the source/drain contact portion in the logic area of the right side portion, contact holes are formed by etching the BPSG films 127, 124, 122 and 119, whereas in the gate electrode contact portion of the center portion, contact holes are formed by etching the BPSG films 127, 124, 122 and 119 and in addition the silicon nitride film 107. In addition to these films, the silicon nitride film 114 is required to be etched in the gate electrode contact portion in the left memory cell area.

If these contact holes are to be formed at the same time, BPSG over the source/drain regions in the logic area is completely etched while the nitride film 114 or 107 is etched. The contact holes are therefore formed through the silicide layer 118 and source/drain regions 117 and enter the substrate 101. From this reason, these contact holes cannot be formed at the same time. It is necessary to further increase the number of photolithography processes.

Third, since the silicon nitride film is in direct contact with the side walls of the gate electrode, particularly with the gate electrode in the logic area, transistor characteristics are likely to be deteriorated by hot carriers. Further, because of hydrogen (H) in the nitride film, boron ions implanted into the gate electrode in the p-channel transistor area enter the gate insulating film so that the threshold value (Vth) of the transistor may be varied. Therefore, the transistor characteristics are varied and the manufacture yield is lowered.

SUMMARY OF THE INVENTION

It is an object of the present invention to provide a novel logic-memory device capable of improving a manufacture yield with simple processes.

According to a first aspect of the present invention, there is provided a semiconductor device comprising: a semiconductor substrate; a memory cell area and a logic area defined in the semiconductor substrate; word lines formed in the memory area, the gate line including a gate electrode; gate electrodes of complementary transistors formed in the logic area; a first insulating layer formed on an upper surface of the word line in the memory area and on side walls of the gate electrode in the logic area; and a second insulating layer covering side walls of the word line in the memory area and the gate electrode in the logic area.

With this structure of the invention, after transistors are formed in the logic area, an etching protection film for SAC necessary for memory cells and word lines can be formed. It is possible to dope impurities into both the source/drain regions and gate electrode in the logic area. The total number of masking processes can be reduced.

According to a second aspect of the invention, there is provided a semiconductor device comprising: a semiconductor substrate; a memory cell area and a logic area defined in the semiconductor substrate; word lines formed in the memory area, the gate line including a gate electrode; gate electrodes of complementary transistors formed in the logic area; side wall spacers made of silicon nitride and formed on side walls of the word line in the memory cell area; and side wall spacers made of silicon oxide and formed on side walls of the gate electrode in the logic area.

While side wall spacers for the word line are formed by a silicon nitride film for SAC in the memory cell area, side wall spacers of the gate electrode in the logic area can be formed by a silicon oxide film. Accordingly, adverse effects can be avoided which may result from that the silicon nitride film is in direct contact with the side walls of the gate electrode in the logic area. Namely, transistor characteristics are not deteriorated by hot carriers. Boron ions implanted into the gate electrode in the p-channel transistor area will not enter the gate insulating film so that the threshold value (Vth) of the transistor will not be varied. Therefore, the transistor characteristics can be maintained stable.

According to a third aspect of the invention, there is provided a method of manufacturing a semiconductor device, comprising the steps of: (a) forming element isolation insulating films in first and second areas of a semiconductor substrate to define active regions; (b) depositing a first conductive film on a whole surface of the semiconductor substrate; (c) forming a first mask member on the first conductive film, the first mask member covering the first area and exposing the second area; (d) by using the first mask member as a mask, etching the first conductive film to leave the first conductive film extending in the first area; (e) by using the first mask member or the first conductive film as a mask, introducing impurities into the semiconductor substrate in the first area; (f) depositing a second conductive film over a whole surface of the semiconductor substrate; (g) forming a second mask member on the second conductive film, the second mask member having a pattern of gate electrodes to be formed in the second area; (h) by using the second mask member as a mask, etching the second conductive film to form a plurality of second gate electrodes in the second area; and (i) patterning the first conductive film in the first area to form a plurality of first gate electrodes.

According to a fourth aspect of the invention, there is provided a semiconductor device, comprising: a semiconductor substrate including first and second areas; a plurality of first conductive patterns formed in the first area; a plurality of second conductive patterns formed in the second area, the second conductive pattern having a structure different from the first conductive pattern; first, second, third and fourth insulating films formed on the second conductive pattern; and the third and fourth insulating films formed on the first conductive pattern.

According to a fifth aspect of the invention, there is provided a semiconductor device, comprising: a semiconductor substrate having first and second areas and an intermediate area; a first gate electrode structure formed in the first area, the first gate electrode structure having a plurality of first conductive patterns; a second gate electrode structure formed in the second area, the second gate electrode structure having a lamination structure of a plurality of second conductive patterns having a same structure as the first conductive patterns, and a first insulating film having a same pattern and formed on the second conductive pattern; a plurality of third conductive patterns formed in the intermediate area, the third conductive pattern having a same structure as the first conductive pattern; a third gate electrode structure formed on a partial surface of the third conductive pattern and having a same structure as the first insulating film; and an upper insulating film formed on surfaces of the first, second and third gate electrode structures.

SAC is used in the memory area. In the logic area, the CMOS structure is a surface channel type for both n- and p-channel transistors. The electrodes of a silicide structure are formed with a reduced number of photolithography processes, which reduce the total number of manufacture processes.

Contact holes for the source/drain regions in the logic area and for the gate electrodes in the memory cell area and logic area can be formed at the same time. The number of processes can therefore be reduced.

The side wall spacers of the gate electrode in the logic area are made of a silicon oxide film. Therefore, the silicon nitride film is not in direct contact with the side walls of the gate electrode. Accordingly, transistor characteristics are not deteriorated by hot carriers. Further, even with hydrogen (H) in the nitride film, boron ions implanted into the gate electrode in the p-channel transistor area will not enter the gate insulating film so that the threshold value (Vth) of the transistor is made stable. Therefore, the transistor characteristics are made stable and the manufacture yield is improved.

BRIEF DESCRIPTION OF THE DRAWINGS

FIGS. 1(A) to 9 are schematic cross sectional views of a substrate illustrating manufacture processes according to a first embodiment of the invention.

FIGS. 14(A) to 23 are schematic cross sectional views of a substrate illustrating manufacture processes according to a second embodiment of the invention.

FIGS. 29(A) to 37 are schematic cross sectional views of a substrate illustrating manufacture processes according to conventional techniques.

FIGS. 39(A) to 46 are schematic cross sectional views of a substrate illustrating manufacture processes according to a third embodiment of the invention.

FIGS. 50(A) to 52(B) are schematic cross sectional views of a substrate illustrating manufacture processes according to a fifth embodiment of the invention.

DETAILED DESCRIPTION OF THE PREFERRED EMBODIMENTS

Figure 1A:
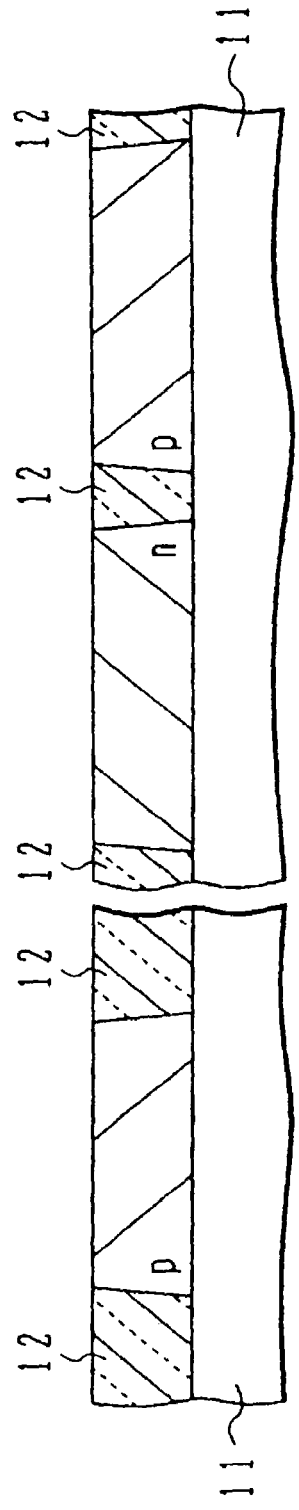

Embodiments will now be described with reference to the accompanying drawings. Unless otherwise specified in each drawing, the right side of the drawing shows a CMOS transistor area or logic area, and the left side thereof shows a cell area of a DRAM memory cell.

1st Embodiment

As shown in FIG. 1(A), an element isolation region 12 is first formed on a silicon substrate 11 by using well-known shallow trench isolation techniques to separate active regions. Necessary n-wells and p-wells are formed in a p-channel transistor area and in an n-channel transistor area and memory cell area. A channel stop layer for preventing leak current between active regions and a channel dope layer for controlling Vth are formed if necessary.

Figure 1B:
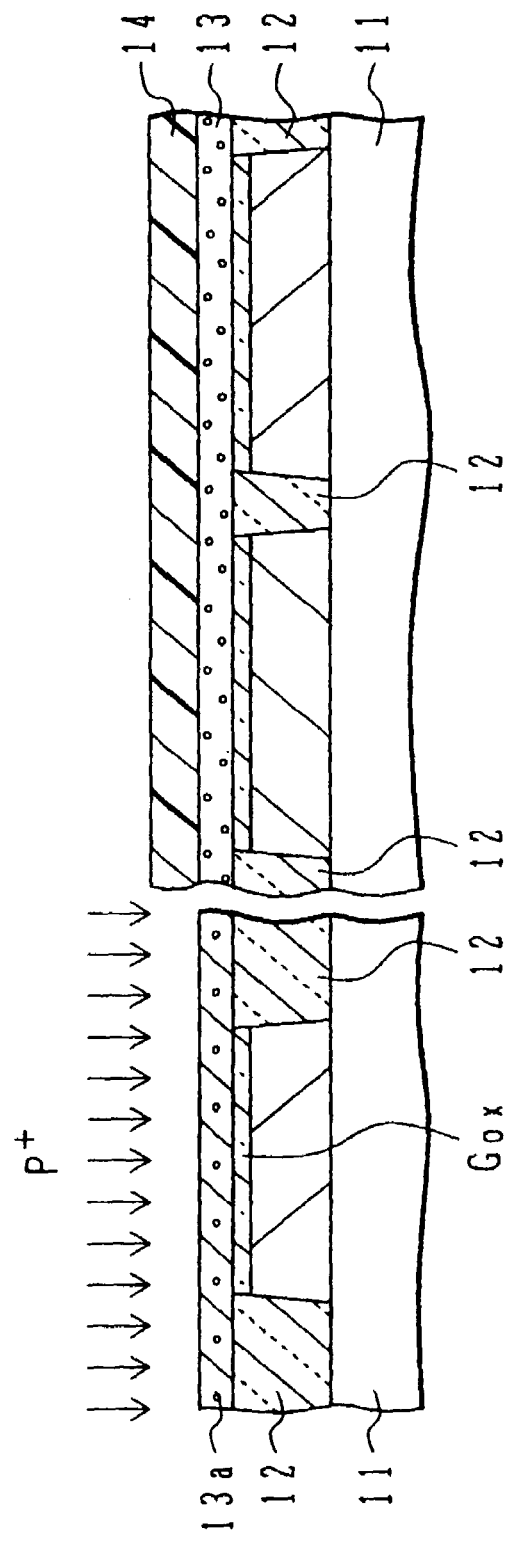

Next, as shown in FIG. 1(B), a gate oxide film Gox, which is made by silicon oxide or silicon oxynitride (which is also called silicon oxide in the following description) is formed on the active region by thermal oxidation, and then an amorphous silicon layer 13 is deposited to a thickness of 150 nm. A photoresist layer 14 exposing the memory cell area is formed on the amorphous silicon layer 13. By using this resist layer 14 as a mask, phosphorous ions are implanted, for example, under the conditions of an acceleration energy of 30 KeV and a dose of $1\text{H}10^{16}$ cm$^{-2}$ to change the amorphous silicon layer 13 on the memory cell area to an n-type amorphous silicon layer 13a. Thereafter, the photoresist layer 14 is removed. This amorphous silicon layer 13a is crystallized at a later heat treatment process and its phosphorous ions are activated to make a low resistance n-type polysilicon layer.

As shown in FIG. 2(A), by using well-known photolithography techniques, the amorphous silicon layer 13 is patterned to form CMOS gate electrodes 13b in the logic area. Then, dry oxidation is performed at 800E C. to form an oxide film of 3 nm in thickness on the n-type silicon layer 13a, the side walls of the gate electrodes 13b and the like. This oxide film is formed in order to improve the dielectric breakdown voltage of the gate oxide film at the edges of the gate electrode etched and exposed, and may be omitted by optimizing the etching conditions of the gate electrode or by other measures.

Next, as shown in FIG. 2(B) a resist pattern 15 is formed exposing the p-channel transistor area. By using this resist pattern 15 as a mask, boron (B) ions are implanted under the conditions of an acceleration energy of 5 KeV and a dose of $^3\text{H}10^{14}$ cm$^{-2}$ to form LDD transistor low concentration diffusion regions (p$^-$-type impurity diffusion regions) 16 on both sides of the gate electrode 13b in the p-channel transistor area. The resist pattern 15 is thereafter removed.

As shown in FIG. 3(A), a resist pattern 17 is formed exposing the n-channel transistor area. By using this resist pattern 17 as a mask, arsenic (As) ions are implanted under the conditions of an acceleration energy of 10 KeV and a dose of $1\text{H}10^{14}$ cm$^{-2}$ to form LDD transistor low concentration diffusion regions (n$^1$-type impurity diffusion regions) 18 on both sides of the gate electrode 13b in the n-channel transistor area. In this case, the resist pattern 17 is not necessarily required to cover the memory cell area. However, it is preferable that this mask pattern is made the same as that for forming high concentration n-channel source/drain regions in the logic area at a later process, so as not to increase the number of mask patterns. The resist pattern 17 is thereafter removed.

As shown in FIG. 3(B), a silicon nitride film 19 is grown to a thickness of 60 nm by plasma-enhanced CVD. Then, a resist pattern 20 exposing the logic area is formed and the exposed nitride film 19 is anisotropically etched. The nitride film 19 exposed on the flat surface is therefore removed, and side wall spacers 19a of the silicon nitride film are formed on the side walls of the CMOS silicon gate electrodes 13b in the logic area. The resist pattern 20 is thereafter removed.

As shown in FIG. 4(A), a resist pattern 21 exposing the p-channel transistor area is formed. By using this resist pattern 21 as a mask, boron ions are implanted under the conditions of an acceleration energy of 5 KeV and a dose of $5\text{H}10^{15}$ cm$^{-2}$ to form high concentration source/drain diffusion regions (p$^+$-type impurity diffusion regions) 22 in the p-channel transistor area. The resist pattern 21 is thereafter removed. At this time, since boron ions are doped also into the gate electrode 13b, the gate electrode of the p-channel transistor becomes also a p-type silicon gate electrode 13c.

Since doping the gate electrode and forming the source/drain diffusion regions can be performed by one photolithography process, the number of processes can be reduced more than conventional techniques. The number of mask patterns can be reduced if the mask pattern for this process is made the same as that of forming the p-channel low concentration diffusion regions.

As shown in FIG. 4(B), a resist pattern 23 exposing the n-channel transistor area is formed. By using this resist pattern 23 as a mask, phosphorous ions are implanted under the conditions of an acceleration energy of 10 KeV and a dose of $4\text{H}10^{15}$ cm$^{-2}$ to form high concentration source/drain diffusion regions (n$^+$-type impurity diffusion regions) 24 in the n-channel transistor area. The resist pattern 23 is thereafter removed. At this time, since phosphorous ions are doped also into the gate electrode 13b, the gate electrode of the n-channel transistor becomes also an n-type silicon gate electrode 13d. The number of mask patterns can be reduced if the mask pattern for this process is made the same as that of forming the n-channel LDD regions.

The gate electrode of the n-channel transistor is doped with n-type impurities same as for the gate electrode in the memory cell area. Therefore, similar to conventional techniques, at the same time when the silicon layer in the memory cell area is doped, the n-channel transistor may be doped. If such a mask pattern is used, the mask pattern for doping the silicon layer in the memory cell area shown in FIG. 1(B), the mask pattern for forming the n-channel transistor LDD regions shown in FIG. 3(A) and the mask patter for forming the gate electrode and source/drain regions of the n-channel transistor shown in FIG. 4(B) can be unified. The number of mask patterns can be reduced further.

Next, a heat treatment for 10 seconds at 1000E C. (RTA: Rapid Thermal Anneal) is executed to recover crystalinity in the ion implanted layer and activate implanted ions. Such activation heat treatment may be performed for each ion implantation if necessary. Next, a silicon oxide film is removed which was formed on the surfaces of the p$^+$-type impurity diffusion regions 22 and n$^+$-type impurity diffusion regions 24 as the source/drain regions and the gate electrodes 13c and 13d, respectively in the logic area.

As shown in FIG. 5(A), a cobalt (Co) layer of 10 nm in thickness and a titanium nitride (TiN) layer of 30 nm in thickness are sequentially deposited by sputtering. An RTA process is executed for 30 seconds at 500E C in a nitrogen atmosphere to react cobalt with silicon exposed on the surfaces of the p$^+$-type impurity diffusion regions 22, n$^+$-type impurity diffusion regions 24 and gate electrodes 13c and 13d, respectively in the logic area to form cobalt silicide layers 25. Next, the titanium nitride layer and an unreacted cobalt layer are removed by using aqua regia. The cobalt silicide layers 25 are therefore formed locally on the source/drain regions and gate electrodes. The reason why the titanium nitride layer is formed on the cobalt layer is to make uniform the silicification reaction.

The material of silicide is not limited only to cobalt, but other materials may also be used, such as titanium, tungsten, molybdenum and platinum. If material such as titanium, tungsten or molybdenum is used, there is a merit that dry etching at a later process becomes easy.

As shown in FIG. 5(B), a silicon nitride film 26 is grown to a thickness of 20 nm by CVD in a CVD furnace of a load-lock type. The nitride films 26 and 19 and n-type silicon layer 13a in the memory cell area are selectively and sequentially etched and removed by well-known photolithography techniques to form a gate electrode pattern made of a lamination structure of a silicon layer 13e and nitride films 19a and 26a. The silicon layer 13e of the gate electrode in the memory cell area functions as the word line. The total thickness of the silicon nitride films on the silicon layer 13e is generally equal to the total thickness of the silicon nitride films 19a and 26 formed on the side walls and upper surfaces of the n- and p-channel transistors in the logic area.

Next, by using the gate electrode pattern in the cell area as a mask, phosphorous ions are implanted under the conditions of an acceleration energy of 30 KeV and a dose of $3\text{H}10^{13}$ cm$^{-2}$ to form source/drain regions (n-type impurity diffusion regions) 27 in the memory cell area. At this time, since the logic area is covered with the silicon nitride film 26, phosphorous ions are not implanted.

Figure 6:
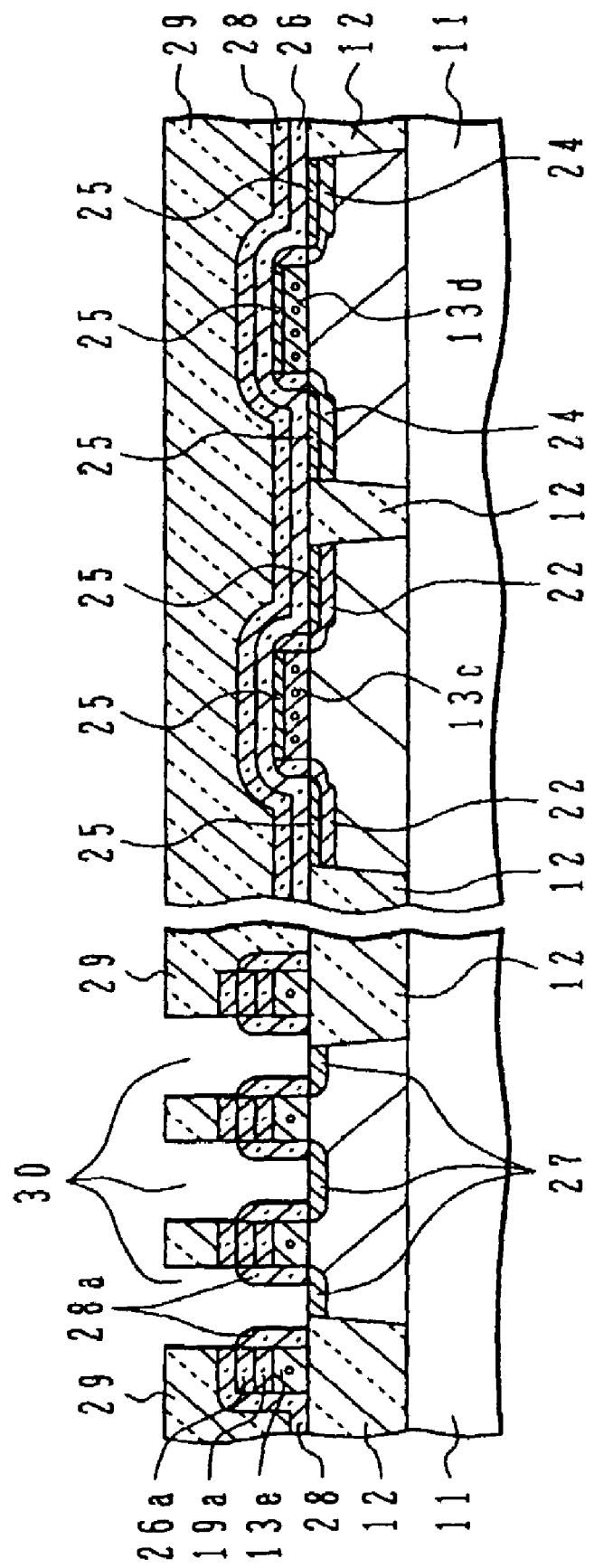

As shown in FIG. 6, a silicon nitride film 28 is grown to a thickness of 60 nm by CVD, and then a BPSG film 29 is formed to a thickness of 800 nm by CVD. The BPSG film 29 is polished by CMP to planarize the surface thereof. The dielectric breakdown voltage of the gate oxide film at the edge of the gate electrode 13e can be improved by oxidizing the silicon surface prior to growing the silicon nitride film 28, similar to the etching process for the gate electrode in the logic area described with FIG. 2(A).

Next, the BPSG film 29 and silicon nitride film 28 are selectively anisotropically etched by well-known photolithography techniques to form contact holes 30 in the areas corresponding to the source/drain regions 27 in the memory cell area. In this case, the BPSG film 29 is etched under the condition that an etching selection ratio relative to the nitride film becomes sufficient, and after the BPSG film is removed, the nitride film exposed in the contact hole is anisotropically etched. Nitride film side wall spacers 28a are therefore formed on the side walls of the electrode pattern (word line), and the contact holes 30 are formed in self-alignment with the side wall spacers.

As an etching method having a high etching selection ratio relative to the nitride film, an RIE (Reactive Ion Etching) method with two RF frequencies using a mixture gas of $CF_8$, CO, Ar and $O_2$ or other methods may be used.

Figure 7:
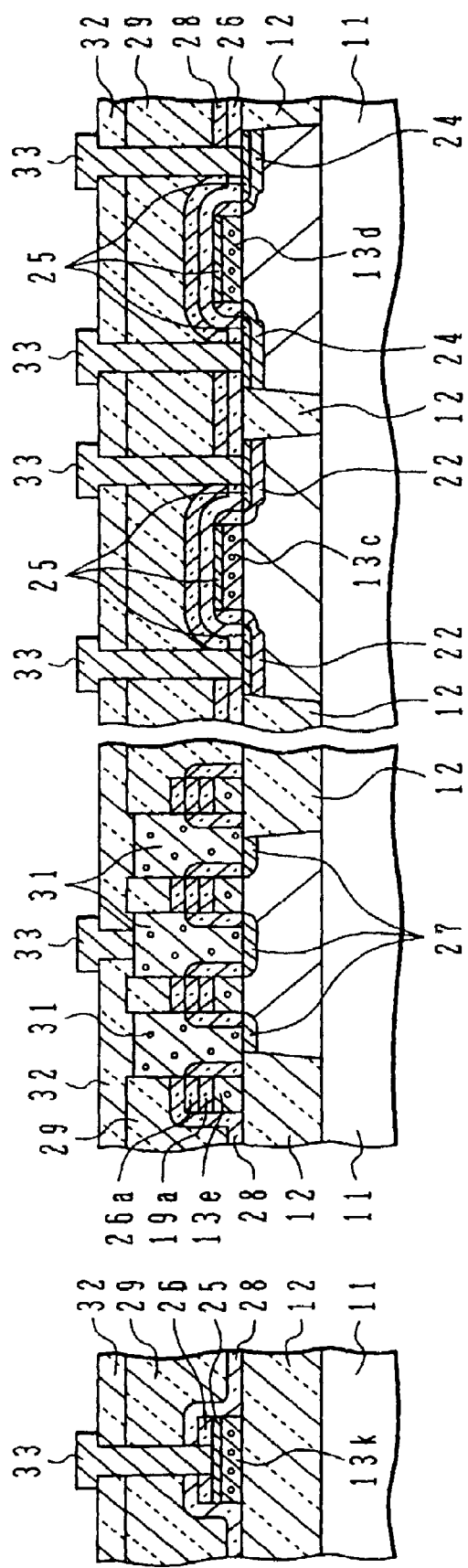

As shown in FIG. 7, after an amorphous silicon film doped with phosphorous is formed, this film is planarized by CMP or the like. The amorphous silicon film outside the contact holes 30 is removed and the amorphous silicon film is left only in the contact holes 30 to form silicon plugs (contact plugs) 31.

Next, a BPSG film 32 is deposited 500 nm thick and contact holes are formed in the areas corresponding to the silicon plug 31 to be connected to the bit line and the source/drain regions 22 and 24 in the logic area. On the BPSG layer 32, a 20 nm thick titanium (Ti) layer and a 50 nm thick titanium nitride (TiN) layer are sequentially deposited by sputtering, and then a 20 nm thick tungsten layer is deposited by CVD. These tungsten layer, titanium nitride layer and titanium layer are patterned by well-known photolithography techniques to form tungsten wiring layers 33 to be used as the bit line and logic wiring lines.

The contact hole formed through the BPSG layer 32 can be formed by etching a single layer of the BPSG layer 32 on the silicon plug. However, the contact holes for the source/drain regions 22 and 24 in the logic area are formed by etching the lamination of the BPSG film 32, BPSG film 29, and nitride films 28 and 26. The etching time taken to form the contact holes becomes considerably different. However, the BPSG films and nitride films are etched under the condition that silicon is hard to be etched and in addition, the silicon plug 31 is thick in the height direction. Therefore, a conventional problem that a contact hole is formed down into the diffusion region, will not occur.

The contact hole for the source/drain region in the logic area is not necessarily required to be formed at this time, but it may be formed in the logic area after a capacitor is formed as in the case of a conventional example. In both cases, the advantageous effects to be described later can be received.

Figure 8:
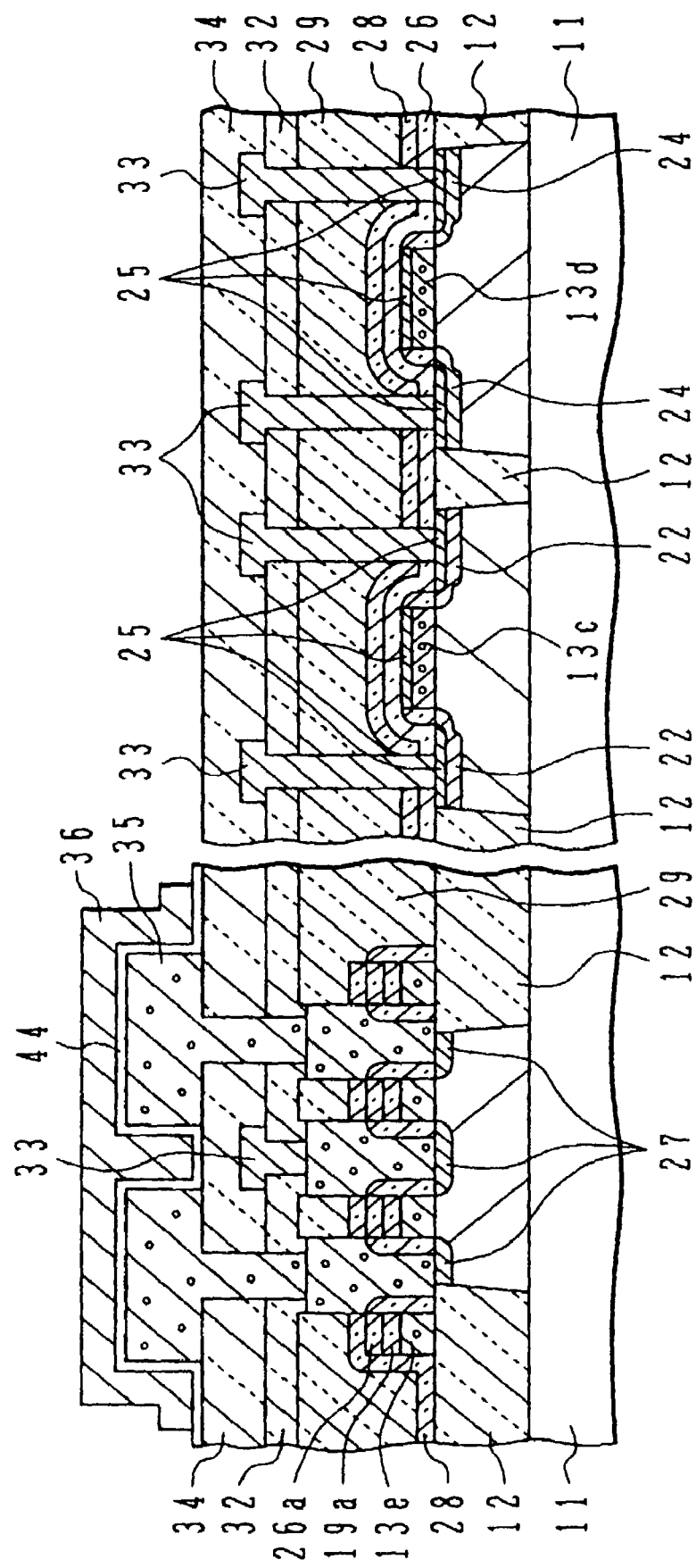

Next, as shown in FIG. 8, a BPSG layer 34 is formed to a thickness of 800 nm by CVD and the surface thereof is planarized. Thereafter, a contact hole for the storage electrode in the memory cell area is formed in the area corresponding to the silicon plug 31. Then, a silicon film doped with phosphorous is grown to a thickness of 1000 nm by CVD. This silicon film is patterned to form a storage electrode 35.

Next, a silicon nitride film is grown 5 nm thick and a wet oxidation process is performed for 30 minutes at 700E C to form a capacitor dielectric film 44. A silicon film doped with phosphorous is grown 1000 nm thick by CVD and patterned to form an opposing electrode 36.

Figure 9:
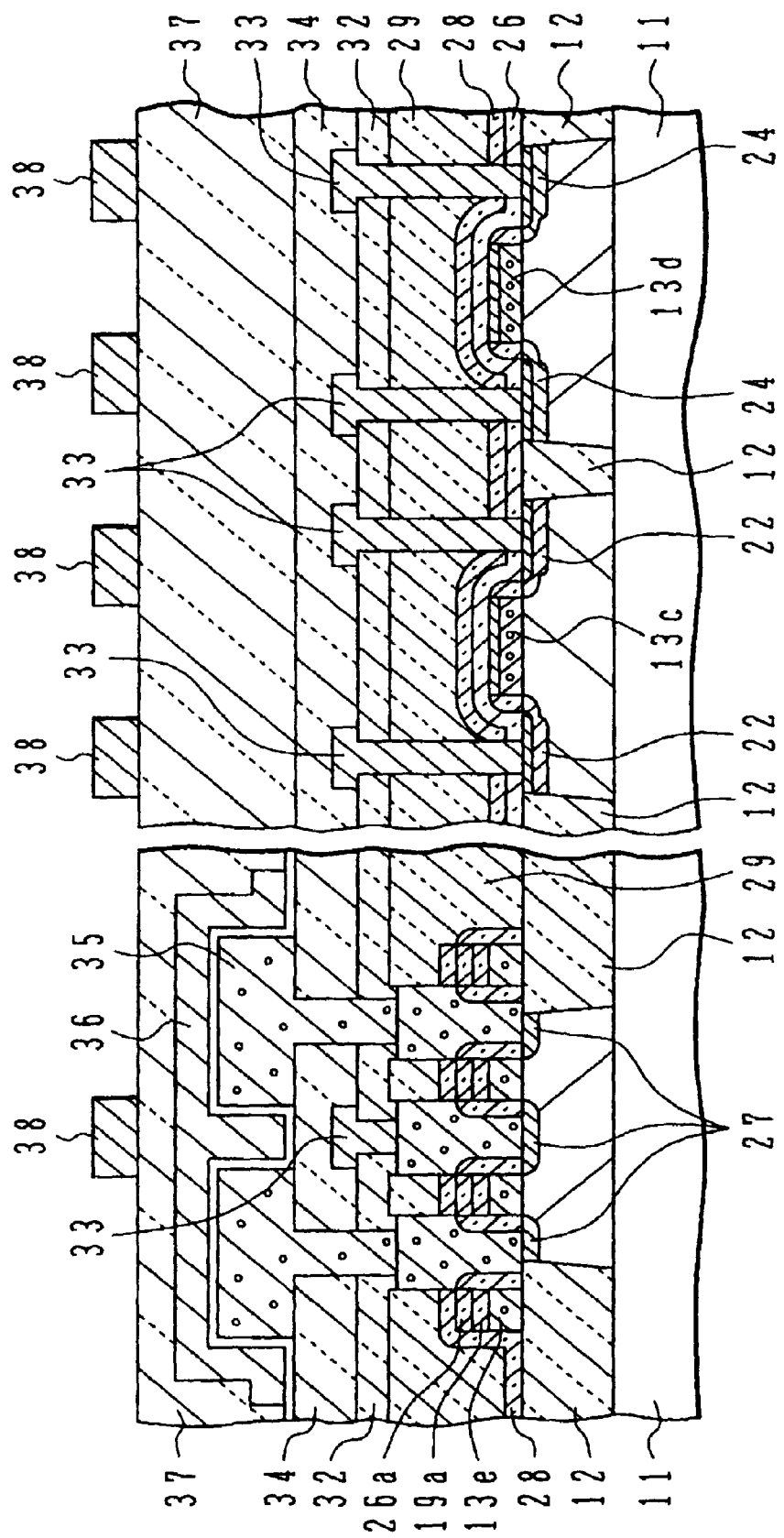

As shown in FIG. 9, a BPSG film 37 is grown 1500 nm thick, covering the capacitor, and planarized by CMP. Necessary contact holes are formed reaching the lower wiring layer made of the same layer as the source/drain and gate electrodes and bit line. After a 20 nm thick titanium layer and a 50 nm thick titanium nitride film are formed, a tungsten film is grown 1000 nm thick by CVD. The tungsten film is left only in the contact holes by CMP to form tungsten plugs. Then, a wiring layer 38 of Al or Al—Cu alloy is formed.

Lastly, a passivation film and bonding holes are formed by well-known methods to complete a logic-memory device.

In this embodiment, only nine processes are used from the process of doping the gate electrode in the cell area shown in FIG. 1(B) to the process of forming the contact holes in the memory area shown in FIG. 6. The number of processes can be reduced more than conventional techniques.

The surface of the suicide on the source/drain region is covered with the nitride film which is an oxidation-resistant film. It is therefore possible to prevent the silicide layer from being oxidized by an oxidizing atmosphere at a later process.

The same insulating film structure is used on the surfaces of the $p^+$-type impurity diffusion regions 22, $n^+$-type impurity diffusion regions 24 and gate electrodes 13c and 13d, respectively in the logic area. Therefore, the contact holes for these regions and electrodes can be formed at the same time. The insulating film structure on the surface of the gate electrode 13e (word line of DRAM) is thicker by the thickness of the silicon nitride side wall spacer 19a in the logic area. However, if the silicon nitride film on a partial area of the word line is removed and the silicon layer 13a is exposed in the process shown in FIG. 3(B), the insulating film structure on the word line can be made same as that in the logic area, as shown in the left area of FIG. 7. In this case, the same insulating film structure can be used for the source/drain and gate electrodes in the logic area and the contact portion of the DRAM word line, and the contact holes for these electrodes and portion can be formed at the same time.

The conventional problem that the substrate is etched will not occur even if the contact holes for the $p^+$-type impurity diffusion regions 22, $n^+$-type impurity diffusion regions 24 and gate electrodes 13c and 13d, respectively in the logic area, and the contact hole for the gate electrode 13e in the memory cell area are formed at the same time. In the embodiment, although the contact hole for the bit line in the memory cell area and the contact holes for the $p^+$-type impurity diffusion regions 22 and $n^+$-type impurity diffusion regions 24 as the source/drain regions in the logic area are formed at the same time, the contact hole to the gate electrode may be also formed at the same time. In this manner, the wiring layer can be formed in the logic area without increasing the number of masking processes. Irrespective of whether the wiring layer in the same layer as the bit line is formed in the logic area, the contact holes for the source/drain and gate electrodes in the logic area and the DRAM word line can be formed at the same time and the number of masking processes can be reduced, by following the processes shown in FIGS. 1(A) to 6.

In the first embodiment described above, the word line as the gate electrode in the memory cell area is made of a polysilicon single layer, which results in a disadvantage of a higher resistance than the polycide structure of conventional techniques. In order to ensure the same performance as a memory cell of the polycide structure of conventional techniques, it may be required to increase the number of decoders for driving word lines and reduce the number of memory cells per decoder, which results in a disadvantage of an increased chip area and high chip cost. In a memory-logic device, it is important to shorten the development time above all things. It can be expected that the disadvantage of an increased chip area can be compensated by the effects of shortened manufacture time by a reduction in the number of processes.

1st Modification of 1st Embodiment

In the first embodiment, tungsten common to the bit line which is the intermediate wiring layer is used as the wiring layer contacting the source/drain regions 22 and 24 in the logic area. Similar to conventional techniques, the source/drain regions 22 and 24 may be contacted to the uppermost Al wiring layer.

Figure 10:
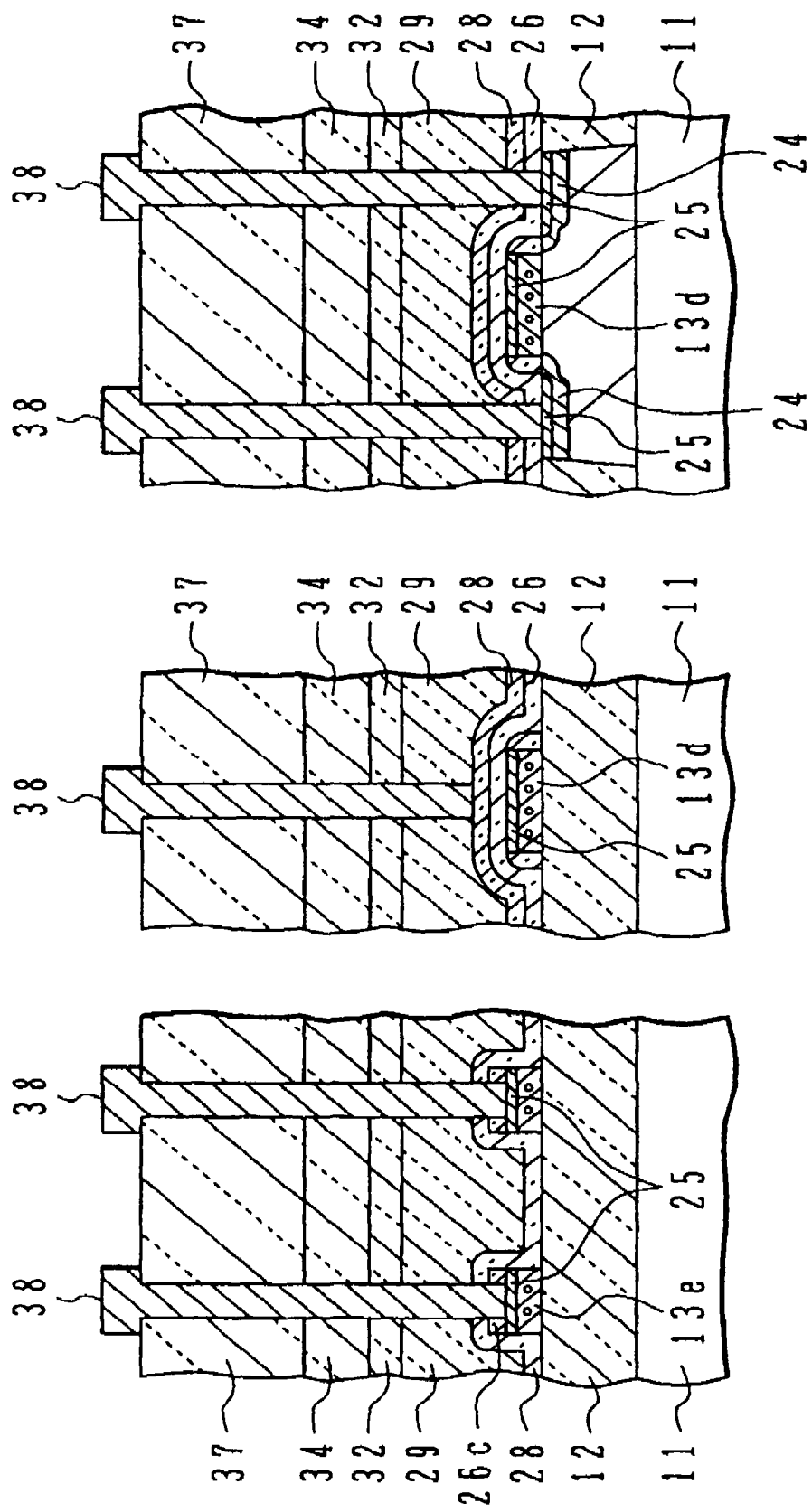
FIG. 10 is a schematic cross sectional view of a substrate illustrating manufacture processes according to a first modification of the first embodiment of the invention.
Figure 37:
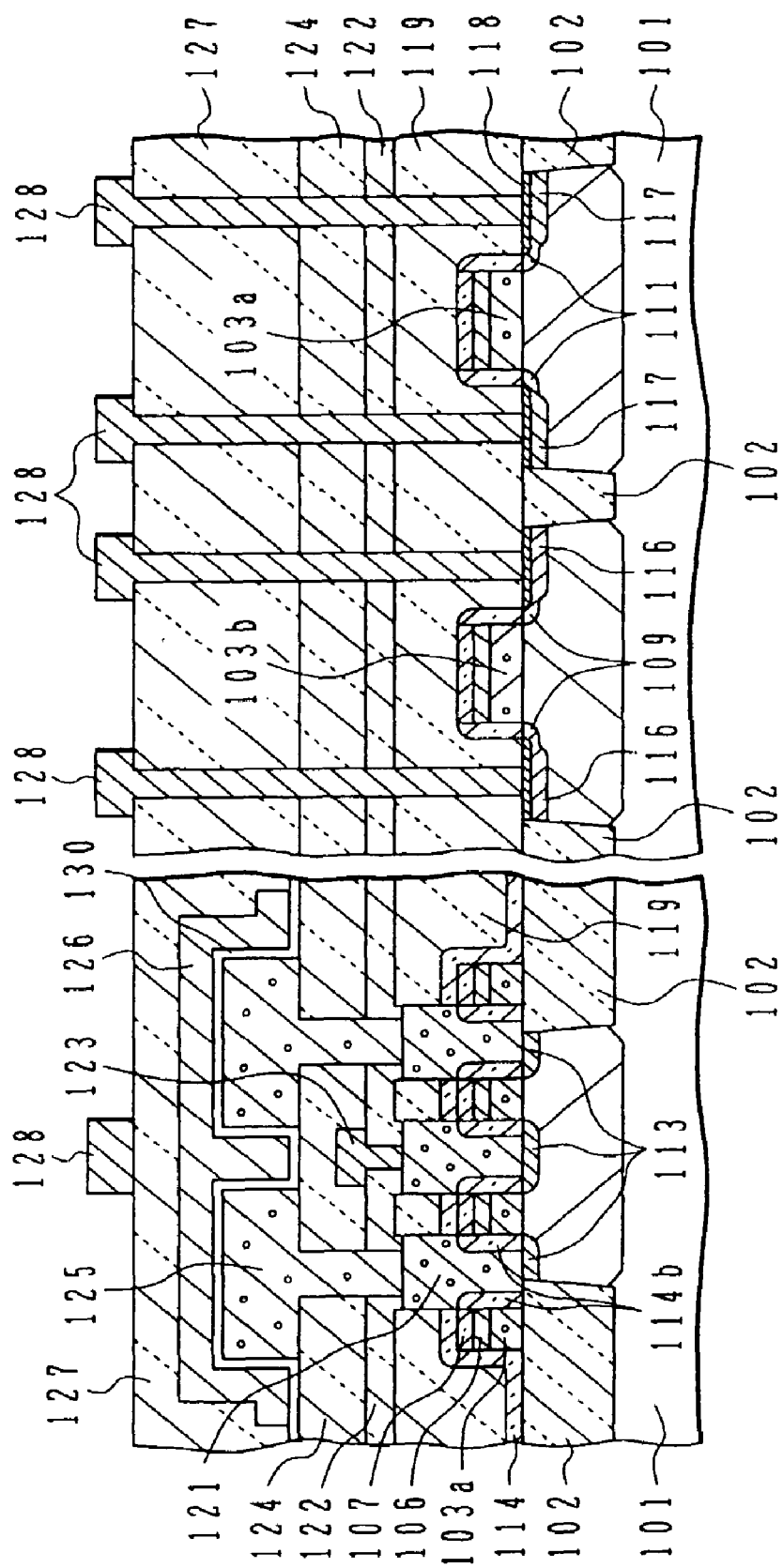
Figure 38:
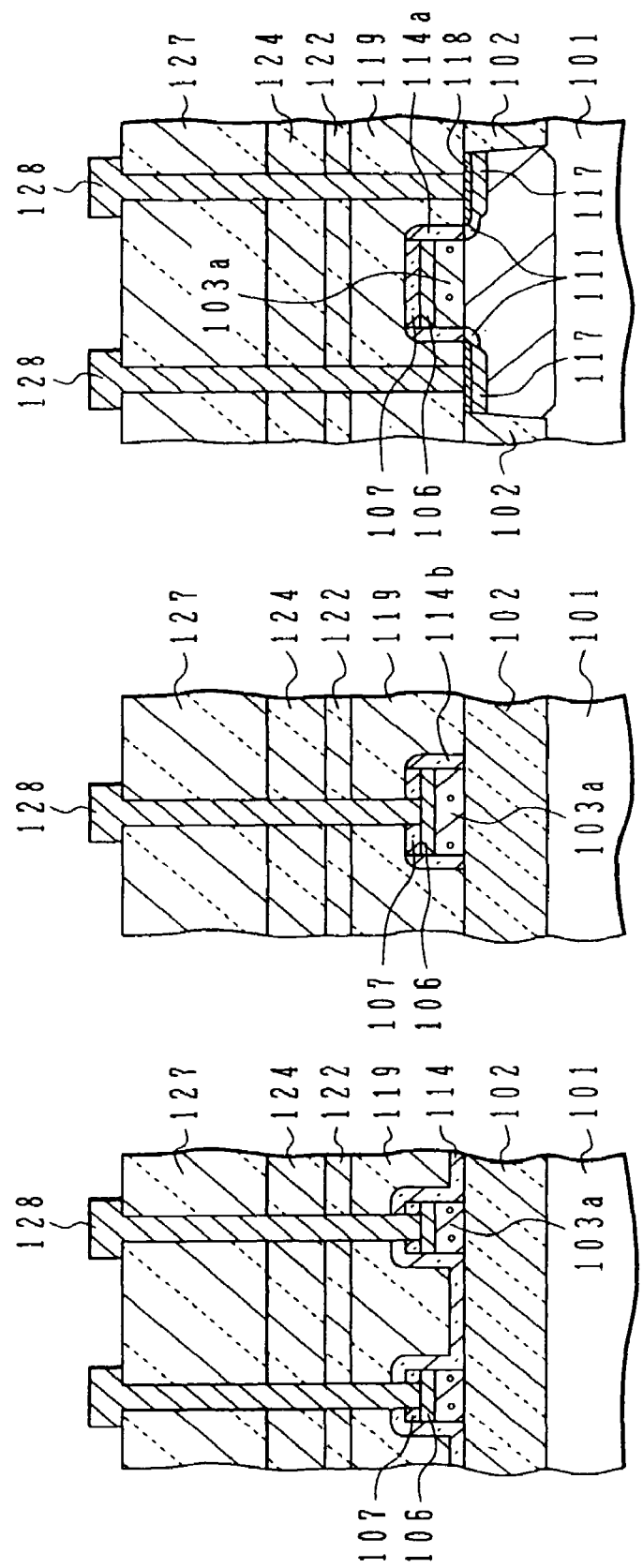
FIG. 38 is a schematic cross sectional view explaining problems associated with conventional techniques.

FIG. 10 is a cross sectional view corresponding to FIG. 37 illustrating conventional techniques and corresponding to FIG. 9 of the first embodiment. In FIG. 10, reference numerals identical to those shown in FIGS. 37 and 9 are used.

FIG. 10 shows the contact state between the source/drain regions 22 and 24 in the logic area and the uppermost Al wiring layer 33. In FIG. 10, the left area shows a contact portion between the gate electrode and Al wiring layer in the cell area, the center area shows a contact portion between the gate electrode and Al wiring in the logic area, and the right area shows a contact portion between the source/drain regions and Al wiring. The contact portion in the cell area corresponds, for example, to the contact portion between a strap word line of AL and the lower layer word line. In this modification, as described earlier, the silicon nitride film 19a is removed in the process shown in FIG. 3(B) to form a cobalt silicide layer also on the gate electrode 13e in the memory area.

As seen from FIG. 10, nitride films 26 and 28 are formed in the source/drain contact portion in the logic area. Since the nitride film is formed as the upper layer of the source/drain regions (n$^+$-type impurity diffusion regions) 24 and gate electrode 13d in the logic area and as the upper layer of the gate electrode 13e in the cell area, the substrate will not be etched by the contact hole as shown in FIG. 37 of conventional techniques. Namely, when each contact hole is formed, the BPSG film is etched by using the nitride film 28 as a stopper layer, and then the nitride film is etched. Therefore, the contact hole can be formed by one masking process without giving any damages to the substrate. The number of masking processes can also be reduced even for the contact with the Al wring layer.

2nd Modification of 1st Embodiment

Figure 11:
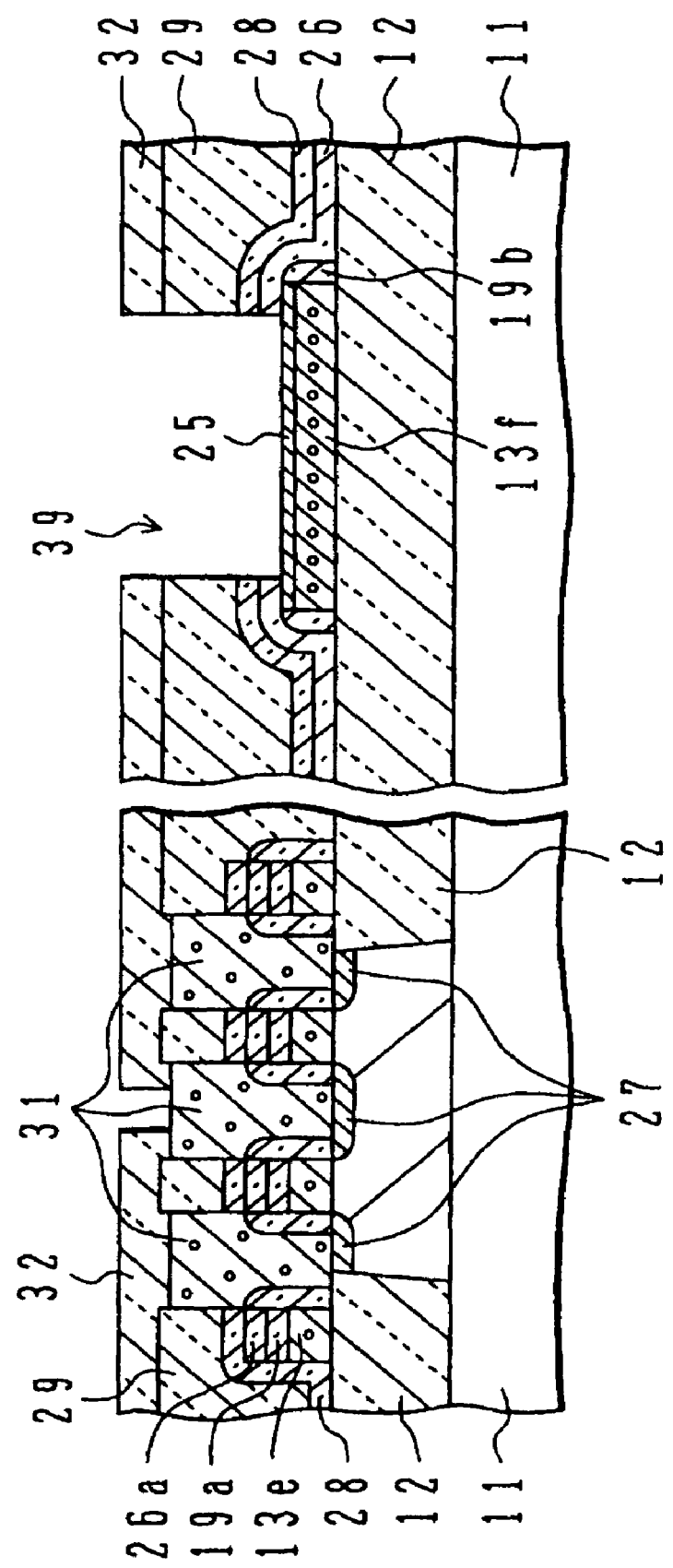
FIGS. 11 to 13 are schematic cross sectional views of a substrate illustrating manufacture processes according to a second modification of the first embodiment of the invention.
Figure 12:
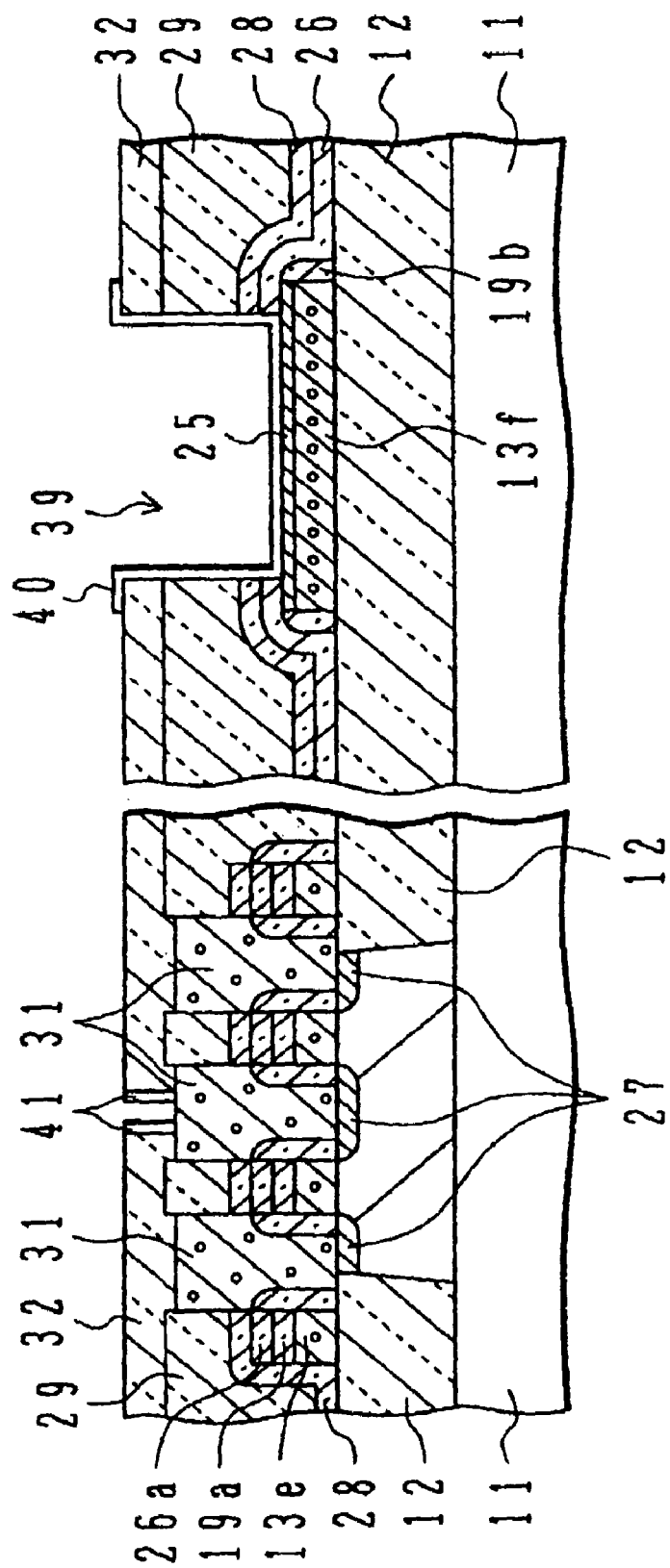
Figure 13:
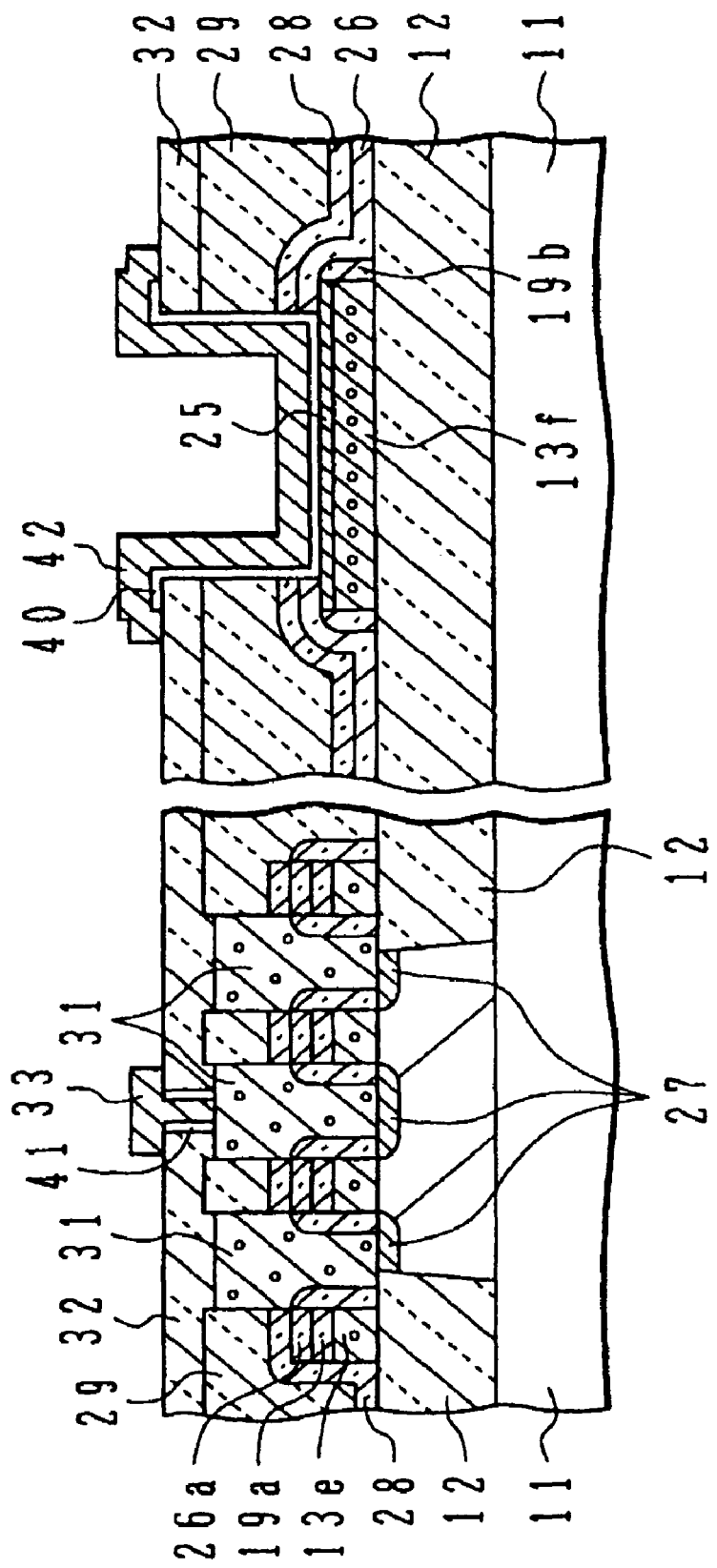

FIGS. 11 to 13 show the second modification of the first embodiment in which a capacitor for an analog circuit is formed in the logic area. In FIGS. 11 to 13, the right area shows a capacitor portion in the logic area and the left area shows the memory cell area.

FIG. 11 shows the state that contact holes are formed through a BPSG film 32 on the plugs 31 to be connected to the bit line, in the process shown in FIG. 7 of the first embodiment.

The lower electrode of a capacitor for the analog circuit is made of the silicon layer in the same layer of the gate electrode, and formed on the element isolation region 12. At the same time when the gate electrodes 13c and 13d in the logic area are patterned, the silicon layer 13 is patterned to form the lower electrode 13f. Thereafter, by performing the same process described with the first embodiment, a cobalt silicide layer 25 is formed on the lower electrode 13d, and a silicon nitride side wall spacer 19b is formed on the side wall of the lower electrode.

As the same time when the contact hole for the silicon plug 31 to be connected to the bit line is formed through the BPSG film 32 and the contact holes reaching the p$^+$-type impurity diffusion regions 22 and n$^+$-type impurity diffusion regions 24 are formed, an opening 39 is formed above the lower electrode 13f.

As shown in FIG. 12, a silicon nitride film is grown 50 nm thick by CVD, and is removed by well-known photolithography techniques to leave it on the silicide layer 25 in the opening 39, on the side wall of the opening 39, and on the upper external surface of the opening 39 to thereby form an analog capacitor dielectric film 40. In this case, if the silicon nitride film is removed by anisotropic etching, a nitride side wall spacer 41 can be formed on the side wall of a contact hole for the bit line or the like. It is therefore possible to substantially reduce the size of a contact hole, and to mitigate a margin of position alignment with the bit line silicon plug 31.

As shown in FIG. 13, a 20 nm thick titanium (Ti) layer and a 50 nm thick titanium nitride (TiN) layer are sequentially grown by sputtering, and then a 20 nm tungsten film is formed by CVD. Next, these layers are patterned by well-known photolithography techniques to form a wiring layer to be used as the bit line and logic wiring and an upper electrode 42 for the analog capacitor.

In the second modification of the first embodiment, as the patterning processes for the lower and upper electrodes, the patterning processes for the gate electrode and bit line can be used in common. An analog circuit capacitor can therefore be formed by adding one masking process of pattering the capacitor dielectric film.

A silicide film can be used as the surface layer of the lower electrode contacting the analog capacitor dielectric film, and a metal silicide film of tungsten or a metal film can be used as the upper electrode. A voltage dependency of a capacitor can be suppressed which appears when a silicon-based film is used.

Although the same layer as the gate electrode is used as the lower electrode, the diffusion layer of the source/drain region may be used as the lower electrode. If the source/drain region is used as the lower electrode, there arises a larger parasitic capacitance relative to the substrate than that when the gate electrode is used. As the upper electrode, the capacitor storage electrode of the memory cell may also be used.

2nd Embodiment

As shown in FIG. 14(A), similar to the first embodiment, an element isolation region 52 is formed on a silicon substrate 51 by using well-known shallow trench isolation techniques to separate active regions. Other necessary well and channel stopper layers and the like may be formed.

Next, as shown in FIG. 14(B), a gate oxide film Gox is formed on the active region by thermal oxidation, and then an amorphous silicon layer is deposited to a thickness of 150 nm. By using well-known photolithography techniques, the amorphous silicon layer is patterned to leave a silicon layer 53 on the whole surface of the memory cell area and a silicon layer to be used as gate electrodes 53a of p- and n-channel transistors in the logic area.

Thereafter, a 3 nm thick oxide film may be formed on the surfaces and side walls of the amorphous silicon layer 53 and gate electrodes 53a, through dry oxidation at 800EC.

As shown in FIG. 15(A), a resist pattern 54 is formed exposing the p-channel transistor area. By using this resist pattern 54 as a mask, boron ions are implanted under the conditions of an acceleration energy of 5 KeV and a dose of $3 \times 10^{14}$ cm$^{-2}$ to form LDD transistor low concentration diffusion regions (p$^-$-type impurity diffusion regions) 55 on both sides of the silicon layer 53a in the p-channel transistor area. The resist pattern 54 is thereafter removed.

As shown in FIG. 15(B), a resist pattern 56 is formed exposing the n-channel transistor area. By using this resist pattern 56 as a mask, arsenic (As) ions are implanted under the conditions of an acceleration energy of 10 KeV and a dose of $1 \times 10^{14}$ cm$^{-2}$ to form LDD transistor low concentration diffusion regions (n$^-$-type impurity diffusion regions) 57 on both sides of the gate electrode 53a in the n-channel transistor area.

As shown in FIG. 16(A), a silicon oxide film is grown to a thickness of 80 nm by CVD. Then, the silicon oxide film is anisotropically etched. The silicon oxide side wall spacers 58 are therefore formed on the side walls of the gate electrode 53a in the logic area. In this case, the silicon oxide film on the amorphous silicon layer 53 in the memory area is completely removed. As different from the first embodiment, in this embodiment the side wall spacers of the gate electrode in the logic area are made of the silicon oxide film.

Although not shown, the silicon oxide film is also formed on the side walls at the edges of the silicon layer 53 in the memory cell area. Therefore, if a dummy word line is formed in the peripheral area of the memory cell area, a side wall of the silicon oxide film is formed on one side wall of the dummy word line.

As shown in FIG. 16(B), a resist pattern 59 exposing the p-channel transistor area is formed. By using this resist pattern 59 as a mask, boron ions are implanted under the conditions of an acceleration energy of 5 KeV and a dose of $5 \times 10^{15}$ cm$^{-2}$ to form high concentration source/drain diffusion regions (p$^+$-type impurity diffusion regions) 60 in the p-channel transistor area. The resist pattern 59 is thereafter removed.

At this time, since boron ions are doped also into the gate electrode 53a, the gate electrode of the p-channel transistor becomes also a p-type silicon gate electrode 53b. Since the gate electrode and source/drain diffusion regions can be formed by one photolithography process, the number of processes can be reduced more than conventional techniques, similar to the first embodiment.

As shown in FIG. 17(A), after the resist pattern 59 is removed, a resist pattern 61 exposing the n-channel transistor area and memory cell area is formed. By using this resist pattern 61 as a mask, phosphorous ions are implanted under the conditions of an acceleration energy of 10 KeV and a dose of $4 \times 10^{15}$ cm$^{-2}$ to form high concentration source/drain diffusion regions (n$^+$-type impurity diffusion regions) 62 in the n-channel transistor area. At this time, since phosphorous ions are doped also into the gate electrode 53b in the n-channel transistor area and the silicon layer 53 in the memory cell area, the gate electrode becomes an n-type silicon gate electrode 53c of a high impurity concentration and the silicon layer becomes an n-type silicon layer 53d of a high impurity concentration. The resist pattern 61 is thereafter removed.

As shown in FIG. 17(B), a silicon oxide film is removed which was formed on the surface of the silicon layer 53d in the memory cell area and on the surfaces of the p$^+$-type impurity diffusion regions 60 and n$^+$-type impurity diffusion regions 62 as the source/drain regions, gate electrodes 53b and 53c and silicon layer 53d, respectively in the logic area.

Next, a cobalt (Co) layer of 10 nm in thickness and a titanium nitride (TiN) layer of 30 nm in thickness are sequentially deposited by sputtering. An RTA process is executed for 30 seconds at 500EC in a nitrogen atmosphere to react cobalt with silicon exposed on the surfaces of the source/drain regions, gate electrodes and silicon layer in the memory cell area to form cobalt silicide layers.

Next, the titanium nitride layer and an unreacted cobalt layer are removed by using aqua regia. The cobalt silicide layers 63 are therefore formed locally on the source/drain regions 60 and 62, gate electrodes 53b and 53c and n-type silicon layer 53d in the memory cell area.

Similar to the first embodiment, the silicide layers may be formed by using other metals such as titanium, tungsten, molybdenum and platinum.

As shown in FIG. 18(A), a silicon nitride film 64 is grown to a thickness of 20 nm by CVD in a CVD furnace of a load-lock type. The nitride film 64, silicide film 63 and silicon layer 53a in the cell area are selectively and sequentially etched and removed by well-known photolithography techniques to form a gate electrode pattern made of a lamination structure of a silicon layer 53e, silicide layer 63a and nitride film 64a. The silicon layer 53e of the gate electrode functions as the word line.

Next, after the side walls of the word line and the like are oxidized through heat treatment at 700EC in a dry oxidizing atmosphere, by using the silicon nitride film 64a as a mask, phosphorous ions are implanted under the conditions of an acceleration energy of 30 KeV and a dose of $3 \times 10^{13}$ cm$^{-2}$ to form the source/drain regions 65 in the memory cell area. At this time, since the logic area is covered with the silicon nitride film 64, neither the logic area is oxidized nor phosphorous ions are implanted. As described with the first embodiment, the side walls of the word line may not be oxidized.

As shown in FIG. 18(B), a silicon nitride film 60 is grown to a thickness of 60 nm by CVD, and then anisotropic etching is performed so that side wall spacers 66 of silicon nitride are formed on the side walls of the word line. Since the whole surface of the logic area is etched at this time, the silicon nitride film grown to a thickness of 60 nm is almost completely removed except the step portion, and the lower 20 nm thick silicon nitride film 64 is left. In FIG. 18(B), for the simplicity of the drawing, in the logic area the lower nitride film 64 and the etched residue are shown integrally.

Figure 19:
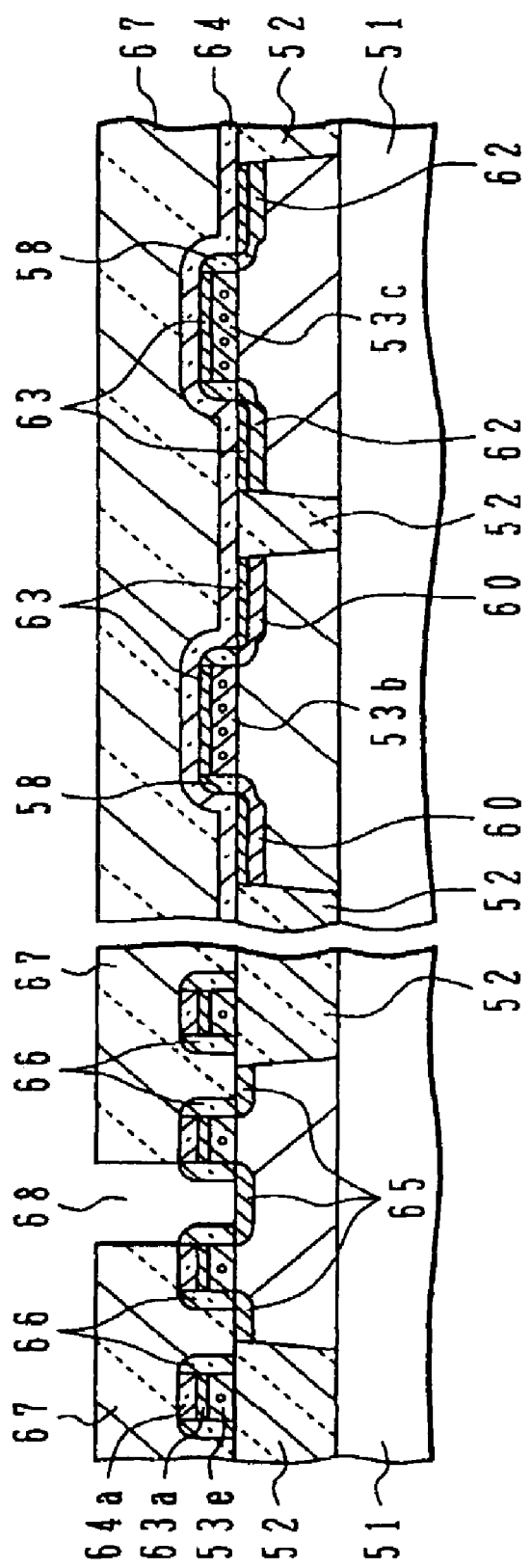

As shown in FIG. 19, a BPSG film 67 is formed to a thickness of 800 nm by CVD. The BPSG film 67 is polished by CMP to planarize the surface thereof. Next, the BPSG film 67 is selectively etched by well-known photolithography techniques to form a contact hole 68 in the area above the source/drain region 65 contacting the bit line in the memory cell area. In this case, similar to the first embodiment, the BPSG film 67 is etched under the condition that an etching selection ratio relative to the nitride film becomes sufficient. The contact hole 68 can be formed in self-alignment with the side wall spacers 66. Since the gate electrode 53e as the word line is covered with the silicon nitride film 64a and silicon nitride side wall spacers 66, there is a margin of position alignment of the contact hole to be formed through the BPSG film 67.

Figure 20:
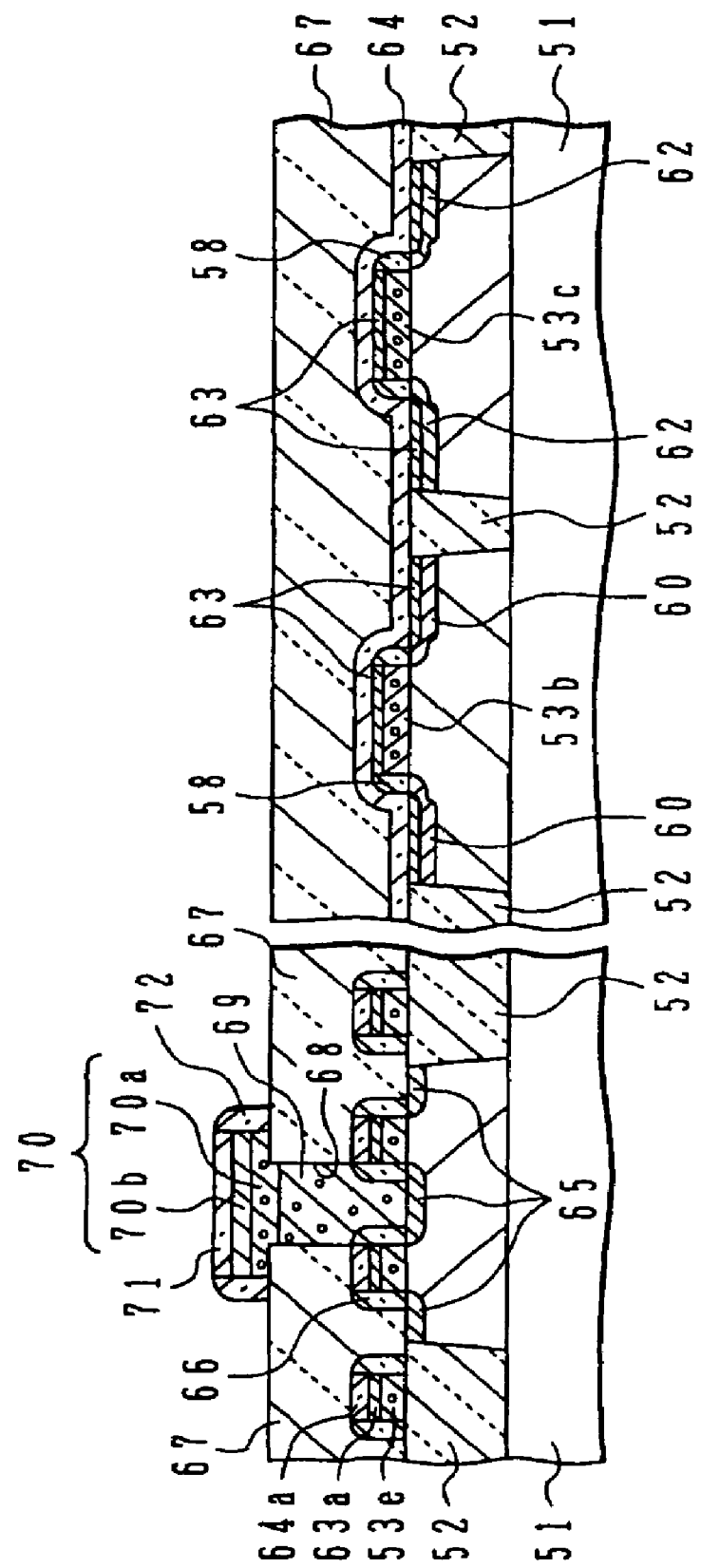

As shown in FIG. 20, after an amorphous silicon film doped with phosphorous is formed, this film is planarized by CMP or the like. The amorphous silicon film outside the contact holes 68 is removed and the amorphous silicon film is left only in the contact hole 68 to form a silicon plug 69.

Next, a BPSG film 70a doped with phosphorous is deposited 50 nm thick and a tungsten silicide (WSi) film 70b is deposited 100 nm thick by CVD to form a polycide layer. A silicon nitride film 71 is then deposited 100 nm thick. These films are patterned by well-known photolithography techniques to form a wiring layer (a polycide layer 70 having the upper silicon nitride film 71) as the bit line. The polycide layer 70 is electrically connected to the n-type impurity diffusion region 65 as the source/drain region in the memory cell area via the silicon plug 69 in the contact hole 68. In this embodiment, although the polycide structure is used, tungsten may be used similar to the first embodiment.

Next, a silicon nitride film is formed to a thickness of 80 nm by CVD and anisotropically etched. Silicon side wall spacers 72 are therefore formed on the side walls of the lamination structure of the polycide layer 70 and silicon nitride film 71.

Figure 21:
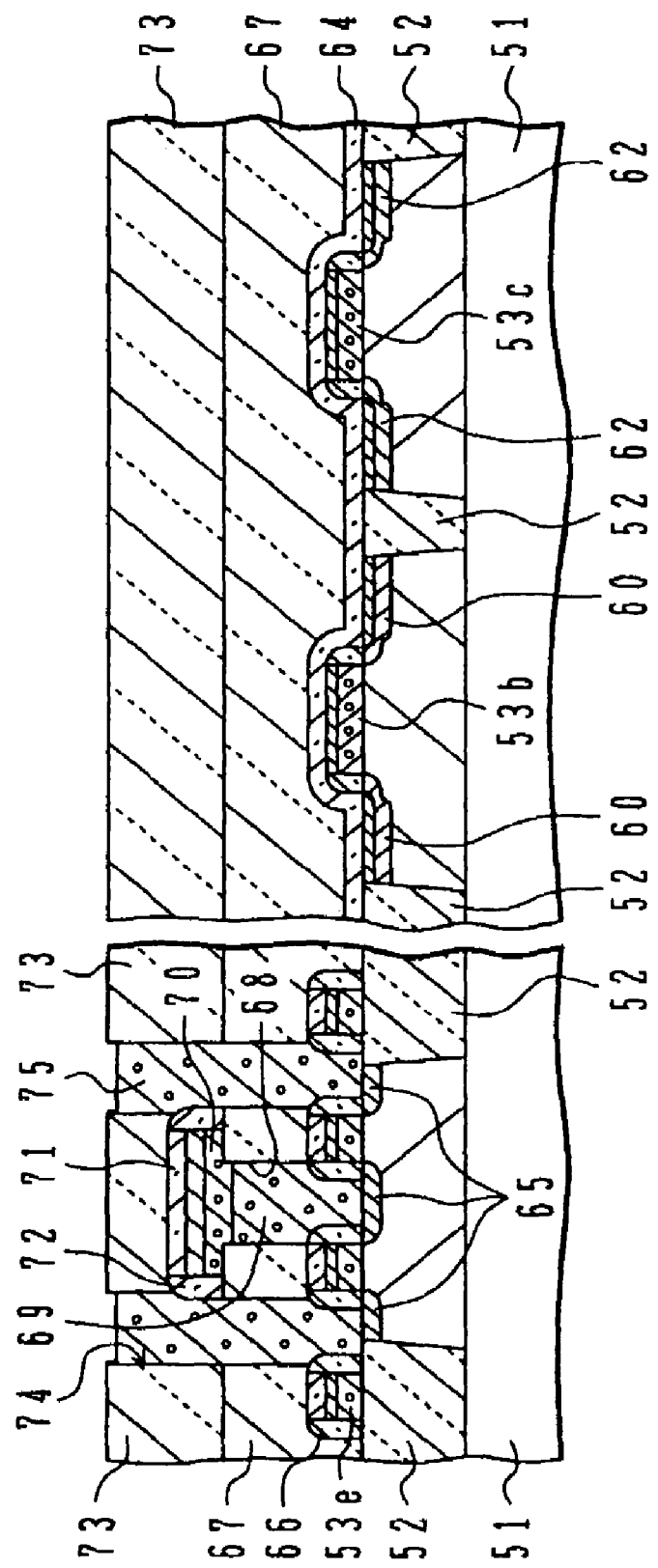

As shown in FIG. 21, a BPSG layer 73 is formed to a thickness of 800 nm by CVD and the surface thereof is planarized by CMP or the like. Thereafter, contact holes 74 for connecting storage electrodes and the source/drain regions 65 in the memory cell are formed. At this time, the BPSG film 73 is etched under the condition that an etching selection ratio relative to the nitride film is sufficient. The BPSG film 73 and underlying BPSG film 67 are therefore etched in self-alignment with the nitride side wall 72, and the contact holes reaching the n-type impurity diffusion regions 65 as the source/drain regions in the memory cell area can be formed in self-alignment with the silicon nitride side wall 66 of the word line.

Next, by using the process similar to that of forming the contact plug 69 for the bit line, an amorphous silicon film doped with phosphorous is formed and planarized by CMP or the like to remove the silicon film outside of the contact holes and leave the silicon film in the contact holes 74 to form silicon contact plugs 75.

Since the polycide layer 70 as the bit line is covered with the silicon nitride film 71 and silicon nitride side wall spacers 72, the contact holes 74 can be formed with a sufficient margin of position alignment.

Figure 22:
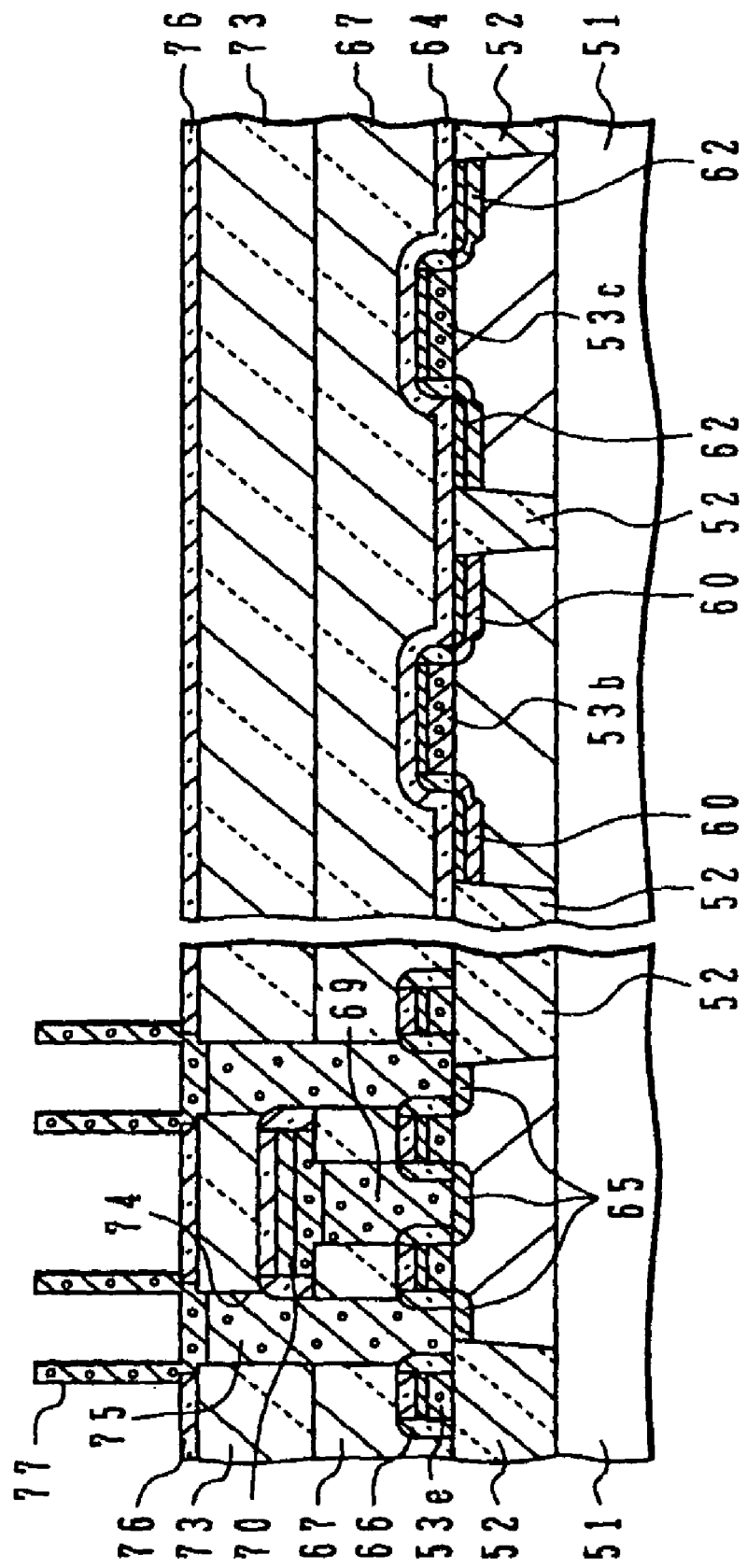

As shown in FIG. 22 in an opening formed through a silicon nitride film 76, cylinder type storage electrodes 77 are formed which are electrically connected via the silicon plugs 75 to the source/drain regions (n-type impurity diffusion regions) 65. For example, the storage electrode is formed in the following manner.

After the silicon nitride film 76 is formed to a thickness of 50 nm, a BPSG film is formed to a thickness of 1000 nm. The BPSG film and silicon nitride film 76 are selectively etched and removed to form contact holes slightly larger than the contact holes 74 in the areas above the silicon plugs 75.

Next, an amorphous silicon layer doped with n-type impurities and to be used as the storage electrode is formed on the bottom and side surface of the contact hole and on the BPSG film to a thickness of 50 nm. The amorphous silicon layer formed on the BPSG film is removed by CMP or the like, and the BPSG film is etched and removed by using solution which contains fluoric acid. In this case, the silicon layer is not etched, and only the BPSG film is selectively removed because the silicon nitride film 76 has a lower etching rate than the BPSG film relative to fluoric acid. The storage electrode structure such as shown in FIG. 22 can therefore be formed.

Figure 23:
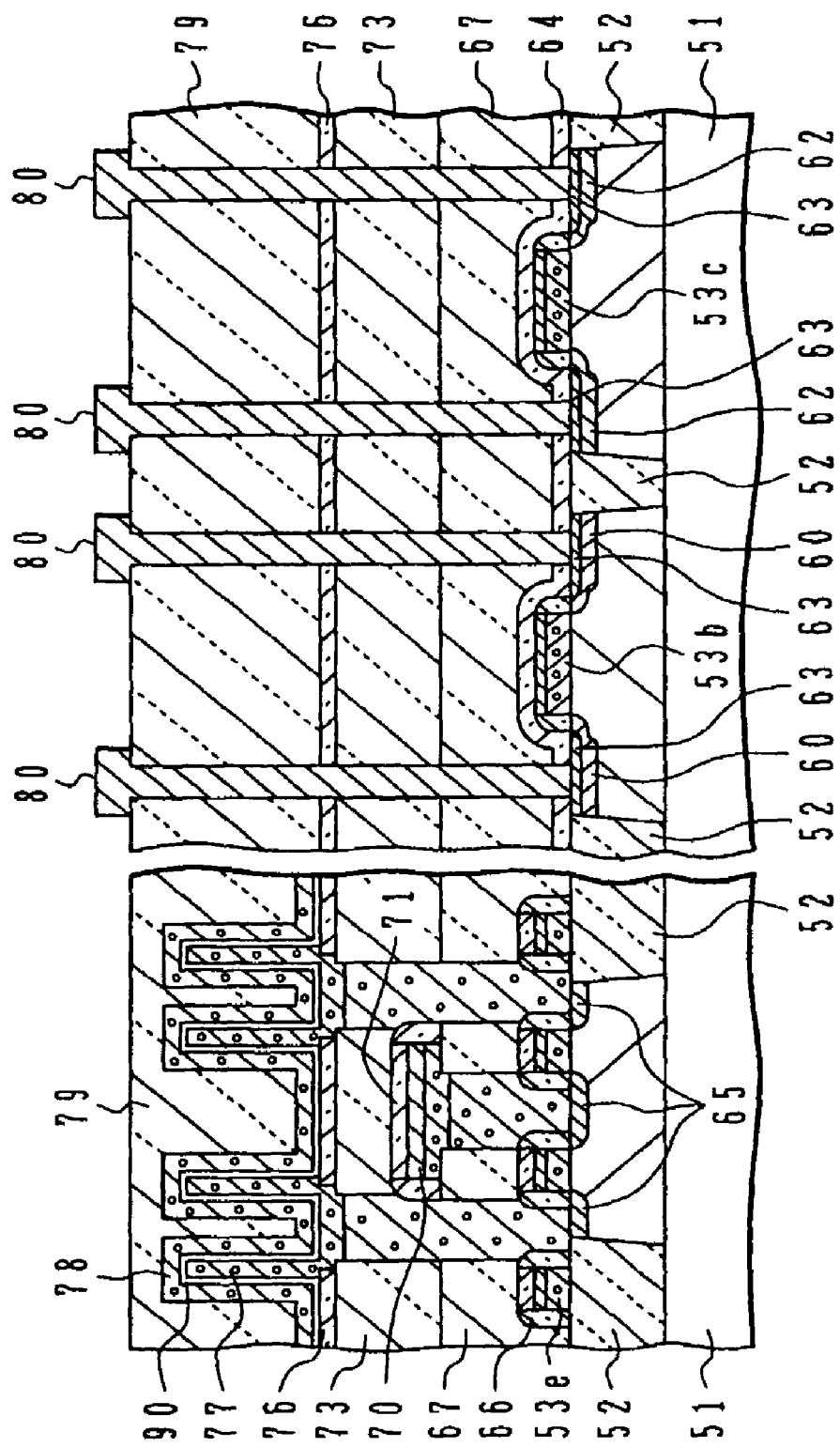

As shown in FIG. 23, next, a silicon nitride film is grown 5 nm thick and a wet oxidation process is performed for 30 minutes at 700EC to form a capacitor dielectric film 90. A silicon film doped with phosphorous is grown 100 nm thick by CVD and patterned to form an opposing electrode 78. While the doped silicon film is patterned to the opposing electrode 78, the exposed silicon nitride film 76 is also etched and removed. In this embodiment, although a capacitor structure having the cylinder type storage electrode is used, the structure same as the first embodiment may also be used or the capacitor structure having the storage electrode of this embodiment may be applied to the first embodiment.

Next, a BPSG film 79 is grown 1500 nm thick, covering the capacitor, and planarized by CMP. Contact holes are formed reaching the lower conductive layer. After a 20 nm thick titanium layer and a 50 nm thick titanium nitride film are formed, a tungsten film is grown 1000 nm thick by CVD. The tungsten film is left only in the contact holes by CMP to form tungsten plugs 91. Then, a wiring layer 80 of Al or Al—Cu alloy is formed.

Lastly, a passivation film and bonding holes are formed by well-known methods to complete a logic-memory device.

In this embodiment, only seven photolithography processes are used from the process of forming the gate electrode in the logic area shown in FIG. 14(B) to the process of forming the contact hole for the bit line in the memory cell area shown in FIG. 19. The number of processes can be reduced considerably more than conventional techniques.

Since the gate electrode of the word line in the memory cell area can be silicified, it is not necessary to increase the number of decoders for driving word lines because of an increased resistance as in the first embodiment.

Similar to the first embodiment, the surface of the silicide on the source/drain region is covered with the nitride film which is an oxidation-resistant film. It is therefore possible to prevent the silicide layer from being oxidized in an oxidizing atmosphere at a later process.

In this embodiment, the same insulating film structure is used on the surfaces of the source/drain and gate electrodes in the logic area and on the surface of the gate electrode (word line of DRAM) in the cell area. Therefore, the contact holes for these regions and electrodes can be formed at the same time and the number of masking processes can be reduced.

The side wall spacers on the side walls of the gate electrode in the logic area are made of silicon oxide. Therefore, adverse effects can be avoided such as the deteriorated characteristics to be caused by hot carriers generated from silicon nitride side wall spacers, a change in the threshold value (Vth) of a transistor to be caused by boron ions implanted into the gate electrode of a p-channel transistor and entered the gate insulating film.

1st Modification of 2nd Embodiment

Figure 24:
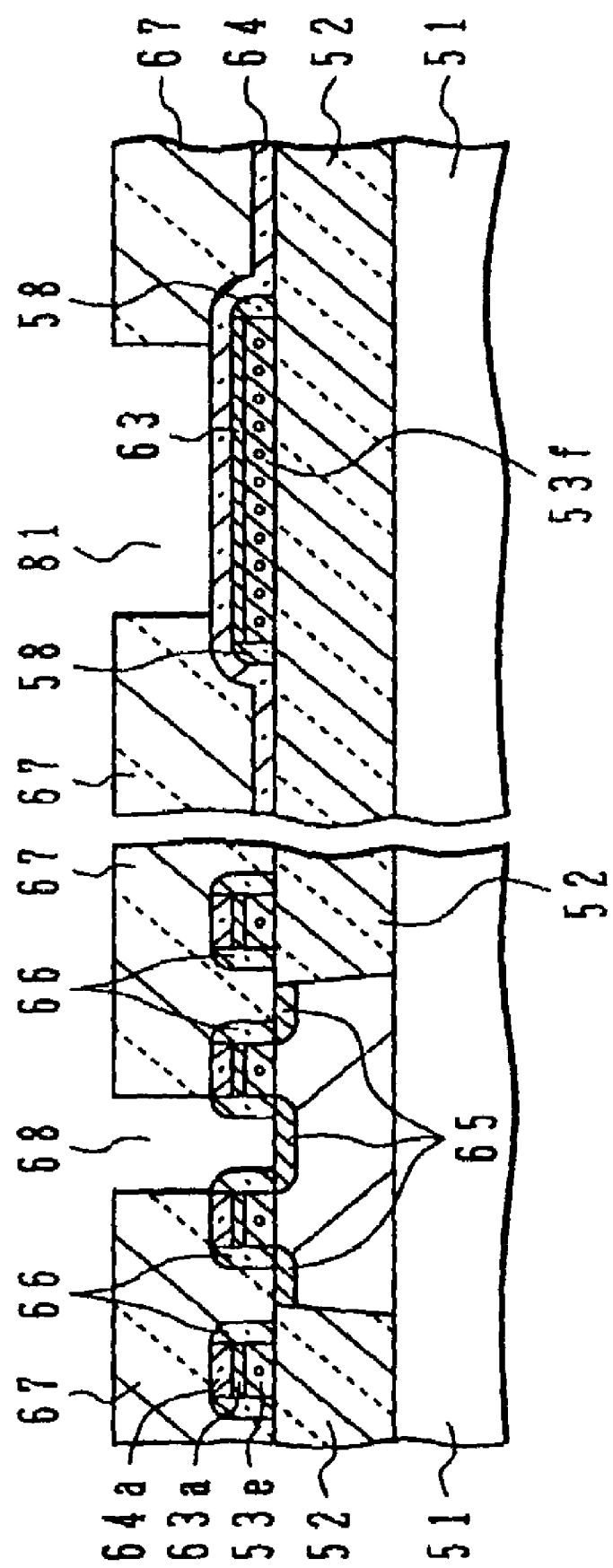
FIGS. 24 and 25 are schematic cross sectional views of a substrate illustrating manufacture processes according to a first modification of the second embodiment of the invention.
Figure 25:
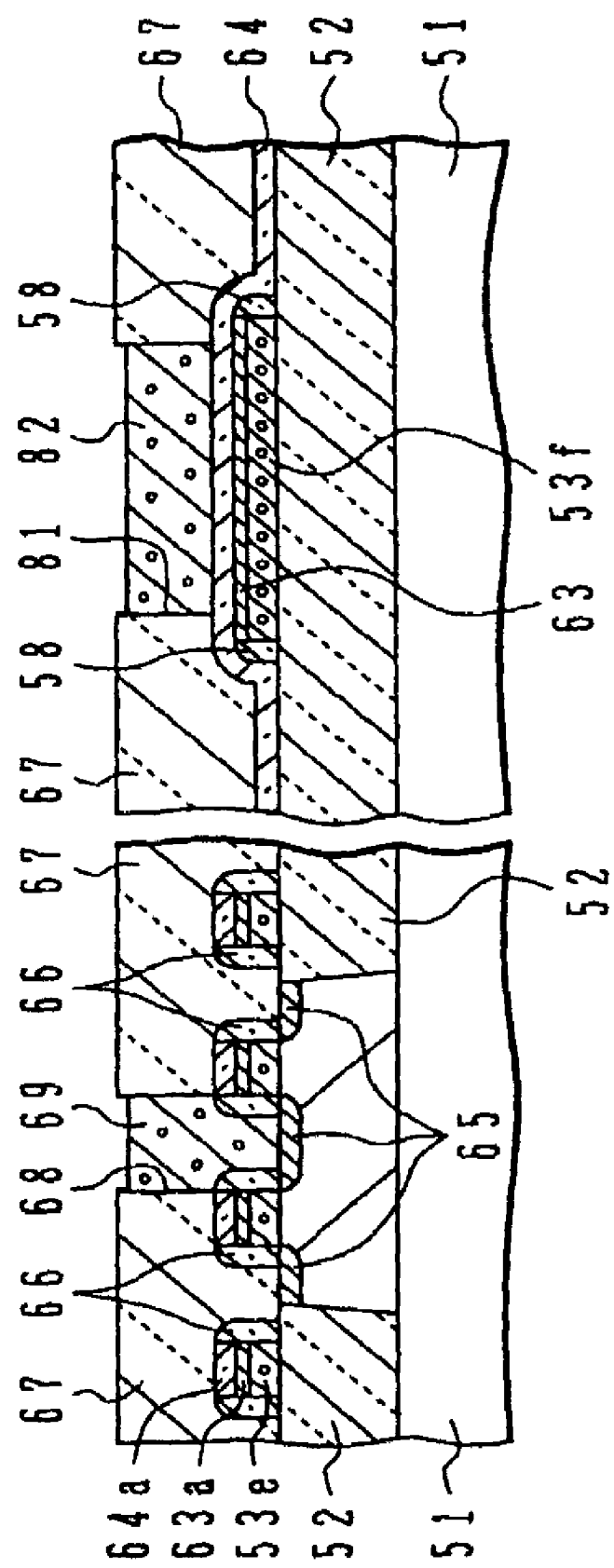

FIGS. 24 and 25 show the first modification of the second embodiment. Similar to the second modification of the first embodiment, a capacitor for an analog circuit is formed in the logic area. In FIGS. 24 and 25, the right area shows a capacitor portion in the logic area and the left area shows the memory cell area.

The process shown in FIG. 24 is similar to that shown in FIG. 19 of the second embodiment. FIG. 24 shows the state of the device formed by the processes of the second embodiment from FIG. 14A to FIG. 19 and thereafter formed with a contact hole 68 for the n-type impurity diffusion region 65 as the source/drain region to be electrically connected to the bit line.

The lower electrode of the analog capacitor is made of silicon in the same layer as the gate electrode and formed on the element isolation region 52. This lower electrode 53*f* is formed by patterning the silicon layer 53 at the same time when gate electrodes 53*b* and 53*c* in the logic area are patterned. Thereafter, by performing the processes similar to the second embodiment, silicon oxide side wall spacers 58 are formed on the side walls of the lower electrode 53*f* and a cobalt silicide film 63 and the like are formed on the lower electrode 53*f.*

At the same time when the contact hole 68 for contacting the bit line is formed through the BPSG film 67, an opening 81 is formed above the lower electrode 53*f*.

Next, as shown in FIG. 25, an amorphous silicon film doped with phosphorous is formed and planarized by CMP or the like to remove the silicon film outside the contact hole and leave the silicon film in the contact hole 68 and opening 81 to form silicon plugs. The silicon plug left in the opening 81 becomes an upper electrode 82 of the analog capacitor.

In the modification of the second embodiment, the lower electrode can be patterned at the same time when the gate electrode in the logic area is patterned. As the capacitor dielectric film, the silicon nitride film for SAC in the memory cell area can be used at it is. The upper electrode can be formed at the same time when the bit line contact plug is formed. It is therefore possible to form an analog capacitor without increasing the number of processes at all.

In this modification, the lower electrode 53*f* may be patterned not at the same time as the gate electrodes 53*b* and 53*c* in the logic area, but at the same time when the gate electrode 53*e* in the memory cell area is patterned.

Also in this modification, not only the gate electrode but also the diffusion region as the source/drain region can be used as the lower electrode.

2nd Modification of 2nd Embodiment

Figure 26:
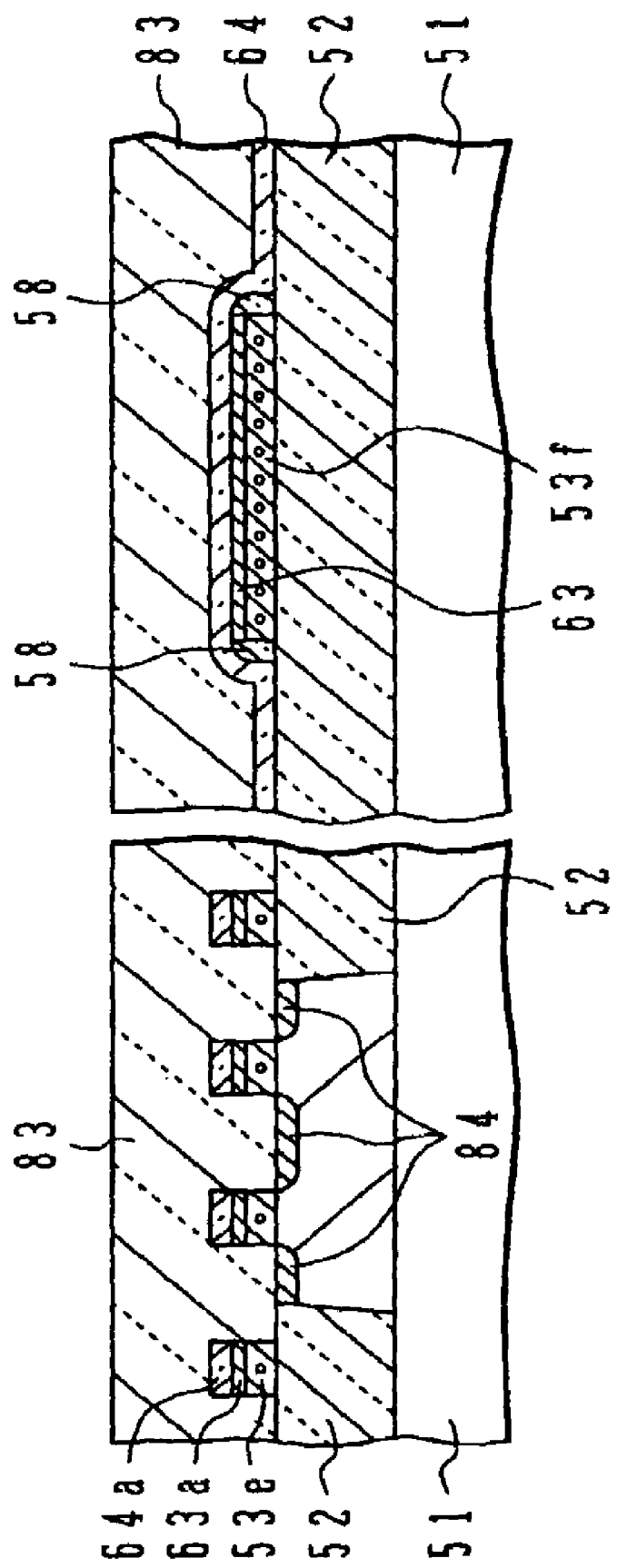
FIGS. 26 to 28 are schematic cross sectional views of a substrate illustrating manufacture processes according to a second modification of the second embodiment of the invention.
Figure 27:
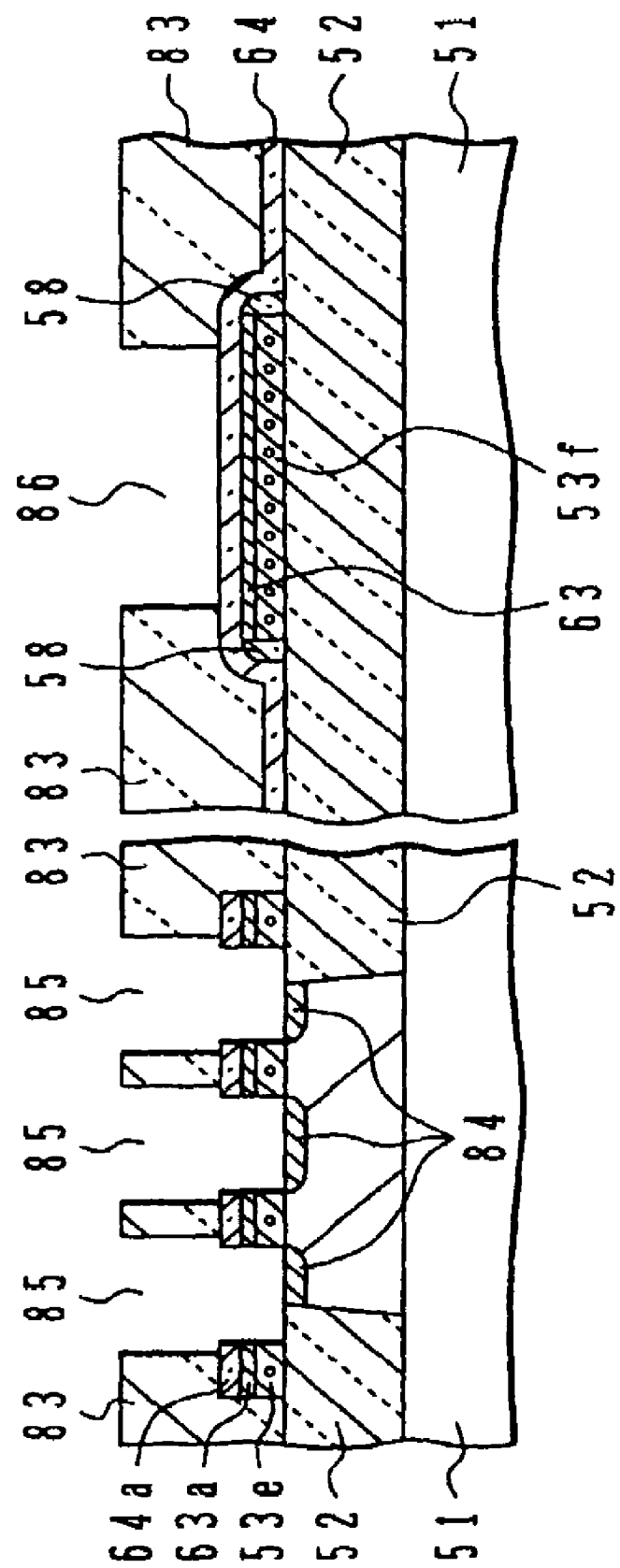
Figure 28:
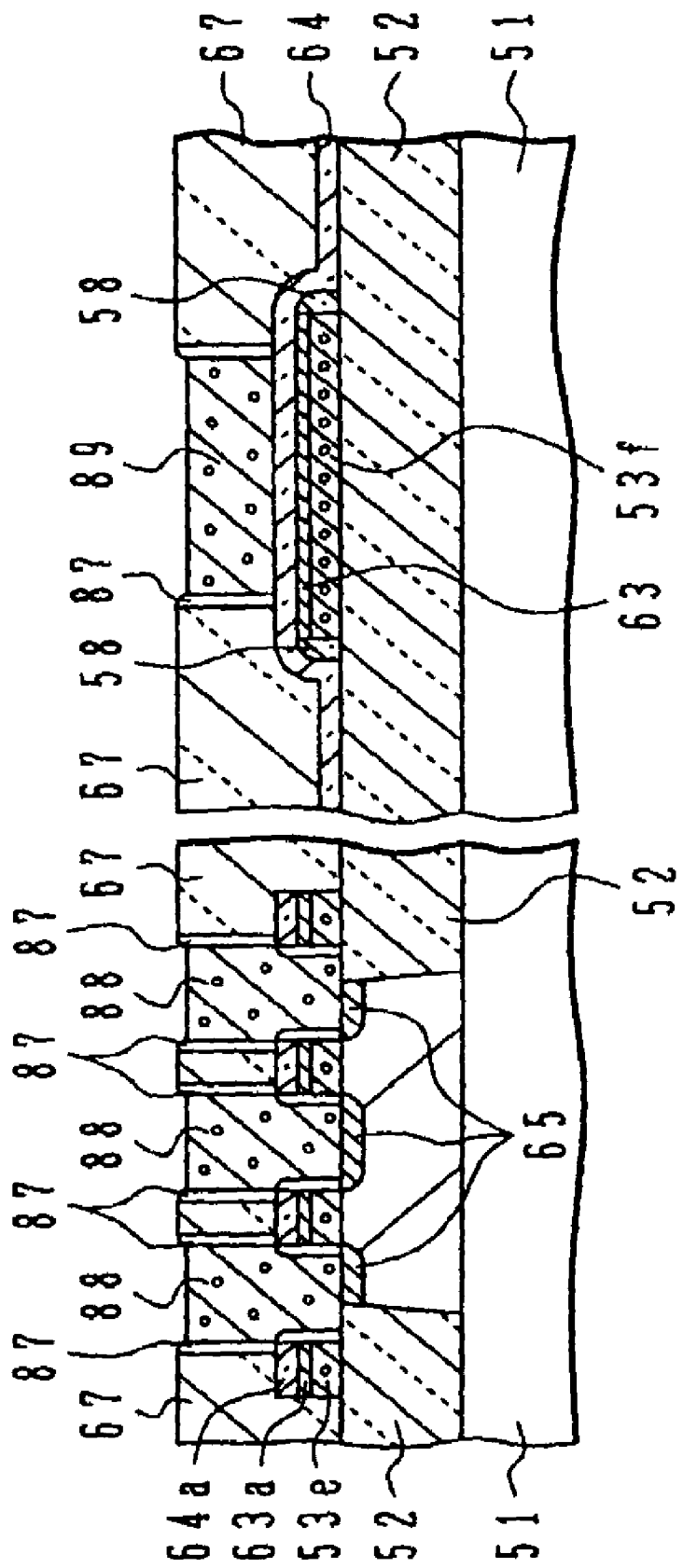
Figure 29A:
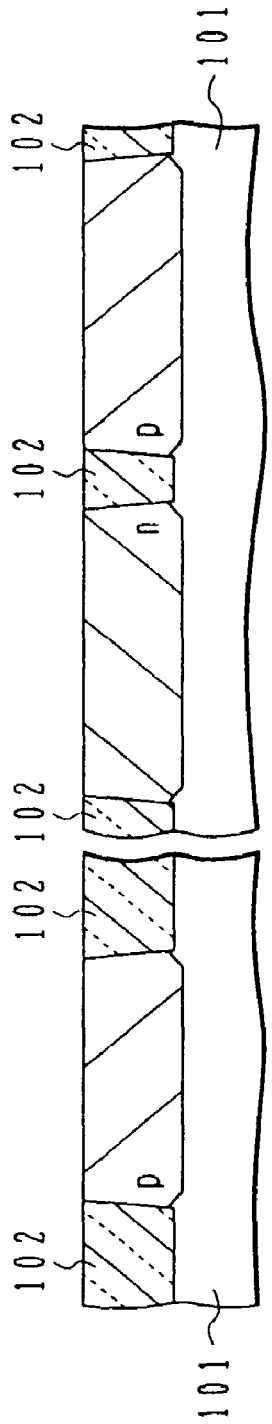
Figure 29B:
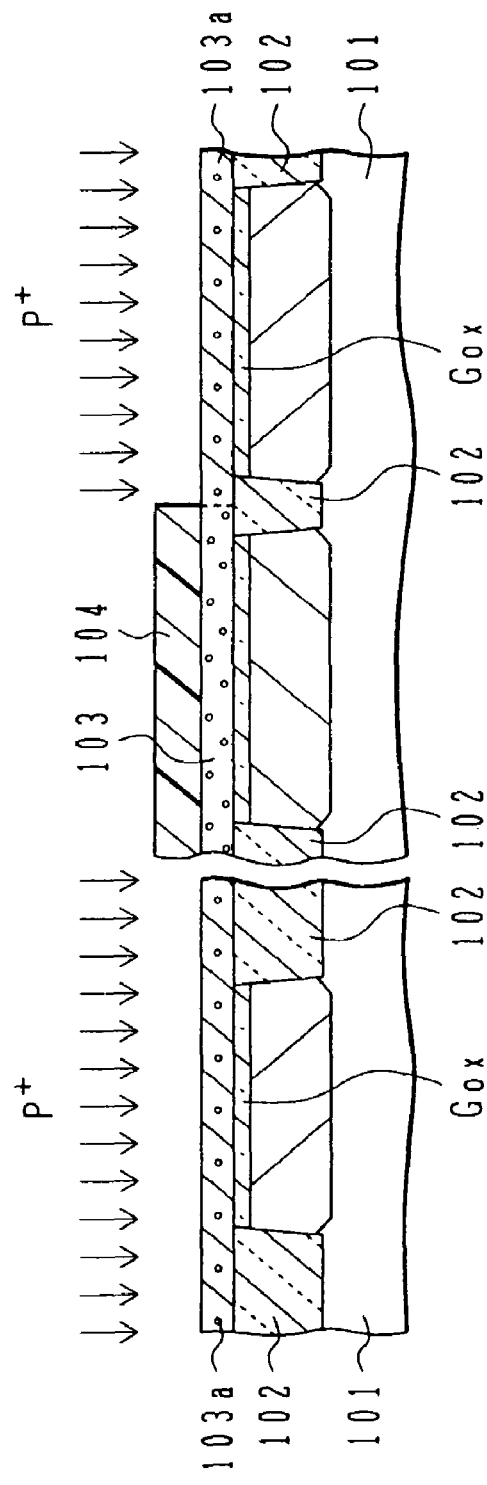
Figure 30A:
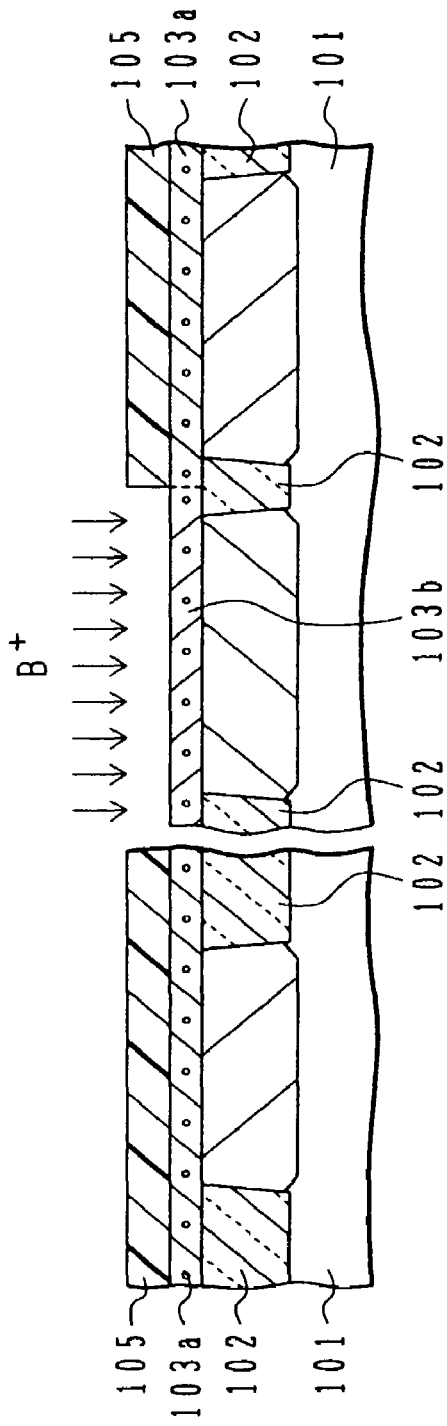
Figure 30B:
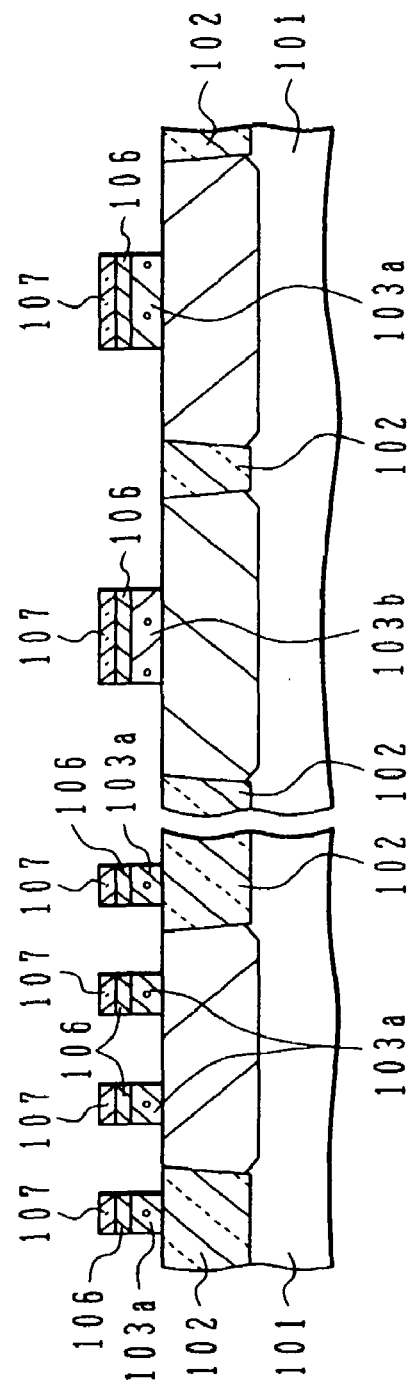
Figure 33:
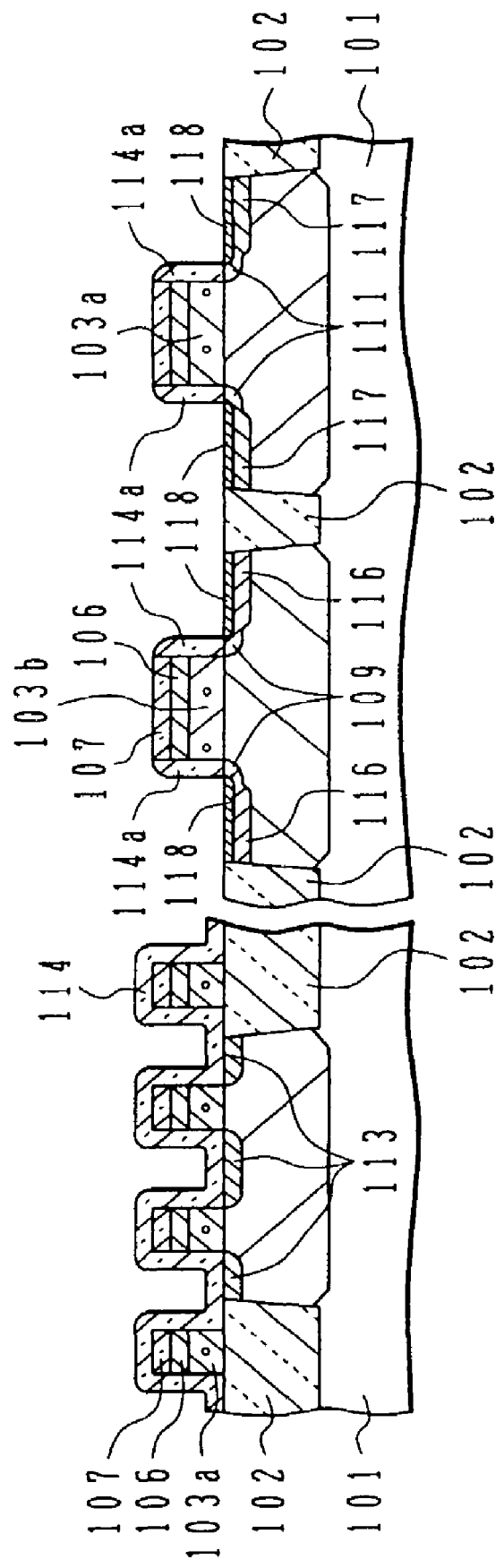
Figure 34:
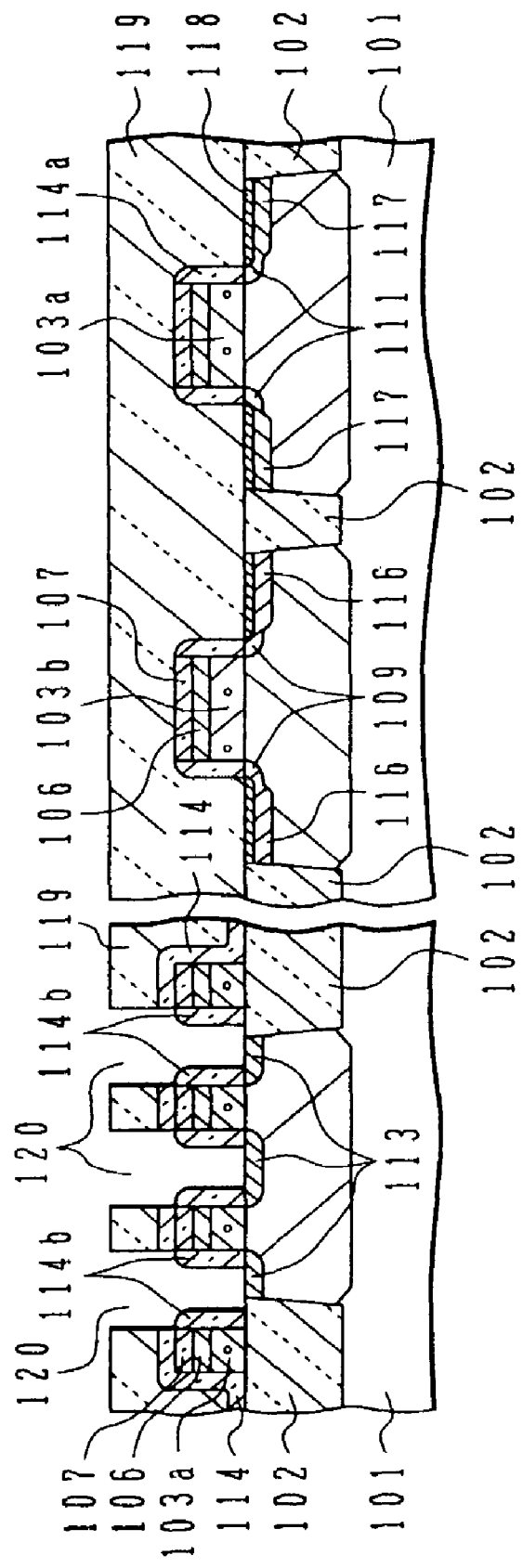
Figure 35:
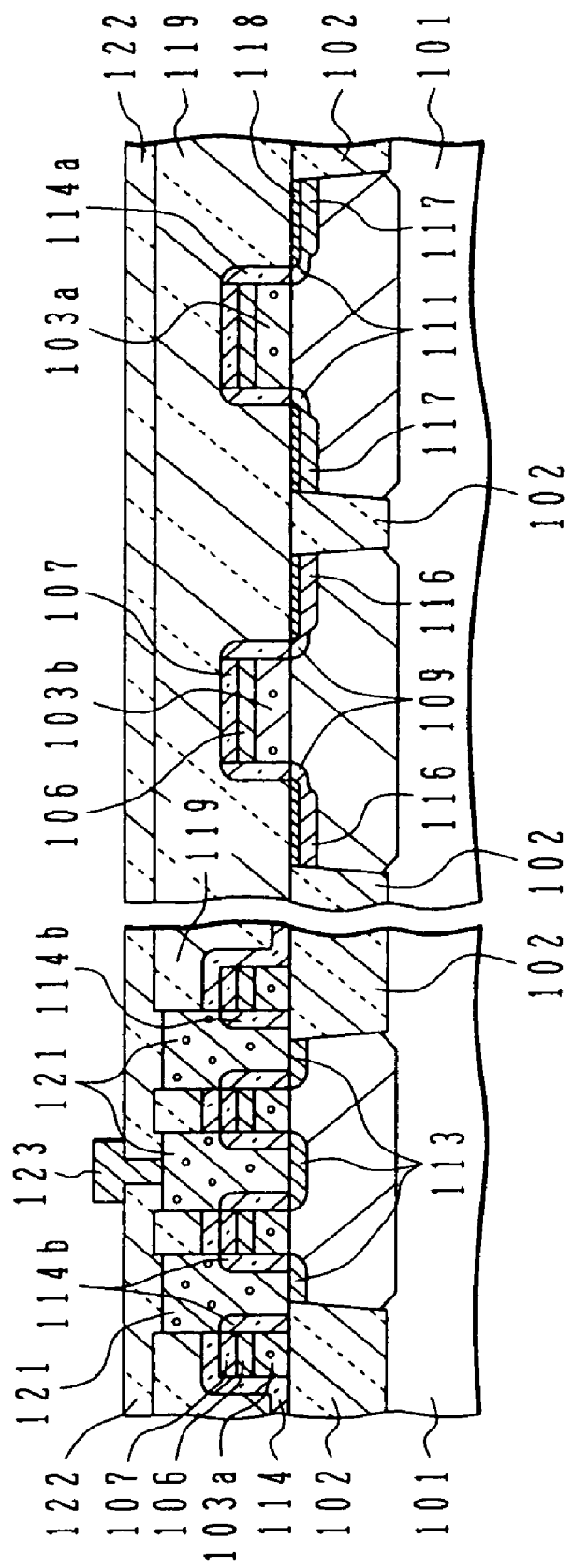
Figure 36:
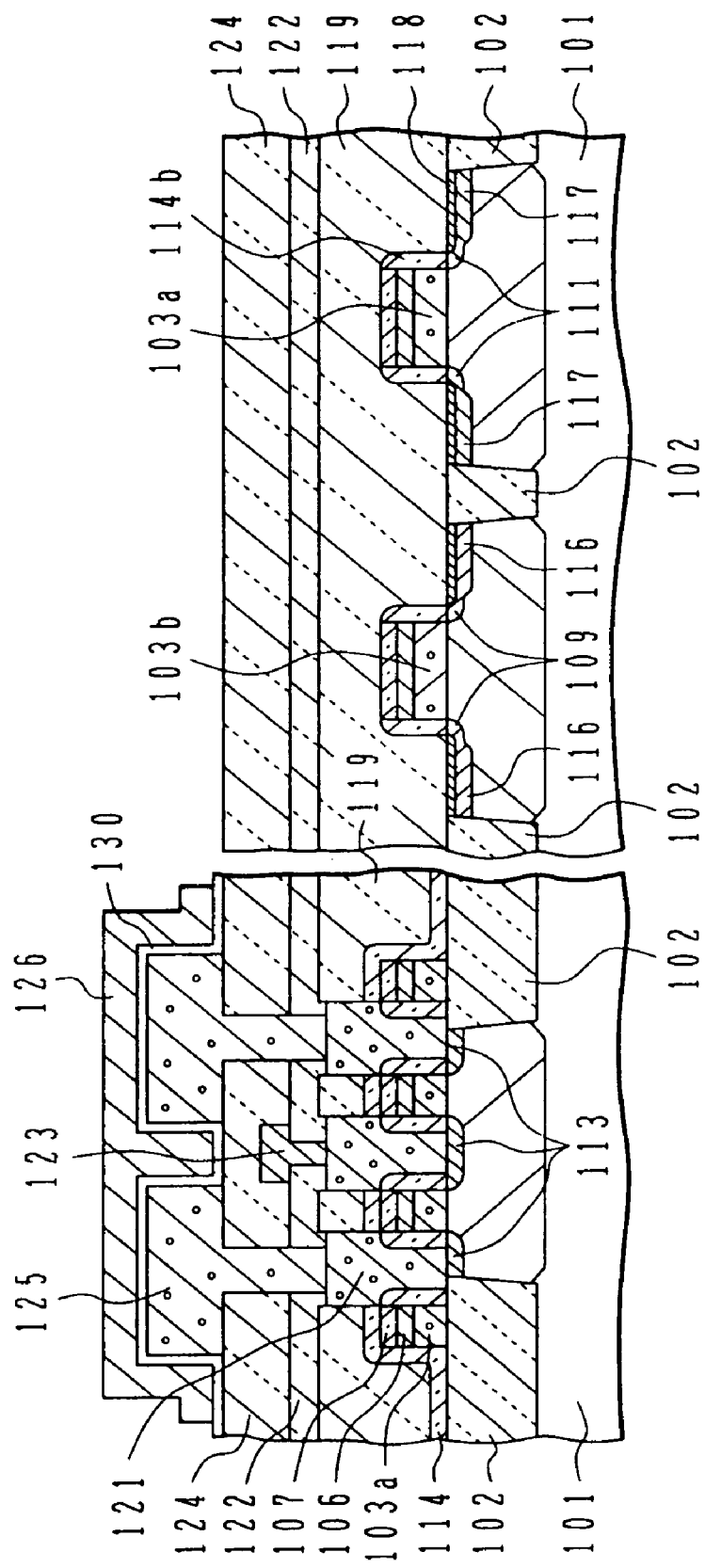

FIGS. 26 to 28 show the second modification of the second embodiment. This modification also relates to an analog capacitor. In FIGS. 26 to 28, the right area shows a capacitor portion in the logic area and the left area shows the memory cell area.

By the processes similar to those described with FIGS. 14(A) to 18(A), an electrode pattern as a word line is formed in the memory cell area. Similar to the first modification, the lower electrode 53*f* of an analog capacitor is formed at the same time when the gate electrode pattern is formed in the logic area.

As shown in FIG. 26, a BPSG layer 83 is formed and planarized by CMP. Thereafter, a proper heat treatment is executed to dope phosphorous in the BPSG layer 83 into a silicon substrate 51 to form source/drain regions 84 in the memory cess area. By optimizing a heat treatment in a later process, it is possible to form the source/drain diffusion regions (n-type impurity diffusion regions) 84 doped with n-type impurities having a desired concentration at a desired depth.

As shown in FIG. 27, contact holes 85 and an opening 86 are formed in the areas corresponding to the n-type impurity diffusion regions 84 as the source/drain regions and the lower electrode 53*f* of the analog capacitor. In this case, by properly selecting the etching conditions, it is possible not to leave the BPSG film on the side walls of the electrode pattern in the memory cell area. If necessary, the BPSG film may be removed by using HF containing etchant. The surface of the capacitor lower electrode 53*f* is covered with the silicon nitride film 64 so that it is hardly etched.

As shown in FIG. 28, a silicon nitride film is formed 100 nm thick and anisotropically etched to form silicon nitride side wall spacers 87 in the contact holes 85 and opening 86. A thermal oxidation may be performed before the silicon nitride film is formed. In this case, it is possible to prevent a lower dielectric breakdown voltage of the gate oxide film at the edges of the gate electrodes (word lines) 53*e* in the cell area.

Next, an amorphous silicon film doped with phosphorous is formed and planarized by CMP or the like to remove the silicon film outside the contact holes and leave the silicon film in the contact holes 85 and opening 86 to form silicon plugs.

The silicon plug left in the cell areas becomes contact plugs 88, and the silicon plug left in the opening 86 becomes an upper electrode 89 of the analog capacitor.

The contact plug 88 of silicon and the silicon electrode 53*e* of the word line will not be electrically shorted because of the presence of the silicon nitride side wall spacers 87.

Also in this modification. the lower electrode can be patterned at the same time when the gate electrode in the logic area is patterned. As the capacitor dielectric film, the silicon nitride film for SAC in the memory cell area can be used at it is. The upper electrode can be formed at the same time when the bit line contact plug is formed. It is therefore possible to form an analog capacitor without increasing the number of processes at all.

In the first modification, the nitride film 64 on the lower electrode is etched in some cases when the side wall spacers 66 as the word line are formed in the memory cell area. In the second modification, the nitride film will not be etched so that the film thickness can be stabilized and the capacitor can be formed with good reproductivity.

In this modification, although the source/drain regions in the memory cell area are formed through doping from the BPSG film, they may be formed by ion implantation similar to other embodiments. In this case, in order to prevent doping from the BPSG film, an undoped silicon oxide film may be formed, for example, to a thickness of about 20 nm, prior to growing the BPSG film.

3rd Embodiment

FIGS. 39(A) to 46 are cross sectional views of a semiconductor substrate illustrating the third embodiment of the invention.

As shown in FIG. 39(A), element isolation regions are formed in a p-type silicon substrate 201 by well-known shallow trench isolation (STI). Namely, first, element isolation trenches are formed through etching, and then insulating material such as silicon oxide is buried in the trenches and the surface of the insulating material is planarized by CMP or the like to form the element isolation regions 202. Instead of STI, element isolation regions may be formed by local oxidation of silicon (LOCOS). A silicon oxide film 204 is formed on the surface of the substrate other than the element isolation regions 202.

The left area in FIGS. 39(A) to 47 is a logic circuit area LOGIC in which logic circuits using complementary MIS transistors are formed, and the right area is a memory cell area MC in which memory cells are formed.

As shown in FIG. 39(B), a resist pattern PR1 covering the logic circuit area is formed. By using this resist pattern PR1 as a mask, ions are implanted into the memory cell area at a high acceleration energy to form an n-type buried well W1. The resist pattern PR1 is thereafter removed.

As shown in FIG. 39(C), a resist pattern PR2 is formed covering the memory area and an n-channel transistor area of the logic circuit area. By using this resist pattern PR2 as a mask, n-type impurity ions are implanted into a p-channel transistor area in the logic circuit area to form an n-type well W2. Ions for controlling the threshold value of the p-channel transistor to be formed in the n-type well W2 are also implanted. The resist pattern PR2 is thereafter removed.

Figure 40A:
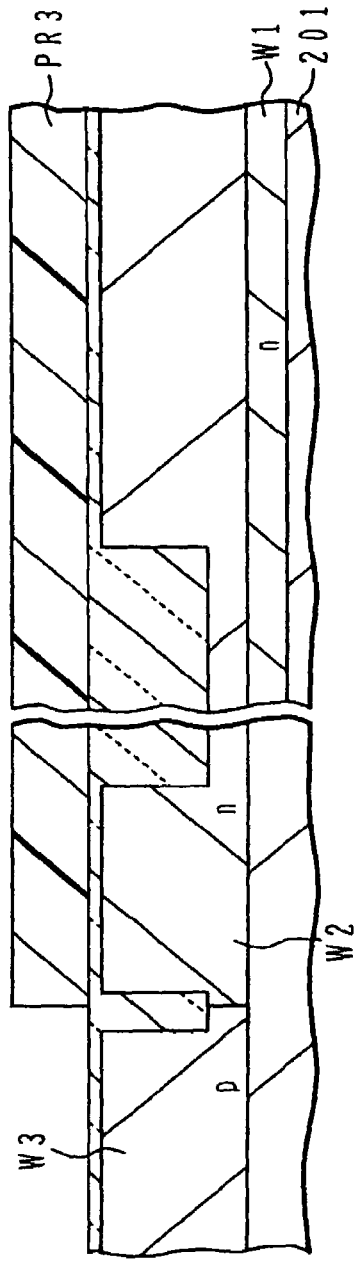

As shown in FIG. 40(A), a resist pattern PR3 is formed covering the memory area and the n-channel transistor area of the logic circuit area. By using this resist pattern PR3 as a mask, p-type impurity ions are implanted into the n-channel transistor area in the logic circuit area to form a p-type well W3. Ions for controlling the threshold value of the n-channel transistor are also implanted. The resist pattern PR3 is thereafter removed. The above processes are similar to conventional techniques.

Figure 40B:
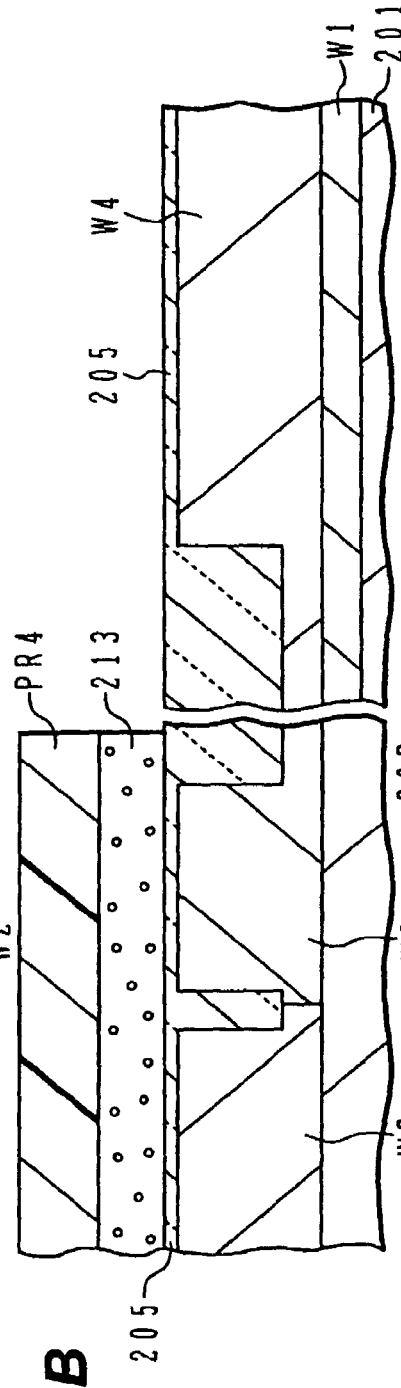

As shown in FIG. 40(B), a polysilicon layer not containing impurities (non-doped) is deposited to a thickness of 180 nm on the whole surface of the p-type silicon substrate 201, by CVD at a substrate temperature of 620EC. On this silicon layer 213, a resist pattern PR4 covering the logic circuit area is formed. By using this resist pattern PR4 as a mask, the polysilicon layer 213 in the memory cell area is removed.

By using also the same resist pattern PR4 as a mask, p-type impurity ions are implanted into the memory cell area to form a p-type well W4. Ions are also implanted to adjust the threshold value of a transistor in the memory cell area. The same mask PR4 is used in common for the two processes of patterning the polysilicon layer and implanting ions. The resist pattern PR4 is thereafter removed.

Figure 40C:
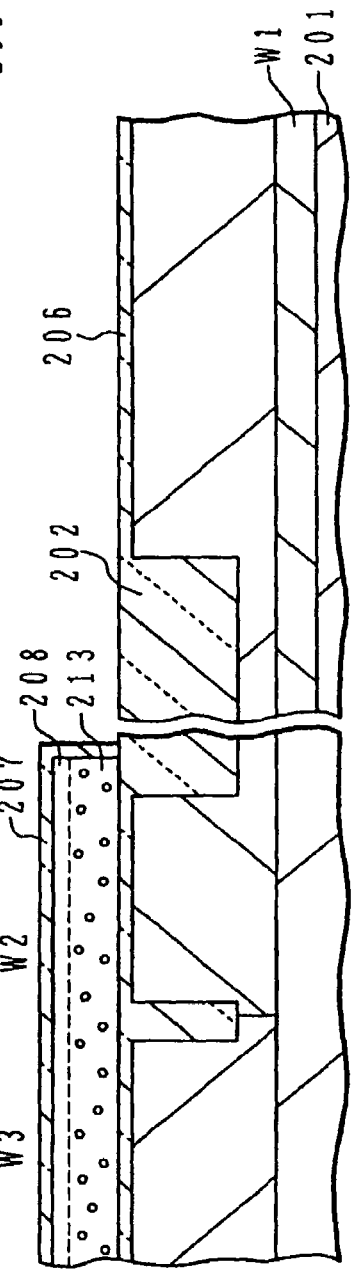

As shown in FIG. 40(C), the oxide film in the memory cell area is removed, and a new gate oxide film 206 for memory cells is formed to a thickness of about 8 nm by thermal oxidation. At this time, a silicon oxide film 207 grows also on the surface of the polysilicon layer 213 covering the logic circuit area.

This silicon oxide film 207 is used as an etching stopper when the gate electrode of a memory cell is formed in the next process. If the function as the etching stopper is insufficient or if the gate oxide film in the logic circuit area is to be prevented from being damaged during the etching, a lamination structure of a polysilicon layer 213 and silicon oxide film 208 may be used in place of the polysilicon film 213.

Figure 41A:
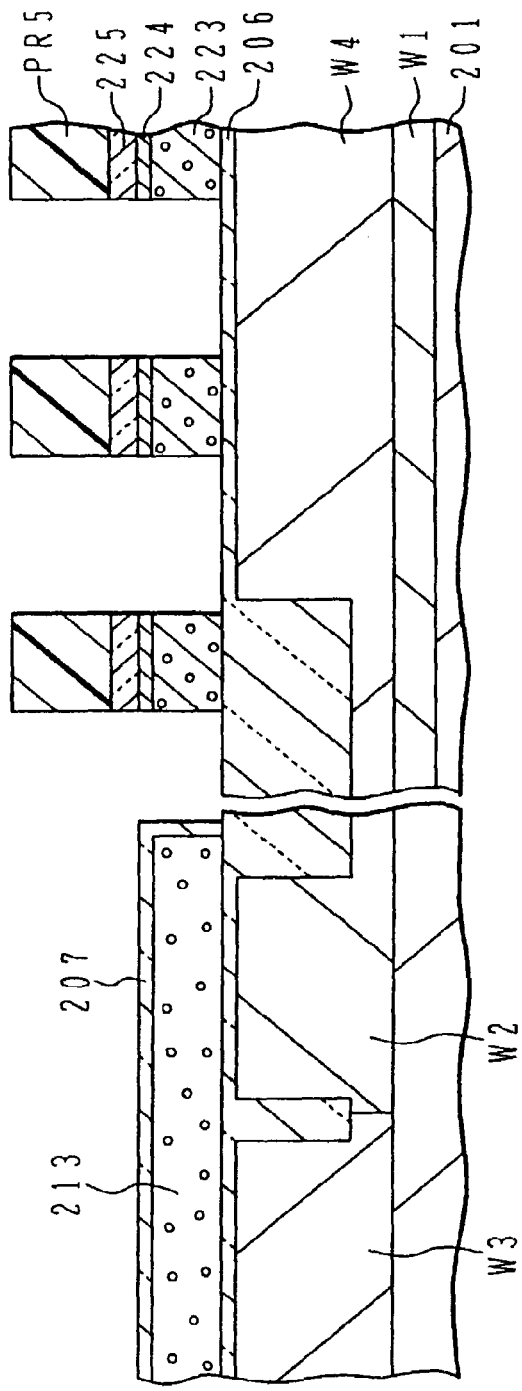

As shown in FIG. 41(A), a polysilicon layer 223 about 50 nm thick, a WSi layer 224 about 100 nm thick and a silicon nitride film 225 about 150 nm thick are grown by CVD. On this lamination structure, a resist pattern PR5 having a pattern of a gate electrode also serving as the word line is formed in the memory cell area.

By using this resist pattern PR5 as a mask, the underlying silicon nitride film 225, WSi layer 224 and polysilicon layer 223 are etched and patterned to form word lines (gate electrodes) in the memory cell area. At this time, the lamination structure in the logic circuit area is removed. The resist pattern PR5 is thereafter removed.

Figure 41B:
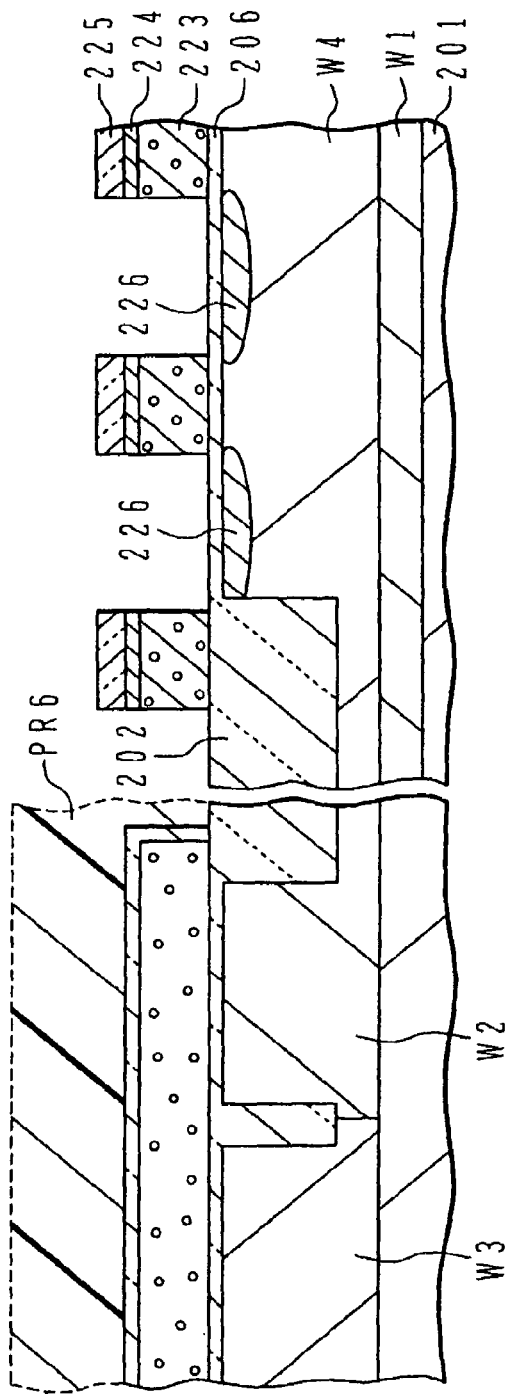

As shown in FIG. 41(B), by using as a mask the gate electrode constituted of the lamination structure of the polysilicon layer 223, WSi layer 224 and silicon nitride film 225 in the memory cell area and the polysilicon layer 213 and element isolation regions 202, n-type impurity ions are implanted into the memory cell area at an acceleration energy of 30 KeV and a dose of $2H10^{13}$ cm$^{-2}$ to form source/drain diffusion regions 226 in the memory cell area. A resist pattern PR6 covering the logic circuit area may be formed to use it as the mask of ion implantation.

The impurity concentration of the source/drain regions in the memory cell area is about {fraction (1/100)} of the impurity concentration of the gate in the logic circuit area to the described later. Therefore, even if p-type impurities are introduced into the polysilicon layer 213 without using the resist pattern PR6, there arises no practical problem.

If the resist pattern PR6 is used, a problem of depletion of the gate electrode when the gate oxide film in the logic circuit area is too thin, can be avoided. The resist pattern PR6 is thereafter removed.

After the n-type impurities ions (P) are implanted in the process shown in FIG. 41B, the gate electrode edges may be oxidized through thermal oxidation. Even with such thermal treatment, a problem associated with the diffusion of impurities such as B does not occur because impurities are not still introduced into the gate electrodes in the logic circuit area. It is possible to improve the dielectric breakdown voltage of the gate insulating film in the memory area to which a higher voltage is applied than in the logic circuit area, and to improve the refresh characteristics of memory cells by making gentle the slope of the impurity profile in the source/drain regions in the memory cess area.

As shown in FIG. 42(A), a resist pattern PR7 is formed covering the memory cell area and the gate electrodes in the logical cell area. By using this resist pattern PR7 as a mask, the polysilicon layer 213 in the logic circuit area is patterned to form the gate electrode structure constituted on the polysilicon layer 213a and silicon oxide film 207a. The resist pattern PR7 is thereafter removed.

As shown in FIG. 42(B), a resist pattern PR8 is formed covering the memory cell area and the n-channel transistor area of the logic circuit area. By using this resist pattern PR8 as a mask, p-type impurity ions are introduced into the p-channel transistor area of the logic circuit area. For example, ion implantation is executed by introducing $BF_2$ at an acceleration energy of 5 KeV and a dose of $4H10^{14}$ cm$^{-2}$ to form p-type LDD diffusion regions 231. Ions of p-type impurities are also introduced into the gate electrode so that this gate electrode becomes a p-type polysilicon layer 213b. The resist pattern PR8 is thereafter removed.

Figure 43A:
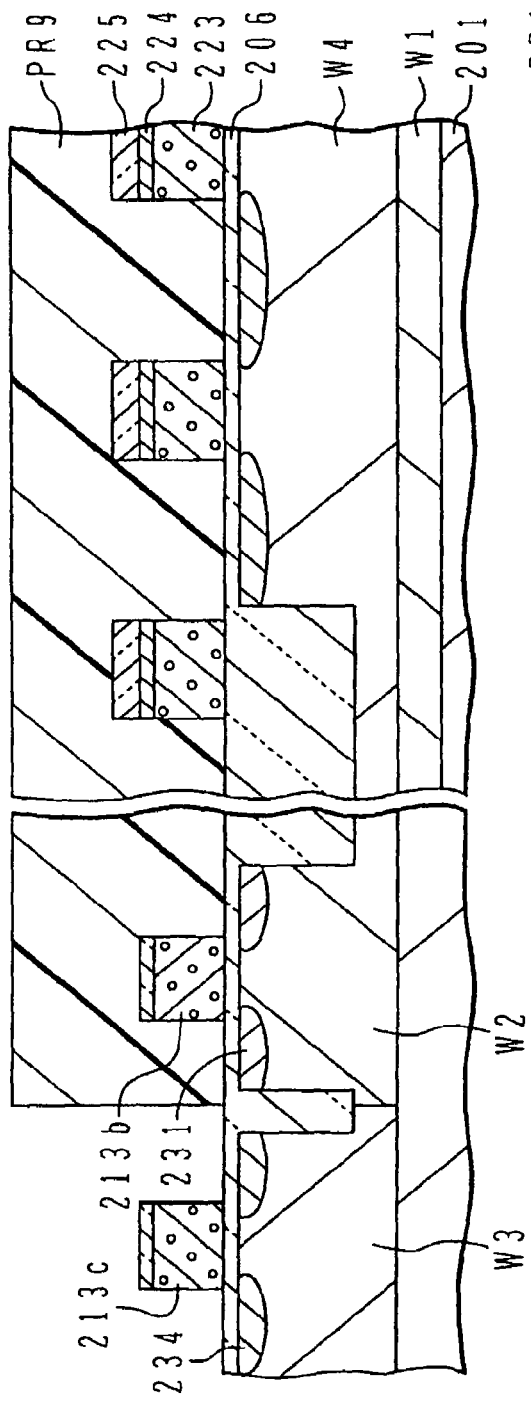

As shown in FIG. 43(A), a resist pattern PR9 is formed covering the memory cell area and the p-channel transistor area of the logic circuit area. By using this resist pattern PR9 as a mask, n-type impurity ions are introduced into the n-channel transistor area of the logic circuit area to form n-type LDD diffusion regions 234 of an n-type transistor. For example, ion implantation is executed by introducing n-type impurities As at an acceleration energy of 5 KeV and a dose of $5H10^{14}$ cm$^{-2}$ Ions of n-type impurities are also introduced into the gate electrode so that this gate electrode becomes an n-type polysilicon layer 213c. The resist pattern PR9 is thereafter removed. Implanted impurity ions are activated by performing a heat treatment for 10 seconds at 950EC.

Figure 43B:
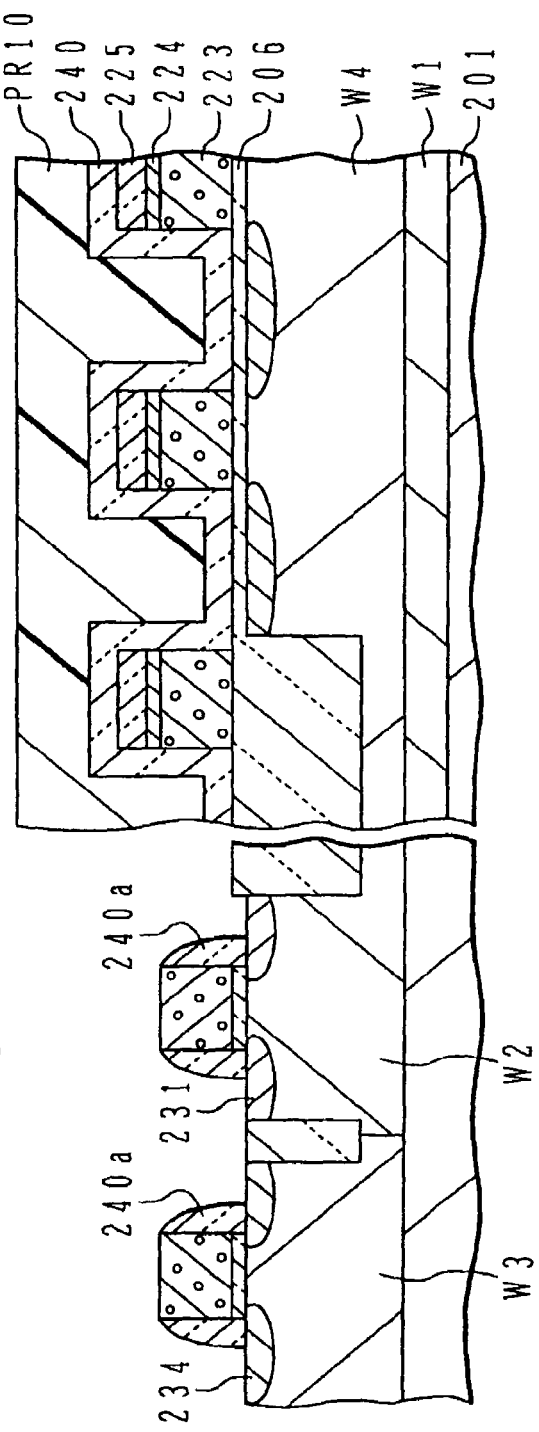

As shown in FIG. 43(B), a silicon nitride film 240 is deposited over the whole surface of the substrate 201 to a thickness of about 80 nm by CVD. A resist pattern PR10 covering the memory cell area is formed on the silicon nitride film 240. The silicon nitride film 240 exposed in the logic circuit area is anisotropically etched to leave nitride side spacers 240a only on the side walls of the gate electrode. The resist pattern PR10 is thereafter removed.

As shown in FIG. 44(A), a resist pattern PR11 is formed covering the memory cell area and the n-channel transistor area of the logic circuit area. By using this resist pattern PR11 as a mask, p-type impurity ions are introduced to form high concentration p-type source/drain regions (HDD) 232. For example, ion implantation is executed by introducing B at an acceleration energy of 5 KeV and a dose of $2H10^{15}$ cm$^{-2}$. With this ion implantation, the impurity concentration of the polysilicon layer 213b of the gate electrode also increases and the polysilicon layer 213b becomes a low resistance polysilicon layer 213d. The resist pattern PR11 is thereafter removed.

As shown in FIG. 44(B), a resist pattern PR12 is formed covering the memory cell area and the p-channel transistor area of the logic circuit area. By using this resist pattern PR12 as a mask, n-type impurity ions are introduced at a high concentration into the n-channel transistor area of the logic circuit area. For example, As ions are implanted at an acceleration energy of 10 KeV and a dose of $4H10^{15}$ cm$^{-2}$.

With this ion implantation, the n-type impurity ions are also doped into the polysilicon layer 213c of the gate electrode in the n-channel transistor area and the polysilicon layer 213c becomes a low resistance polysilicon layer 213e. The resist pattern PR12 is thereafter removed. Impurity ions implanted in to the logic circuit area are activated by a heat treatment for 10 seconds at 1000EC.

Figure 45:
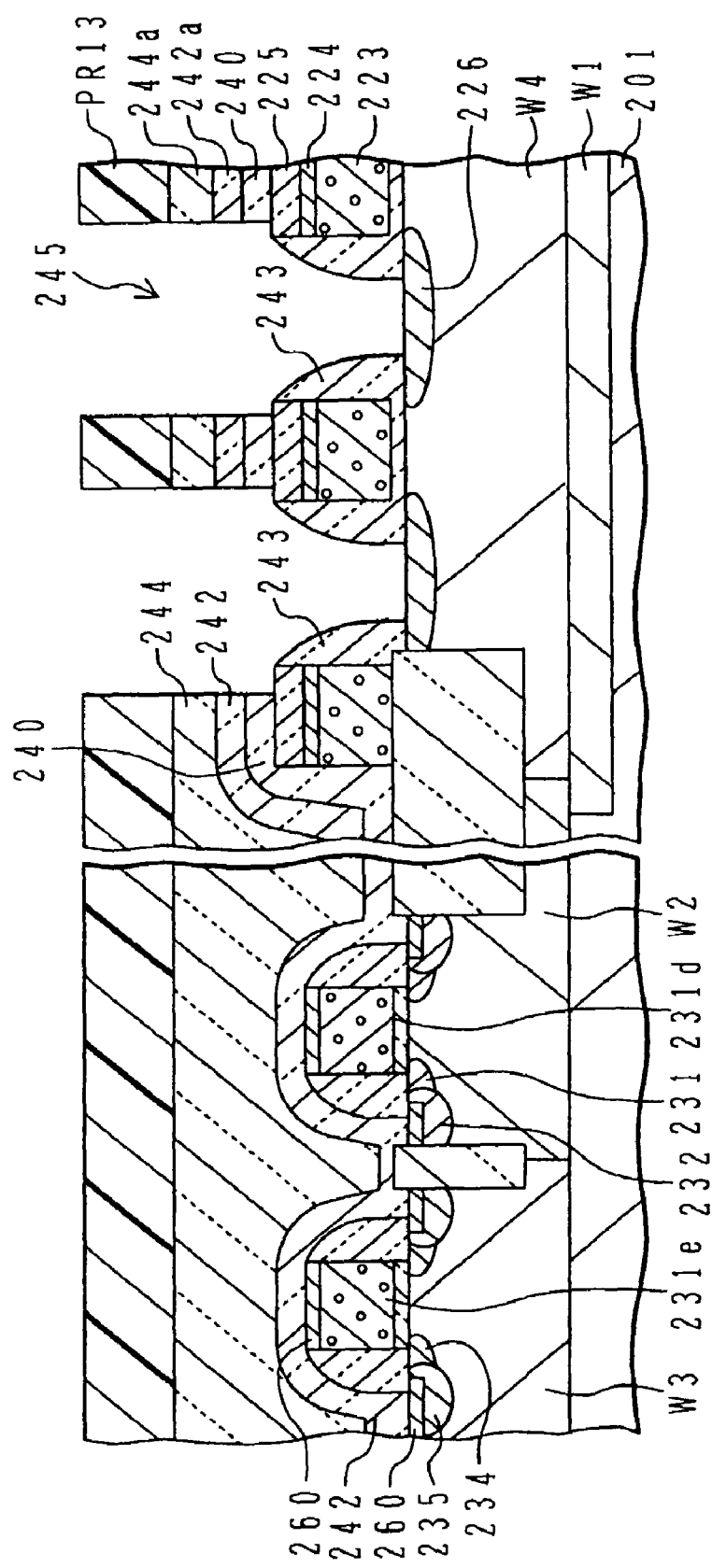

As shown in FIG. 45, a salicification process similar to the above-described embodiments is executed to form silicide layers 260 on the surfaces of the gate electrodes and source/drain diffusion regions in the logic circuit area. In this case, since the memory cell area is covered with the silicon nitride layer 240, the silicide layer is not formed. For example, the silicification process is performed by depositing a Co layer and a TiN layer, executing a first silicification reaction by a heat treatment, removing the TiN layer and an unreacted Co layer, and executing a second silicification reaction by a heat treatment.

As shown also in FIG. 45, a silicon nitride film 242 is deposited on the surface of the semiconductor substrate after the silicification process. A BPSG layer 244 is formed on the silicon nitride film 242 by CVD and the surface of the BPSG layer 244 is planarized by CMP or the like. A resist pattern PR13 having openings corresponding to the contact portions in the memory cell area is formed on the surface of the BPSG layer 244. By using this resist pattern PR13 as a mask, the BPSG layer 244 having a high etching selection ratio relative to the nitride film is etched. This etching automatically stops when the surface of the nitride film 242 is exposed.

Thereafter, the silicon nitride films 242 and 240 are anisotropically etched to form openings 245 which expose the source/drain regions 226 of a memory cell transistor. During this process of forming the openings, the silicon nitride film 243 on the side walls of the gate electrode of the memory cell transistor functions as an etching stopper to provide electric insulation between the opening and gate electrode. The resist pattern PR13 is thereafter removed.

Figure 46:
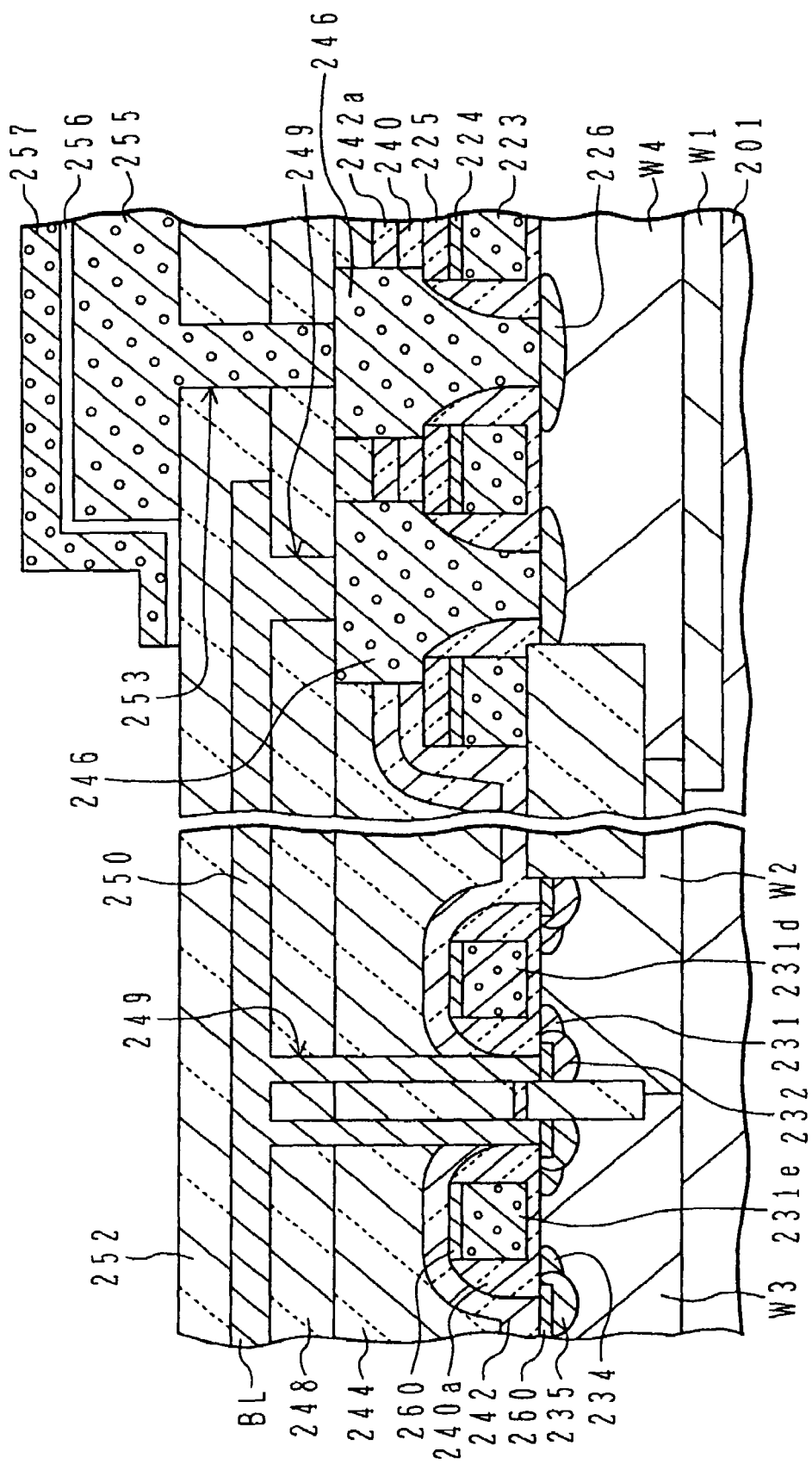

As shown in FIG. 46, a polysilicon layer doped with phosphorous (P) is deposited burying the openings 245 formed in the memory cell area, and CMP is performed to remove the polysilicon layer outside of the openings and planarize the surface of the polysilicon layer. In this manner, silicon plugs 246 are formed in the openings 245 in the memory cell area.

A BPSG layer 248 is deposited on the surface of the BPSG layer 244, covering the silicon plugs 246. A resist pattern having openings corresponding to contact holes is formed by an ordinary photolithography process. In the example shown in FIG. 46, openings are formed above the source/drain regions of a transistor in the logic circuit area and above one of the silicon plugs 246.

By using this resist pattern as a mask, the BPSG layers 248 and 244 and silicon nitride film 242 are etched. Contact holes 249 are therefore formed above the HDD regions 235 and 232 and silicon plug 246. These contact holes 249 are used for connecting the bit line.

After the contact holes 249 are formed, a conductive lamination structure of a Ti layer, a TiN layer and a W layer, is deposited to bury the contact holes, and a conductive layer 250 is formed over the surface of the BPSG layer 248. This conductive layer 250 is patterned by well-known photolithography techniques to from the bit line BL.

A BPSG layer 252 is deposited covering the bit line BL. After the surface of the BPSG layer 252 is planarized by CMP or the like, a resist pattern is formed on the planarized surface by an ordinary photolithography process, this resist pattern having an opening corresponding to the capacitor contact hole.

By using this resist pattern as a mask, the BPSG layers 252 and 248 are etched to form a contact hole 253 reaching the silicon plug 246. A polysilicon layer is deposited burying the contact hole 253. The polysilicon layer is patterned by well-known photolithography to form a storage electrode 255.

A capacitor dielectric film 256 is deposited to cover the storage electrode 255. For example, a silicon nitride film is deposited. On the surface of the capacitor dielectric film 256, a polysilicon layer is deposited and patterned by ordinary photolithography. The capacitor dielectric film 256 can be patterned at the same time. In this manner, a cell plate electrode 257 is formed.

Thereafter, a BPSG layer is deposited as an interlayer insulating film, and its surface is planarized. Then, processes of forming contact holes and forming an upper wiring layer are performed to complete the semiconductor device.

In the third embodiment, the gate electrode in the memory cell area and the gate electrode in the logic circuit area are formed by different manufacture processes and have different lamination structures. In the logic circuit area, impurities are added by the same process, whereas in the memory cell area, a SAC process is realized.

4th Embodiment

Figure 47A:
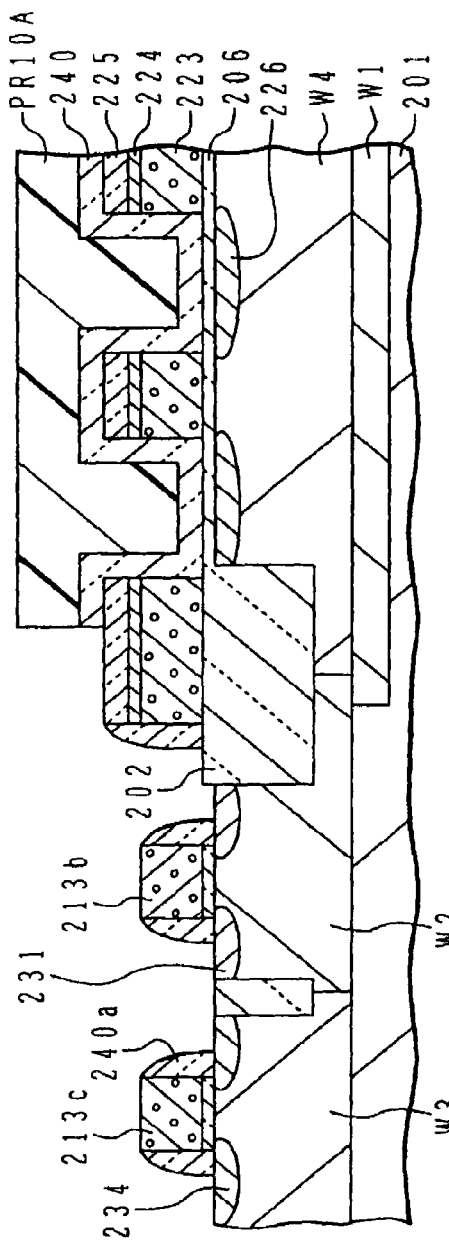
FIGS. 47(A) to 49 are schematic cross sectional views of a substrate illustrating manufacture processes according to a fourth embodiment of the invention.

Next, the fourth embodiment will be described with reference to FIGS. 47(A) to 49. First, the semiconductor device shown in FIG. 47(A) is formed by the processes up to that shown in FIG. 43(A) of the third embodiment. Namely, LDD regions of n- and p-channel transistors are formed in the logic circuit area and the resist pattern PR9 is removed.

FIG. 47(A) corresponds to FIG. 43(B). In this embodiment, a resist pattern PR10A is formed covering the active regions of the memory cell area and a partial area of the word line formed on the intermediate element isolation region 202. A partial area of the word line on the intermediate element isolation region is exposed and not covered with the resist pattern PR10A.

In this state, a silicon nitride film is anisotropically etched to form side wall insulating films 240a on the wide walls of gate electrodes 213b and 213c in the logic circuit area. The resist pattern PR10A is thereafter removed.

Figure 47B:
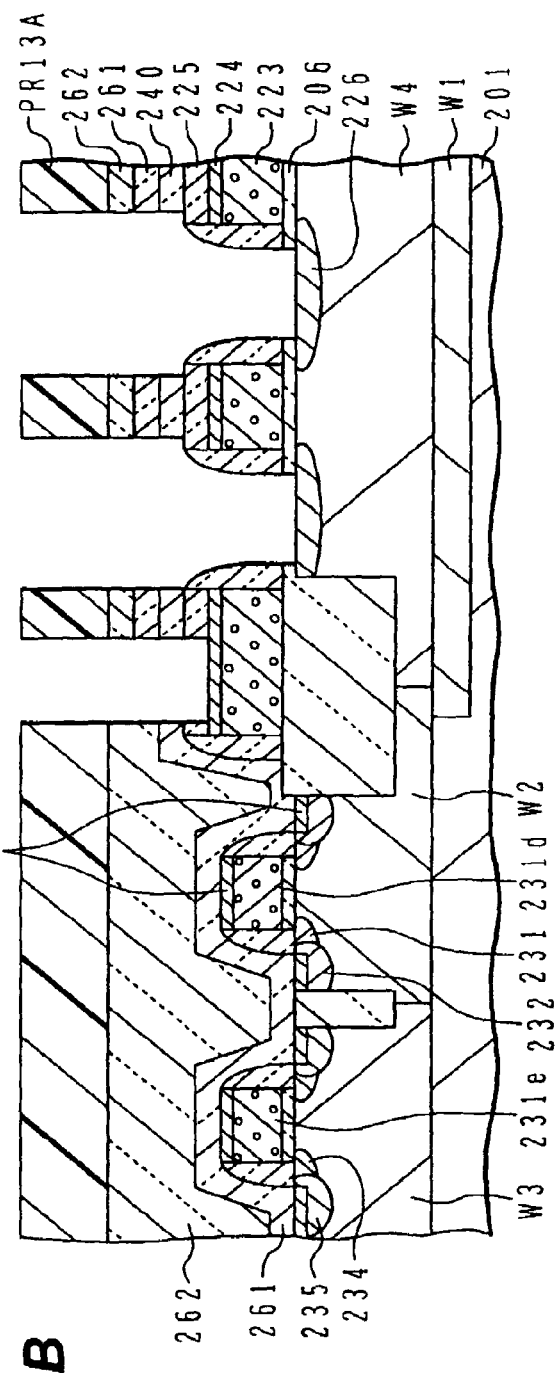

As shown in FIG. 47(B), ions are implanted at a high impurity concentration into n- and p-channel transistor areas in the logic circuit area to form HDD regions 235 and 232 and change the gate electrodes to high impurity concentration silicon layers 213e and 213d. These processes can be executed in the manner similar to those shown in FIGS. 44(A) and 44(B).

Next, a salicification process is executed to form silicide layer 260 on the exposed silicon surfaces in the logic circuit area. The salicification process can be executed in the manner similar to the third embodiment.

Thereafter, a silicon nitride film 261 is deposited over the whole surface of the semiconductor substrate, and on this silicon nitride film 261 a BPSG layer 262 is deposited by CVD. After the surface of the BPSG layer 262 is planarized, a resist pattern PR13A is formed having openings above the intermediate word line and source/drain regions in the memory cell area.

By using this resist pattern PR13A as a mask, an etching process is performed to form contact holes. Contact holes are formed above the intermediate word line and source/drain regions in the memory cell area. The contact hole for the word line terminates at the surface of the silicide film 224. Between word lines in the memory cell area, the silicon nitride films 240 and 261 realize the SAC process.

Figure 48:
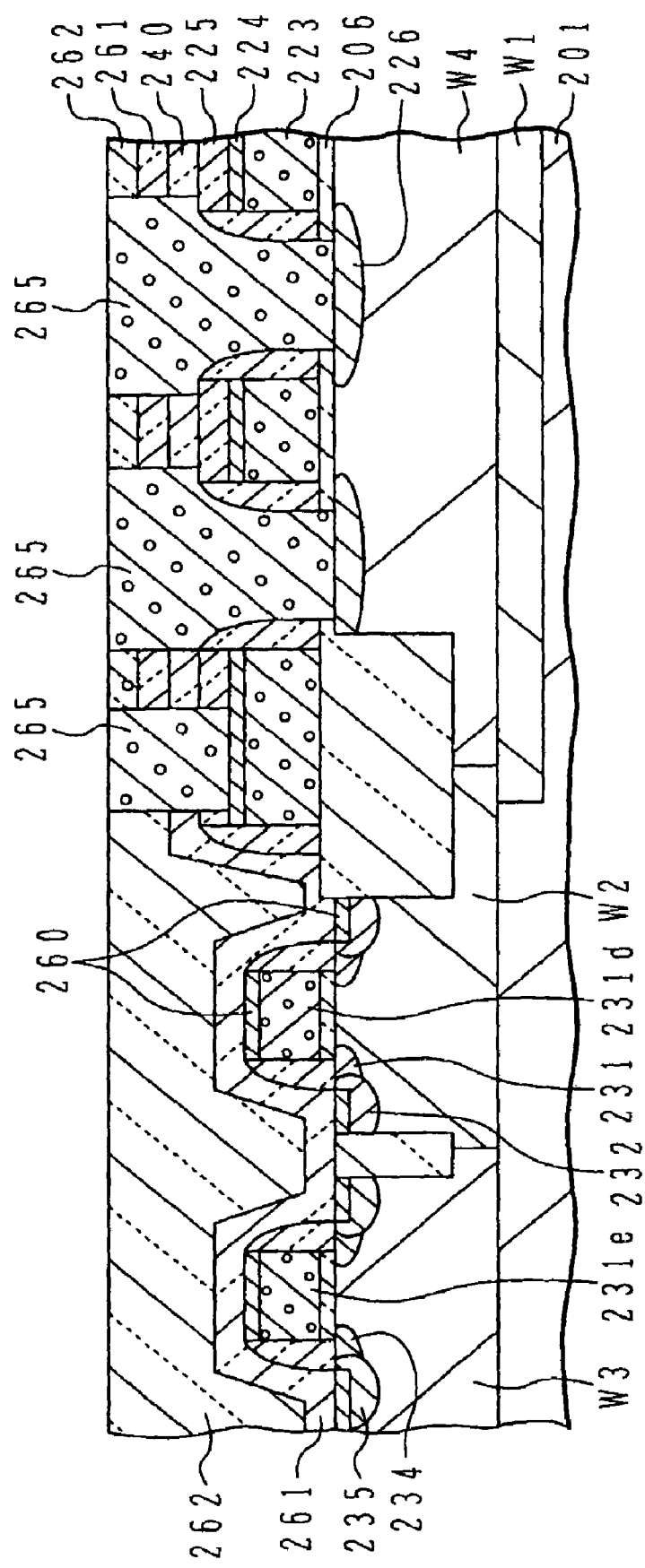

As shown in FIG. 48, a doped polysilicon layer 265 is deposited burying the contact holes, and the polysilicon layer deposited on the BPSG layer 262 is removed by CMP. Polysilicon plugs 265 are therefore formed in the contact holes.

Figure 49:
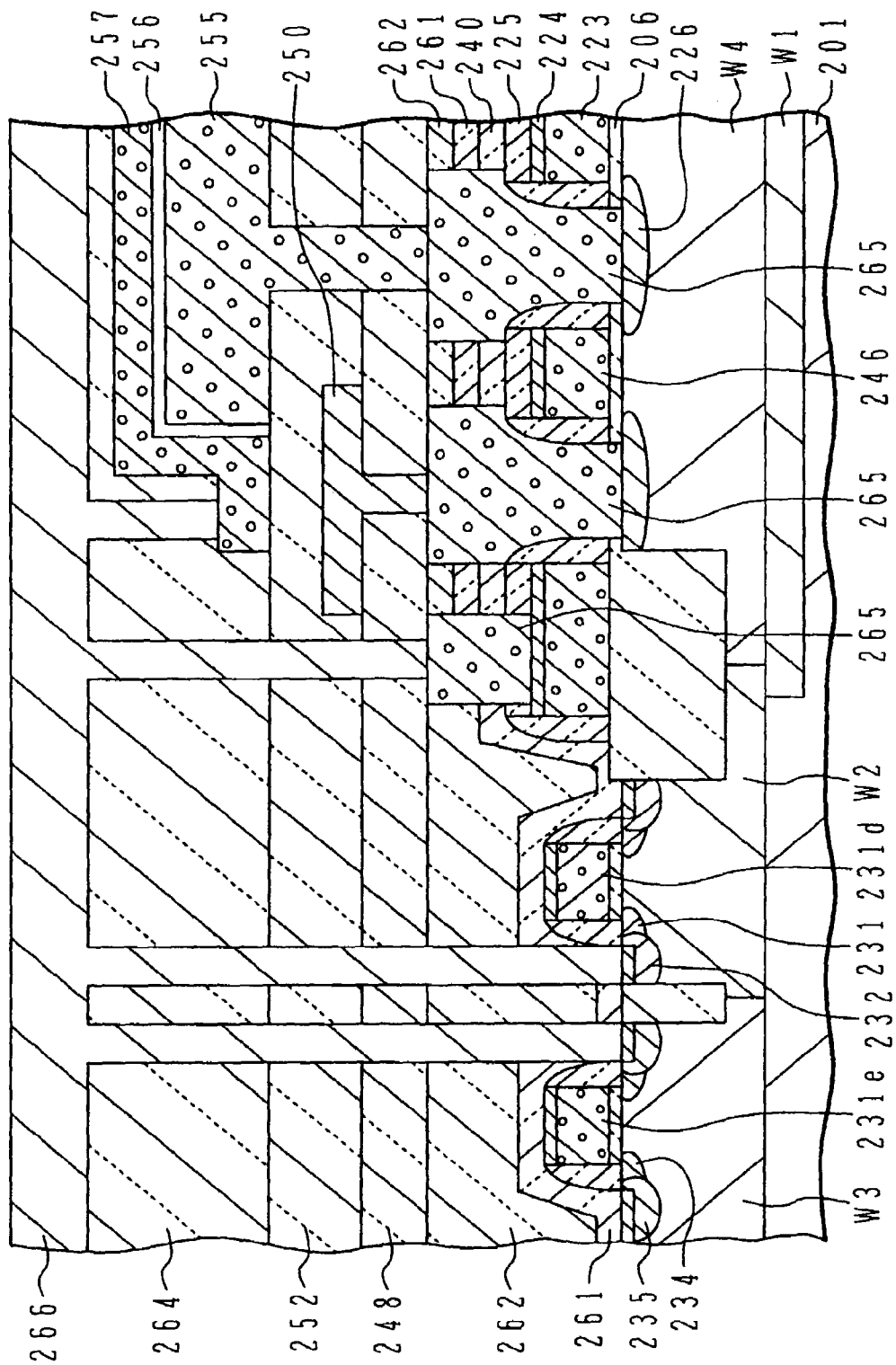

As shown in FIG. 49, a BPSG layer 248 is deposited on the BPSG layer 262. By using well-known photolithography techniques, a contact hole is formed through the BPSG layer 248 in the area above the silicon plug to be connected to the bit line. A conductive lamination layer 250 of a Ti layer/a TiN layer/a W layer is deposited burying the contact hole, and patterned to form the bit line BL.

A BPSG layer 252 is deposited covering the bit line 250 (BL) and the surface thereof is planarized. A resist pattern is formed on the surface of the BPSG layer 252, and a contact hole is formed reaching the silicon plug to be connected to a storage electrode. A polysilicon layer is deposited burying the contact hole, and patterned to form the storage electrode 255.

Thereafter, similar to the third embodiment, a capacitor dielectric film 256 and a cell plate electrode 257 are formed.

Another BPSG layer 264 is formed covering the capacitor. After the surface of the BPSG layer 264 is planarized by CMP, a resist pattern having openings corresponding to necessary contact holes is formed to form the contact holes. In the example shown in FIG. 49, there are openings reaching the n- and p-channel transistors in the logic circuit area, an opening reaching the silicon plug on the word line in the memory cell area, and an opening reaching the memory cell plate electrode. In etching these contact holes, after the BPSG layers are etched, the silicon nitride film is etched in the logic circuit area.

A conductive layer 266 is formed on the BPSG layer 264, burying the contact holes, and patterned to form an upper wiring.

5th Embodiment

Next, with reference to FIGS. 50(A) to 52(B), a method of manufacturing a semiconductor device according to the fifth embodiment will be described.

As shown in FIG. 50(A), the processes of forming element isolation regions 202 in a p-type silicon substrate 201 and a triple-well structure including wells W1, W2, W3 and W4 are similar to the above-described embodiments. After a gate insulating film 205 of silicon oxide is formed on the substrate surface, a non-doped polysilicon layer 270 is deposited on the whole substrate surface to a thickness of about 180 nm by CVD.

A resist pattern PR4B having an opening exposing the memory cell area is formed on the polysilicon layer 270. By using this resist pattern PR4B as a mask, n-type impurity ions P are implanted into the polysilicon layer 270 to change the polysilicon layer 270 in the memory cell area to an n-type polysilicon layer 270a. The resist pattern PR4B is thereafter removed.

As shown in FIG. 50(B), a silicon nitride film 271 is deposited on the polysilicon layer 270 to a thickness of about 100 to 200 nm by CVD.

As shown in FIG. 51(A), a resist pattern PR5B is formed on the silicon nitride film 271, the resist pattern PR5B having a word line pattern in the memory cell area and cell-peripheral connection pattern PR5BA in the cell-peripheral boundary area. By using this resist pattern PR5B as a mask, the silicon nitride film 271 is etched. The polysilicon layer 270 under the silicon nitride film 271 is not etched but left. The resist pattern PR5B is thereafter removed. The left silicon nitride films are used as a mask when the polysilicon layer 270 in the memory area is etched.

As shown in FIG. 51(B), a resist pattern PR6B is formed on the polysilicon layer 270, the resist pattern PR6B having a pattern of gate electrodes in the logic circuit area and cell-peripheral connection pattern PR6BA in the cell-peripheral boundary area. On the element isolation region 202 intermediate of the logic circuit area and memory cell area, the resist pattern PR6B partially covers the silicon nitride film pattern 271a in the memory cell and the cell-peripheral boundary area.

In this state, by using the resist pattern PR6B and the silicon nitride film pattern 271a as a mask, the polysilicon layer 270 is etched. After this etching, the resist pattern PR6B is removed.

As shown in FIG. 52(A), in the memory cell area, the word line (gate electrode) structure is constituted of a lamination of the polysilicon layer 270b and the silicon nitride film 271a formed thereon. In the logic circuit area, the gate electrode structure is constituted of only the polysilicon layer 270a.

As shown in FIG. 52(B), ions are implanted into the memory area and into the n- and p-channel transistor areas in the logic circuit area, by using different masks to form low impurity concentration source/drain regions 226, 231 and 234. These masks are used for these ion implantation processes.

Next, a silicon nitride film 272 is deposited over the whole substrate surface. By using a mask covering the memory cell area, the silicon nitride film 272 in the logic circuit area is anisotropically etched. With this anisotropic etching, side wall insulating films 272a of silicon nitride are formed on the side walls of the gate electrodes in the logic circuit area.

Ions are implanted at a high impurity concentration into the n- and p-channel transistor areas in the logic circuit area, by using different masks. With this ion implantation, high concentration source/drain regions 232 and 235 are formed, and the polysilicon layers 270a are changed to low resistance polysilicon layers 270b and 270c. After the high concentration source/drain regions are formed, a salicification process is performed to form silicide films 273 on the exposed silicon surfaces in the logic circuit area.

Thereafter, a silicon nitride film 274 is deposited over the whole substrate surface, and then a BPSG layer 275 is deposited by CVD. After the surface of the BPSG layer 275 is planarized by CMP or the like, a resist mask is formed on the planarized surface to etch contact holes in the memory cell area. The silicon nitride films 272 and 274 in the memory cell area realize the SAC process.

Thereafter, the upper structure is formed in the manner similar to the above-described embodiments. Also in this embodiment, the number of masks can be reduced more than conventional techniques.

Figure 53:
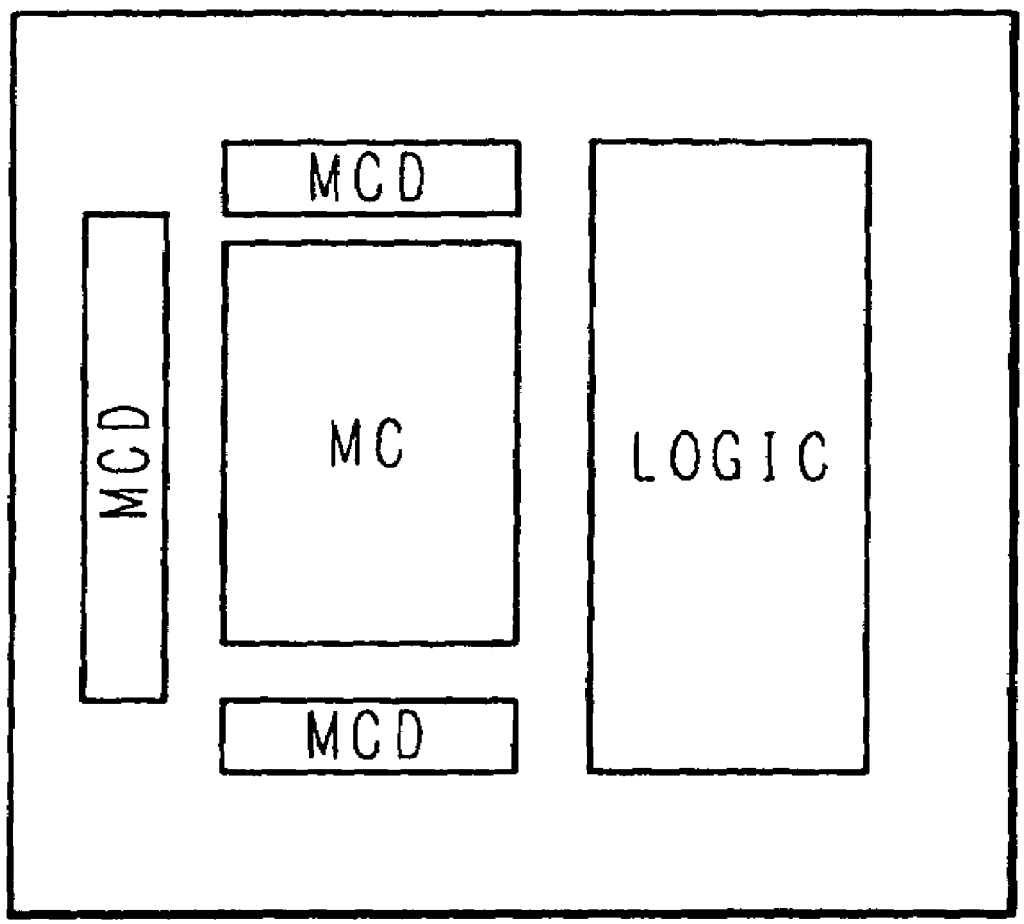
FIG. 53 is a plan view showing an example of the layout of a semiconductor chip.

FIG. 53 shows an example of a layout of a semiconductor chip. A memory cell area MC having driver circuit MCD is formed in the left area of FIG. 53, and a logic circuit area LOGIC is formed in the right area of FIG. 53. The memory cell area MC has a number of memory cells of the above-described embodiments, and the logic circuit area LOGIC has a number of complementary MIS transistors of the above-described embodiments. The driver circuit MCD can be formed by using complementary transistors.

The present invention has been described in connection with the first to fifth embodiments and their modifications. The invention is not limited only to the above embodiments. It is apparent that various modifications, improvements, combinations, and the like can be made by those skilled in the art.

In the above description, although CoSi is used as silicide, other silicide may also be used if the material is suitable for salicide, such as TiSi.

Also in the above description, although plasma CVD is used for forming a silicon nitride film on a gate electrode layer, the silicon nitride film may be formed by using monosilane ($SiH_4$) and ammonium ($NH_3$) at about 600EC or by using dichlorsilane ($Si_2H_6$) and ammonium ($NH_3$) at about 700EC.

The methods of forming a silicon nitride film are selected in accordance with not only a quality of a silicon nitride film but also other influences such as expansion of a diffusion region by heat treatment and exit of boron from a gate electrode of a p-channel transistor.

Although BPSG is used as an interlayer insulating film, PSG, a silicon oxide or the like may also be used. Although CMP is used illustratively as a typical planarizing method, reflow, etch-back or the like used conventionally may also be sued.

An amorphous silicon film doped with phosphorous is used as a plug formed in a contact hole. Instead, an amorphous silicon film doped with n-type impurities such as boron may be used if it is to be formed on a p-type diffusion region or a p-type silicon region, or polysilicon may be used in place of amorphous silicon. The material of a plug is not limited only to a silicon film, but metal such as W and TiW, metal compound, or metal silicide may be used.

An oxidized nitride film is used as the capacitor dielectric film. Instead, a high dielectric constant film or a ferroelectric film such as tantalum oxide film ($Ta_2O_5$) and PZT may be used. In this case, metal is preferably used as the material of the storage electrode and opposing electrode so that it is possible to prevent the capacitance from being lowered by a natural oxide film of the electrodes and to prevent a reaction between the capacitor dielectric film and a silicon film.

Doping impurities into a silicon film may be performed while the film is grown, or may be performed by a diffusion method or an ion implantation method after the film is grown.

The invention claimed is:

1. A method of manufacturing a semiconductor device comprising the steps of:
   forming a first conductive film on a gate insulating film fanned in first and second areas of a semiconductor substrate;
   selectively removing the first conductive film to form a gate electrode of a first MIS transistor in the first area and a conductive pattern covering a whole surface of the second area;
   forming a first insulating film covering said conductive pattern in the second area and said gate electrode in the first area, covering said first insulating film in the second area with a mask, and anisotropically etching said first insulating film in the first area to form sidewall spacer insulating films made of the first insulating film on side walls of the gate electrode of the first MIS transistor;
   by using the gate electrode of the first MIS transistor as a mask, introducing impurities into the first area to form source/drain diffusion regions of the first MIS transistor, and leaving the first insulating film in the second area;
   forming a second insulating film over the semiconductor substrate including the first and second areas;
   selectively removing the second insulating film, the first insulating film, and the first conductive film to form a lamination pattern of a gate electrode of a second MIS transistor in the second area;
   by using the Lamination pattern as a mask, introducing impurities into the second area to form source/drain diffusion regions of the second MIS transistor;
   forming side wall spacer insulating films made of a third insulating film on side walls of the lamination pattern; and
   forming a second conductive film connecting at least one of the source/drain diffusion regions in the second area.

2. A method of manufacturing a semiconductor device according to claim 1, further comprising a step of introducing impurities into the first area to form the source/drain diffusion regions of the first MIS transistor and also into the gate electrode of the first MIS transistor.

3. A method of manufacturing a semiconductor device according to claim 2, further comprising a step of selectively forming a metal silicide film on the source/drain regions and the gate electrode of the first MIS transistor, after said step of introducing impurities into the first area.

4. A method of manufacturing a semiconductor device comprising the steps of:
   (a) forming a first conductive film on a gate insulating film formed in first and second areas of a semiconductor substrate;
   (b) selectively removing the first conductive film to form a gate electrode of a first MIS transistor in the first area and a conductive pattern covering a whole surface of the second area;
   (c) forming a first insulating film covering said conductive pattern in the second area and said gate electrode in the first area covering said first insulating film in the second area with a mask, and anisotropically etching said first insulating film in the first area to form side wall spacer insulating films made of the first insulating film on side walls of the gate electrode of the first MIS transistor, and leaving the first insulating film in the second area;
   (d) by using the gate electrode of the first MIS transistor as a mask, introducing impurities into the first area to form source/drain diffusion regions of the first MIS transistor and also into the gate electrode and the conductive pattern;
   (e) selectively forming a metal silicide film on the source/drain regions and the gate electrode of the first MIS transistor and on the conductive pattern;
   (f) forming a second insulating film over the semiconductor substrate including the first and second areas;
   (g) selectively removing the second insulting film, the first insulating film, and the first conductive film to form a lamination pattern of a gate electrode of a second MIS transistor in the second area;
   (h) by using the lamination pattern as a mask, introducing impurities into the second area to form source/drain diffusion regions of the second MIS transistor;
   (i) forming a side wall spacer insulating films made of a third insulating film on side walls of the lamination pattern; and
   (j) forming a second conductive film connected to at least one of the source/drain diffusion regions in the second area.

5. A method of manufacturing a semiconductor device according to claim 4, wherein the first insulating film is a silicon oxide film and the third insulating film is a silicon nitride film.

6. A method of manufacturing a semiconductor device according to claim 4, wherein said step (b) forms also a gate electrode of a third MIS transistor in the first area, said step (d) introduces impurities into the first area to form the source/drain regions of The first MIS transistor and also into the gate electrode of the first MIS transistor, by covering an area containing the gate electrode of the third MIS transistor with a mask, and the method further comprises a step of:
   (k) introducing impurities into the first area while covering the first MIS transistor with a mask, to form source/drain regions on both sides of the gate electrode of the third MIS transistor and also into the gate electrode of the third MIS transistor.

7. A method of manufacturing a semiconductor device, comprising the steps of:

forming a plurality of word lines in a memory cell area of a semiconductor substrate, the word line having a lamination structure of a first conductive film and a first insulating film;

by using the lamination structure as a mask, introducing impurities into the semiconductor substrate to form source/drain regions;

forming first side wall spacer insulating films on side walls of the lamination structure, the first side wall spacer insulating film having substantially a same etching characteristic as the first insulating film;

forming a second insulating film on the memory cell area, the second insulating film having an etching characteristic different from the first insulating film;

selectively etching the second insulating film on one of the source/drain regions on both sides of the word line in the memory cell area to form a first contact hole defined by the first side wall spacer insulating film;

filling an inside of the first contact hole with a second conductive film;

forming a third conductive film and a third insulating film on the second insulating film to cover the second conductive film filled in the first contact hole, the third insulating film having an etching characteristic different from the second insulating film, and patterning the third insulating film and the third conductive film to form a bit line electrically connected to said one of the source/drain regions via the second conductive film;

forming second side wall spacer insulating films on side walls of the bit line made of the third insulating film and the third conductive film, the second side wall insulating film having an etching characteristic different from the second insulating film;

forming a fourth insulating film on the second insulating film, to cover the bit line, the fourth insulating film having substantially a same etching characteristic as the second insulating film;

selectively and sequentially etching the fourth and second insulating films above the other of the source/drain regions opposing to said one source/drain across said word line in the memory cell area, to form a second contact hole defined by the second and first side wall spacer insulating films; and forming a storage electrode electrically connected to the other of the source/drain regions via the second contact hole.

8. A method of manufacturing a semiconductor device, comprising the steps of:
(a) forming element isolation insulating films in first and second areas of a semiconductor substrate to define active regions;
(b) depositing a first conductive film on a whole surface of the semiconductor substrate;
(c) forming a first mask member on the first conductive film, the first mask member covering the first area arid exposing the second area;
(d) by using the first mask member as a mask, etching the first conductive film to leave the first conductive film extending in the first area;
(e) by using the first mask member or the first conductive film as a mask, introducing impurities into the semiconductor substrate in the second area;
(f) depositing a second conductive film over a whole surface of the semiconductor substrate;
(g) forming a second mask member on the second conductive film, the second mask member having a pattern of gate electrodes to be formed in the second area;
(h) by using the second mask member as a mask, etching the second conductive film to form a plurality of second gate electrodes in the second area; and
(i) patterning the first conductive film in the first area to form a plurality of first gate electrodes.

9. A method of manufacturing a semiconductor device according to claim 8, further comprising between said step (h) and said step (i) a step of:
(j) by using as a mask the first conductive film in the first area ax d the plurality of gate electrodes in the second area, introducing impurities into the second area to form second source/drain regions.

10. A method of manufacturing a semiconductor device according to claim 8, wherein said step (b) forms the first conductive film and a first insulating film on the first conductive film, and said steps (d) and (i) etches the first insulating film and the first conductive film in a same pattern.

11. A method of manufacturing a semiconductor device according to claim 8, wherein said step (f) forming a second insulating film on the second conductive film and said step (h) etches the second insulating film and the second conductive film in a same pattern.

12. A method of manufacturing a semiconductor device according to claim 9, further comprising a step of:
(k) introducing impurities into the first area to lower respective resistances of the first gate electrode and semiconductor substrate surface layers on both sides of the first gate electrode.

13. A method of manufacturing a semiconductor device according to claim 12, wherein said step (h) introduces n- and p-type impurities by using different mask members.

14. A method of manufacturing a semiconductor device according to claim 8, wherein the second conductive film is a lamination of a doped silicon layer and a silicide layer.

15. A method of manufacturing a semiconductor device according to claim 12, wherein the first conductive film is made of silicon, and the method further comprises before said step (f) a step of:
(l) forming a thermal oxide film on surfaces of the second area and the first conductive film.

16. A method of manufacturing a semiconductor device according to claim 15, wherein said step (k) comprises the steps of:
(k-1) implanting first ions into the first area;
(k-2) forming side spacers on side walls of the first gate electrode and forming a third insulating film covering the second area; and
(k-3) implanting second ions into the first area formed with the side spacers to form first source/drain regions having a high impurity concentration and the first gate electrode having a low resistance.

17. A method of manufacturing a semiconductor device according to claim 16, further comprising a step of:
(m) selectively forming a silicide film on the first source/drain regions and first gate electrode in the first area.

18. A method of manufacturing a semiconductor device according to claim 7, further comprising a step of:
(n) forming a lamination of an etching resistant insulating film and a first interlayer insulating film over a whole surface of the semiconductor substrate, after said step (m).

19. A method of manufacturing a semiconductor device according to claim 17, further comprising the steps of:
(o) etching the first interlayer insulating film on the second source/drain regions in the second area, by using the etching resistant insulating film as an etching stopper, after said step (m);

(p) etching the exposed etching resistant insulating film to form a first contact hole reaching the second source/drain region; and (q) forming a conductive plug in the first contact hole.

20. A method of manufacturing a semiconductor device according to claim 19, further comprising the steps of:

(r) forming a second interlayer insulating film on the first interlayer insulating film, the second interlayer insulating film covering the conductive plug;

(s) by using as an etching mask the etching resistant insulating film or the conductive plug, etching the second and first interlayer insulating films to form a second contact hole; and (t) forming a wiring layer embedding the second contact hole.

21. A method of manufacturing a semiconductor device according to claim 19, wherein the semiconductor substrate has an intermediate area between the first and second areas, said step (h) forms a contact portion for a word line on the element isolation insulating film in the intermediate area, said step (k-2) forms a third insulating film at least partially exposing the contact portion of the word line in the intermediate area, said steps (o) and (p) form a third contact hole exposing at least partially the contact portion of the word line in the intermediate area, and said step (q) forms also the conductive plug embedding the third contact hole.

22. A method of manufacturing a semiconductor device, comprising the steps of:

(a) forming element isolation insulating films in first and second areas of a semiconductor substrate to define active region;

(b) depositing a lamination structure of a first conductive film and a first insulating film on a whole surface of the semiconductor substrate;

(c) forming a first mask member on the lamination structure, the first mask member having a pattern of a wiring forming area in the second area;

(d) by using the first mask member as a mask, etching the first insulating film of the lamination structure to leave the first insulating film only in the wiring forming area in the second area;

(e) removing the first mask member;

(f) forming a second mask member on the first conductive film in the first area, the second mask member having a pattern of a wiring forming area; and (g) etching he first conductive film by using as a mask the second mask member and the left first insulating film.

23. A method of manufacturing a semiconductor device according to claim 22, wherein said step (b) comprises the steps of:

(b-1) forming a semiconductor film;

(b-2) selectively doping impurities into the semiconductor film in be second area; and (b-3) forming the first insulating film on the semiconductor film in the selectively doped with the impurities.

24. A method of manufacturing a semiconductor device according to claim 23, farther comprising the steps of:

(h) implanting first ions into the first area;

(i) forming side spacers on side walls of the first gate electrode and forming a second insulating film covering the second area; and (j) implanting second ions into the first area formed with the side spacers to form first source/drain regions of a high impurity concentration and the first gate electrode having a low resistance.

* * * * *